(12) United States Patent
Kondo et al.

(10) Patent No.: US 7,573,939 B2
(45) Date of Patent: Aug. 11, 2009

(54) MEMORY CELL CIRCUIT, MEMORY DEVICE, MOTION VECTOR DETECTION DEVICE, AND MOTION COMPENSATION PREDICTION CODING DEVICE

(75) Inventors: Tetsujiro Kondo, Tokyo (JP); Tsutomu Ichikawa, Kanagawa (JP); Yasunobu Node, Tokyo (JP)

(73) Assignee: Sony Corporation, Tokyo (JP)

(*) Notice: Subject to any disclaimer, the term of this patent is extended or adjusted under 35 U.S.C. 154(b) by 842 days.

(21) Appl. No.: 10/474,840

(22) PCT Filed: Jan. 10, 2003

(86) PCT No.: PCT/JP03/00166

§ 371 (c)(1),
(2), (4) Date: Oct. 15, 2003

(87) PCT Pub. No.: WO03/060921

PCT Pub. Date: Jul. 24, 2003

(65) Prior Publication Data

US 2004/0120197 A1    Jun. 24, 2004

(30) Foreign Application Priority Data

Jan. 11, 2002 (JP) ............................. 2002-004955
Feb. 27, 2002 (JP) ............................. 2002-052022

(51) Int. Cl.
*H04N 7/12* (2006.01)
*H04N 11/02* (2006.01)

(52) U.S. Cl. ..................... 375/240.16; 375/240.26

(58) Field of Classification Search ..................
375/240.01–240.06, 240.12–240.16, 240.26;
711/100
See application file for complete search history.

(56) References Cited

U.S. PATENT DOCUMENTS

| | | | | | |
|---|---|---|---|---|---|
| 5,029,141 | A | * | 7/1991 | Yoshimoto et al. | 365/230.03 |
| 5,371,710 | A | * | 12/1994 | Ogihara | 365/230.01 |
| 5,394,366 | A | * | 2/1995 | Miyamoto | 365/195 |
| 5,436,870 | A | * | 7/1995 | Sato et al. | 365/230.05 |
| 5,519,665 | A | * | 5/1996 | Chishiki | 365/230.06 |
| 5,576,772 | A | | 11/1996 | Kondo | |
| 5,917,770 | A | | 6/1999 | Tanaka | |

(Continued)

FOREIGN PATENT DOCUMENTS

CN          1109243         9/1995

(Continued)

*Primary Examiner*—David Czekaj
(74) *Attorney, Agent, or Firm*—Frommer Lawrence & Haug LLP; William S. Frommer

(57) ABSTRACT

The invention relates to a memory device and the like. The memory device comprises one or more memory block. The memory block has a memory cell array consists of multiple memory cells (210) arranged in a matrix form. A region of the multiple memory cells (210) includes multiple divisional domains (201a-201e) divided in the direction along word line (WL). Each of the word lines (WL) has multiple divisional selection lines (WLa-WLe) divided corresponding to the multiple divisional domains. The memory block has a switching mechanism (220) for switching the divisional word lines (WL) that are to be simultaneously activated in each of the divisional domains. Multiple memory cells (210) associated with each of the divisional word lines store a horizontal or vertical array of pixel data. The inventive memory device enables simultaneous access to multiple items of pixel data constituting a pixel block having an arbitrary configuration.

6 Claims, 37 Drawing Sheets

U.S. PATENT DOCUMENTS

| | | | |
|---|---|---|---|
| 6,115,323 | A | 9/2000 | Hashimoto |
| 6,192,000 | B1 * | 2/2001 | Toda ..................... 365/230.06 |
| 6,314,048 | B1 * | 11/2001 | Ishikawa ............... 365/230.06 |
| 6,333,877 | B1 * | 12/2001 | Nagaoka et al. ............. 365/200 |
| 6,857,042 | B1 * | 2/2005 | Floman et al. ............... 711/106 |
| 2001/0038567 | A1 | 11/2001 | Ishikawa |

FOREIGN PATENT DOCUMENTS

| | | |
|---|---|---|
| CN | 1255996 | 6/2000 |
| DE | 694 23 557 | 3/1995 |
| DE | 101 09 318 | 10/2001 |
| EP | 0 643 539 | 9/1994 |
| JP | 59-110086 | 6/1984 |
| JP | 1-267600 | 10/1989 |
| JP | 2003-36671 | 2/1993 |
| JP | 2003-109380 | 4/1993 |
| JP | 5-152542 | 6/1993 |
| JP | 5-206398 | 8/1993 |
| JP | 6-95937 | 4/1994 |
| JP | 7-87495 | 3/1995 |
| JP | 7-222157 | 8/1995 |
| JP | 10-112179 | 4/1998 |
| JP | 11-144451 | 5/1999 |
| JP | 11-219429 | 8/1999 |
| JP | 2000-287214 | 10/2000 |
| JP | 2001-312885 | 11/2001 |
| JP | 2003-85549 | 3/2003 |
| WO | WO 99/40541 | 8/1999 |

* cited by examiner

REFERENCE FRAME      SEARCH FRAME

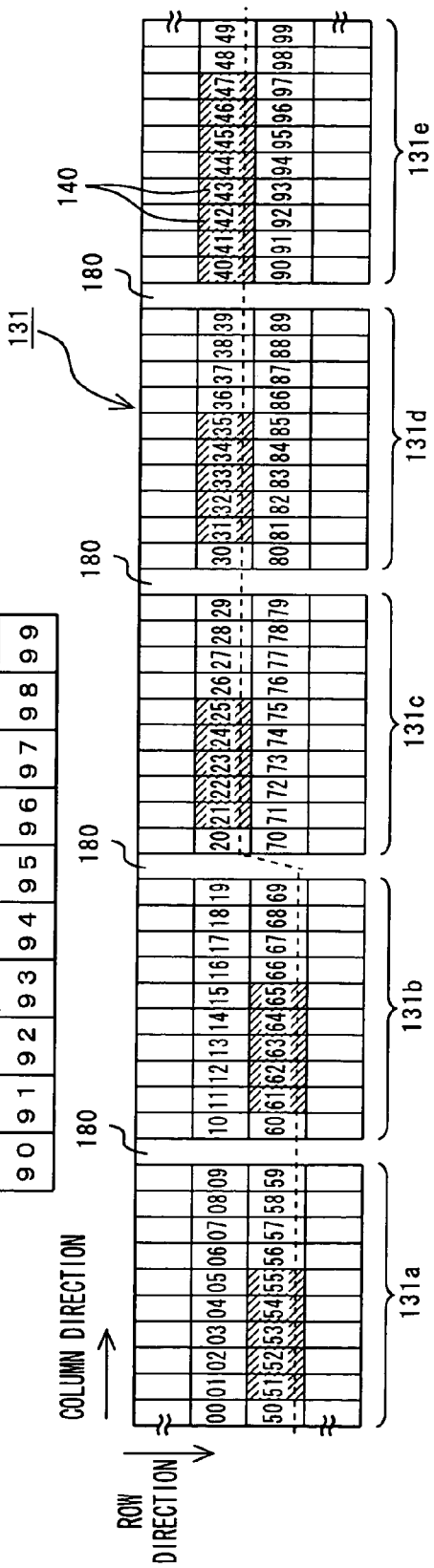

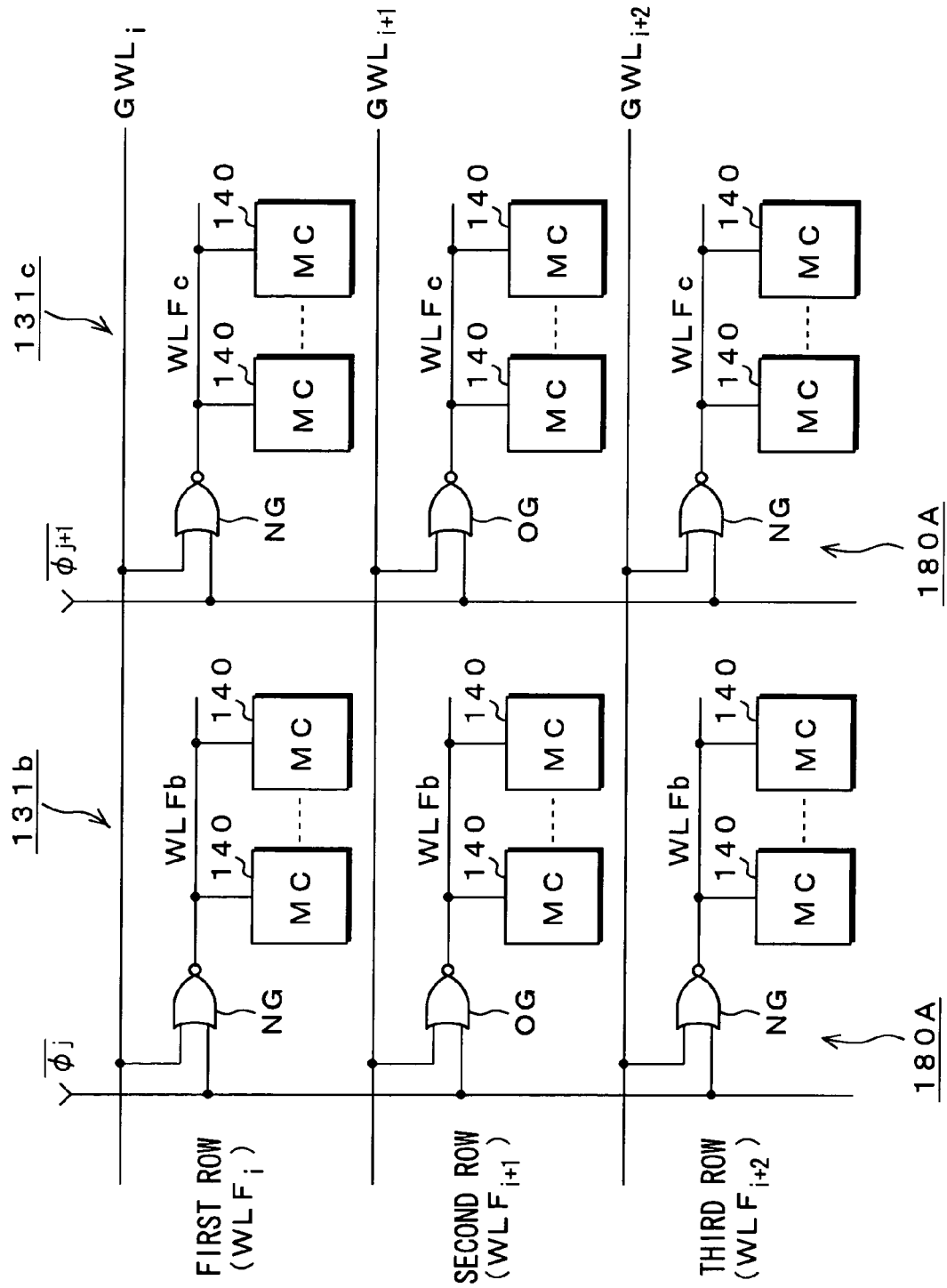

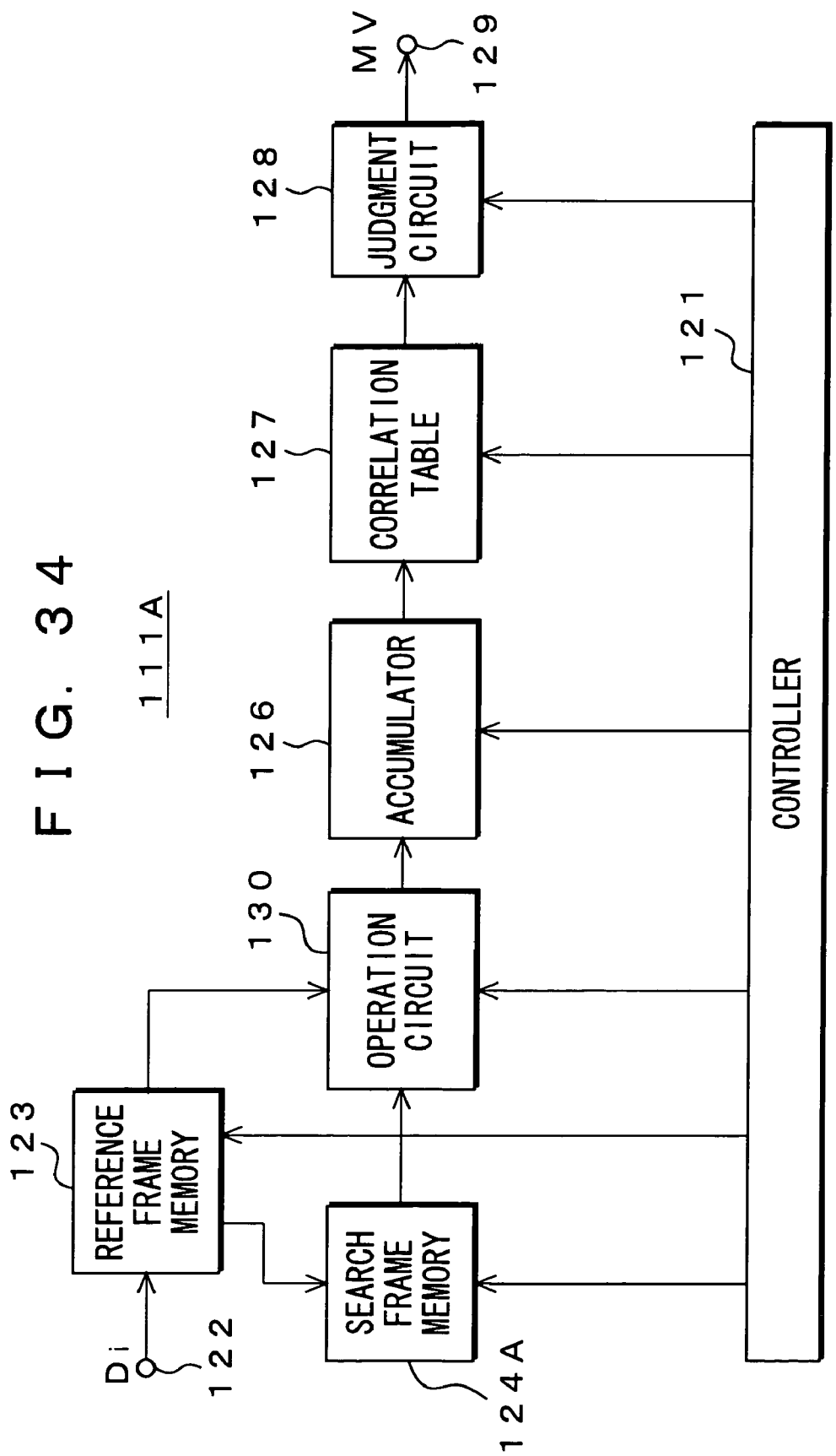

FIG. 36A   FIG. 36B

HIERARCHICAL CLASS 3

| z1 | |
|---|---|
| | |

| b1 | |
|---|---|
| | |

HIERARCHICAL CLASS 2

| y1 | y2 | | |
|---|---|---|---|
| y3 | y4 | | |
| | | | |
| | | | |

| a1 | a2 | | |
|---|---|---|---|
| a3 | a4 | | |
| | | | |
| | | | |

HIERARCHICAL CLASS 1

| x1 | x2 | x5 | x6 | | | | |
|---|---|---|---|---|---|---|---|
| x3 | x4 | x7 | x8 | | | | |
| x9 | x10 | x13 | x14 | | | | |
| x11 | x12 | x15 | x16 | | | | |
| | | | | | | | |
| | | | | | | | |
| | | | | | | | |
| | | | | | | | |

MEMORY CELL CIRCUIT, MEMORY DEVICE, MOTION VECTOR DETECTION DEVICE, AND MOTION COMPENSATION PREDICTION CODING DEVICE

TECHNICAL FIELD

This invention relates to a memory cell circuit, a memory device, a motion vector detector, and a motion compensation predictive encoder.

BACKGROUND ART

On sequential data, simultaneous processing of data in a relatively small domain is often preferred. For example, in processing image data, data to be processed on target pixel is generated from multiple items of the data of the target pixel and its peripheral pixels. In motion estimation (ME) of a motion vector by block-matching, based on given pixel data within a given pixel block having a predetermined dimension on a location in a preceding frame, an estimation is made as to which of pixel data within a pixel block having the same dimension as the above pixel block in the subsequent frame is the closest to the above given pixel data. The displacement between positions of the two-pixel blocks is defined to be a motion vector.

Here, the items of the pixel data within the above pixel blocks are simultaneously read out of a memory storing the image data, and calculation of differences between the corresponding items of pixel data is also simultaneously performed for each of the pixels. Such data processing leads to a use of a natural and hence comprehensive processing system or algorithm.

Conventionally, however, a general-purpose memory such as a synchronous DRAM is used as a memory storing the image data, and thus, the pixel data is sequentially read out of the general-purpose memory with a high transfer rate and temporarily accumulated in a register to form a necessary tap or a necessary pixel block. In this case, it is inevitable to generate waiting time when all the items of data are accumulated, which has been of a hindrance to a high-speed and efficient processing of image data.

In a conventional data processing of a motion picture, a motion vector is used that represents a motion direction and magnitude of an object in the images that are displaced in time. Such a motion vector is used in motion compensation predictive encoding of an image for high-efficiency coding.

As a motion magnitude determination method for determining this image, Japanese Patent Publication H7-222157 discloses a method for forming multiple hierarchical classes of image data having different resolutions from the input image data, and determining motion vector of a set position of input image using the multiple hierarchical classes of image data, to reduce an amount of operation.

In this motion vector determination method, the input image data (image data of hierarchical class 1) is first averaged according to mean-value hierarchizing such as averaging and low-pass filtering to produce the image data having a reduced number of pixels (image data of hierarchical class 2). Next, a rough motion vector is determined in the image data of hierarchical class 2, and then a fine motion vector is determined in the image data of hierarchical class 1 based on the rough motion vector, thereby permitting the determination of a motion vector with a reduced amount of calculation.

It would be apparent that the number of hierarchical classes is not limited to two as in the example shown above. A motion vector may be determined as the above cases by repeating the mean-value hierarchizing in sequence to produce further hierarchical classes 3 and 4 of image data having further reduced numbers of pixels.

In this case, if the same memory unit stores image data belonging to the respective hierarchical classes when read and write of the image data of the respective hierarchical classes can be made independently, this has an increased efficiency.

DISCLOSURE OF THE INVENTION

It is, therefore, an object of the invention to provide a memory device and the like capable of simultaneously accessing multiple items of pixel data constituting a pixel block having an arbitrary configuration such as a rectangle and a cross, and of easily changing a position of the pixel block, thereby facilitating the processing thereof at high-speed and with efficiency.

It is another object of the invention to provide a motion vector detector capable of increasing efficiency for detecting a motion vector using respective hierarchical classes of image data by allowing different hierarchical classes of image data to be independently written to and read out of a memory unit, and to provide a memory device for use in such motion vector detector, and to provide a memory cell circuit for use in such memory device.

A memory device in accordance with the invention is a memory device comprising one or more memory blocks, wherein each memory block includes multiple memory cells arranged in a matrix form, and multiple selection lines for selecting memory cell column extending in one direction of the matrix, each line corresponding to the memory cell column, wherein an area of the multiple memory cells arranged in a matrix form has multiple divisional domains divided in the one direction of the matrix, wherein each of the multiple selection lines has multiple divisional selection lines divided corresponding to the multiple divisional domains, and wherein the memory block further includes switching mechanism for switching the divisional selection lines that are simultaneously activated in the associated divisional domains.

An inventive motion vector detector in accordance with the invention for detecting a motion vector from a reference frame and a search frame that are displaced in time, comprises a first memory unit for storing multiple items of pixel data constituting the reference frame, a second memory unit for storing multiple items of pixel data constituting the search frame, an operation unit for receiving pixel data of the reference block read out of the first memory unit and pixel data of multiple candidate blocks in the search block, the pixel data of multiple candidate blocks being associated with the reference block and read out of the second memory unit, and for calculating differences between the pixel data in the multiple candidate blocks and the pixel data of the reference block every corresponding item of pixel data, in relation to the respective multiple candidate blocks, and a motion vector detection unit for detecting a motion vector associated with the reference block based on the differences calculated for each of the items of pixel data in relation to the respective multiple candidate blocks operated in the operation unit, wherein each of the first and second memory units comprises one or more semiconductor memory block, wherein the semiconductor memory block has multiple bit lines, multiple word lines perpendicularly crossing the multiple bit lines, and multiple memory cells arranged in a matrix form and connected with the bit lines and the word lines, wherein an area of the multiple memory cells arranged in the matrix form has multiple divisional domains divided in a direction along the word line, wherein each of the multiple selection lines has multiple divisional word lines divided corresponding to the multiple divisional domains, and wherein the semiconductor memory block further has switching mechanism for switching the divisional word lines that are simultaneously activated in the divisional domains.

Further, another motion vector detector in accordance with the invention for detecting a motion vector from a reference frame and a search frame that are displaced in time, comprises a first memory unit for storing multiple items of pixel data constituting the reference frame, a second memory unit for receiving pixel data of the reference block read out of the first memory unit as reference data and for calculating differences between the pixel data in multiple candidate blocks in the search area associated with the reference block and the pixel data of the reference block every corresponding item of pixel data, in relation to the respective multiple candidate blocks, and a motion vector detection unit for detecting a motion vector associated with the reference block, based on the differences for each of the items of pixel data in relation to the respective multiple candidate blocks operated in the second memory unit, wherein the first memory unit comprises one or more first semiconductor memory blocks, and the second memory unit comprises one or more second semiconductor memory blocks, wherein the first semiconductor memory block has multiple bit lines, multiple word lines perpendicularly crossing the multiple bit lines, and multiple memory cells arranged in a matrix form and connected to the bit lines and the word lines, wherein an area of the multiple memory cells arranged in the matrix form has multiple divisional domains divided in a direction along the word line, wherein each of the multiple selection lines has multiple divisional word lines divided corresponding to the multiple divisional domains, wherein the first semiconductor memory block further has switching mechanism for switching the divisional word lines that are simultaneously activated in the divisional domains, wherein the second semiconductor memory block has multiple bit lines, multiple word lines perpendicularly crossing the multiple bit lines, a reference data input line for receiving reference data, the reference data input lines perpendicularly crossing the bit lines or parallel extending along the bit lines, an operation data output line for outputting operation data, the operation data output lines perpendicularly crossing the multiple the bit lines or parallel extending along the bit lines, a cell selection line for receiving cell selection signal, the cell selection line perpendicularly crossing the multiple word lines or parallel extending along the multiple word lines, multiple memory cells arranged in a matrix form, the cells being connected with the bit lines, the word lines, the reference data input line, the operation data output line, and the cell selection line, and an ancillary operational cell for performing a numerical calculation using at least a part of the operation data outputted from the multiple operation data output line to obtain the differences, wherein the memory cell includes a memory cell unit for storing data of "1" or "0", a reference data input unit for receiving the reference data, the reference data input unit being connected with the reference data input line, an operation function unit for executing an logical operation using the memory data stored in the memory cell unit and reference data received from the reference data input unit, an operation data output unit for outputting the operation data obtained in the operation function unit to the operation data output line, the operation data output unit being connected with the operation data output line, a cell selection signal input unit for receiving the cell selection signal, the cell selection signal input unit being connected with the cell selection line, and an output control unit for outputting to the operation data output unit the operation data obtained by the operation in the operation function unit, based on the cell selection signal received in the cell selection signal input unit, wherein an area of the multiple memory cells arranged in the matrix form has multiple divisional domains divided in a direction along the cell selection line, wherein each of the multiple selection lines has the multiple divisional cell selection lines divided corresponding to the multiple divisional domains, and wherein the second semiconductor memory block further has switching mechanism for switching the divisional cell selection lines that are simultaneously activated in the associated divisional domain.

A motion compensation predictive encoder according to the invention makes motion compensation using a motion vector detected by the above motion vector detector.

In this invention, the memory device comprises one or more memory blocks. The memory block has a memory cell array consisting of multiple memory cells arranged in a matrix form and multiple selection lines for selecting the respective memory cell columns, the selection line being arranged corresponding to each of the memory cell columns in one direction of the matrix of the memory cell array.

For example, the memory block includes multiple bit lines, multiple word lines perpendicularly crossing the multiple bit lines, multiple memory cells arranged in a matrix form, the cells being connected with the bit lines and the word lines. The above multiple selection lines are word lines and the above one direction of the matrix is a direction along the word line.

Further, the memory block includes multiple bit lines, multiple word lines perpendicularly crossing the multiple bit lines, a reference data input line for receiving reference data, the reference data input line perpendicularly crossing the multiple bit lines or parallel extending along the multiple bit lines, an operation data output line for outputting operation data, the operation data output line perpendicularly crossing the multiple the bit lines or parallel extending along the multiple bit lines, a cell selection line for receiving cell selection signal, the cell selection line perpendicularly crossing the multiple word lines or parallel extending along the multiple bit lines, and multiple memory cells arranged in the matrix form, the cells being connected with the bit lines, the word lines, the reference data input line, the operation data output line, and the cell selection line, wherein the memory cell includes a memory cell unit for storing data of "1" or "0", a reference data input unit for receiving the reference data, the reference data input unit being connected with the reference data input line, an operation function unit for performing an logical operation using the memory data stored in the memory cell unit and reference data received from the reference data input unit, an operation data output unit for outputting the operation data obtained in the operation function unit to the operation data output line, the operation data output unit being connected with the operation data output line, a cell selection signal input unit for receiving the cell selection signal, the cell selection signal input unit being connected with the cell selection line, and an output control unit for outputting to the operation data output unit the operation data obtained by the operation in the operation function unit, based on the cell selection signal received in the cell selection signal input unit, wherein the multiple selection lines are the multiple cell selection lines, and wherein the one direction of matrix is a direction along the cell selection line.

In this instance, the logical operation is performed in the operation function unit of the memory cell on the memory data stored in memory cell unit and the reference data received from the reference data input unit, and the resultant operation data is outputted from the operation function unit to the operation data output unit upon receipt of a cell selection signal input to the cell selection signal input unit. In the ancillary operational cell, numerical calculation is made using the operation data outputted to the operation data output unit of the memory cell to output the resultant operation data to the operation data output unit.

For example, multiple logical operations are performed in parallel in the operation function unit of the memory cell, while numerical calculations are performed in the operation unit of the ancillary operational cell using multiple items of the resultant operation data obtained by the multiple logical operations.

Further, for example, the ancillary operational cell may be composed of, for example, a first ancillary operational cell unit and a second ancillary operational cell unit, such that the first ancillary operational cell unit performs a fist numerical calculation using the operation data obtained by the operation function unit of the memory cell, while the second ancillary operational cell unit performs a second numerical calculation using items of the operation data obtained by the operations of the multiple first ancillary operational cell units. If, in this example, the first numerical calculation is subtraction and the second numerical calculation is a calculation of absolute value, a difference absolute value is obtained as the operation data from the ancillary operational cell.

An area of the multiple memory cells arranged in the matrix form has multiple divisional domains divided in a direction of the matrix. Each of the multiple selection lines has multiple divisional selection lines divided corresponding to the multiple divisional domains. The memory block has switching mechanism for switching the divisional selection lines that are simultaneously activated in the divisional domains.

In this way, by forming each of the selection lines to have multiple divisional selection lines, and by providing switching mechanism for switching divisional selection lines that are simultaneously activated in the divisional domains, a suitable location of the pixel data constituting a given image data on multiple memory cells arranged in a matrix form may be performed, thereby allowing simultaneous access to the pixel data constituting a pixel block having an arbitrary configuration such as a rectangle or a cross and easy alteration of the position of the pixel block to be executed.

For example, it is possible to move the pixel block described above in the horizontal or vertical direction in units of the integral number of pixels, and move the pixel block in the vertical or horizontal direction by one pixel by storing an integral number of vertical or horizontal arrays of pixel data constituting the given image data in multiple memory cells associated with one divisional cell selection line.

When the above described memory device is used for the motion vector detection circuit of the motion vector detector or the motion compensation predictive encoder, the efficiency and hence the speed of motion vector detection processing is highly improved.

A memory cell circuit of the invention is provided with a memory cell unit for storing data of "1" or "0", and multiple access transistors for connecting the memory cell unit in parallel to the bit line.

According to the invention, the gates of the multiple access transistors can be connected with different word lines. Accordingly, selection of memory cell unit can be carried out using any one of the multiple word lines.

The memory device in accordance with the invention includes first memory cell and second memory cells that are arranged in a matrix form and admixed. The first memory cell is connected with a first word line and a second word line, respectively. The second memory cell is connected with only the first word line. The first word line extends in the column direction of the matrix, while the second word line is provided in an echelon form extending over multiple rows of the matrix.

According to the invention, the first memory cells and the second memory cells are arranged in a matrix form and admixed. With the first memory cell connected with the first and second word lines, the second memory cell is connected with only the first word line.

The first word line is arranged to extend in the column direction of the matrix. Hence, the first word line can selectively activate columnar memory cells (the first memory cell and the second memory cell). On the other hand, the second word line is arranged to extend over multiple rows of the matrix in an echelon form. Accordingly, the second word line can selectively activate only the first memory cells that extend over multiple rows of the matrix.

Thus, it is possible to simultaneously activate only the first memory cells extending over the multiple rows of the matrix by the second word line to perform read and write of memory data.

It is noted that echelon form of the second word line is repeated in the column direction of the matrix by the unit of a predetermined number of memory cells, thereby simultaneously activating with the second word line the first memory cells provided over the multiple rows repeated in the column direction of the matrix by the unit of a predetermined number of memory cells. This allows the data to be read out of and write to the memory cells.

The second word line includes multiple shared second word lines having different echelon forms, thereby allowing the each of the second word lines to simultaneously activate the first memory cells arranged over multiple rows of the matrix in the different echelon forms. In this case, if the first memory cells respectively connected to the multiple second word lines are different memory cells, each of the second word lines can activate the separate first memory cells.

Another motion vector detector according to this invention comprises an image hierarchizing means for producing multiple hierarchical classes of image data having different resolution from input image data, motion vector detection means for detecting a motion vector of a predetermined position of the input image using block-matching processing, based on the multiple hierarchical classes of image data formed by the image hierarchizing means, and the above memory device as a memory unit for storing the multiple hierarchical classes of image data, wherein the lowest hierarchical class of the image data among the multiple classes of image data is stored in the second memory cell, and the hierarchical classes of the image data other than the lowest class are stored in the first memory cell.

In the invention, the multiple hierarchical classes of image data having different resolutions are produced from input image data, and a motion vector located at a particular position in the input image is detected using a block-matching processing technique based on the multiple hierarchical classes of image data.

The lowest hierarchical class image data of the multiple hierarchical classes of image data is stored in the second memory cells solely connected to the first word line. On the other hand, image data of hierarchical classes other than the lowest class is stored in the first memory cell connected to the first and the second word lines.

Accordingly, of the multiple hierarchical classes of image data, the lowest hierarchical class image data may be read and written by activating the second memory cells by the first word line. On the other hand, the image data of hierarchical classes other than the lowest class may be read out and written by activating the first memory cells by the second word line, independently of the lowest class image data. Thus, the motion vector detection processing can be efficiently carried out.

In the invention, multiple second word lines having different echelon forms are shared; the first memory cells connected with the multiple second word lines are different memory cells; and each of the first memory cells connected to the multiple second word lines stores image data belonging to the different hierarchical classes, thereby activating the first memory cells by each of the second word lines and thus allowing different hierarchical classes of image data to be read and written.

BRIEF DESCRIPTION OF THE DRAWINGS

FIGS. 22A and 22B are diagrams showing pixel data of the search frame and memory locations within memory cell arrays, respectively;

FIGS. 24A and 24B are diagrams showing pixel data of the search frame and memory locations within memory cell arrays, respectively;

FIGS. 25A and 25B are diagrams showing pixel data of the search frame and memory locations within memory cell arrays, respectively;

FIGS. 26A and 26B are diagrams showing pixel data of the search frame and memory locations within memory cell arrays, respectively;

FIG. 27 is a diagram showing another arrangement of the switching mechanisms for switching divisional cell selection lines;

FIGS. 32A and 32B are diagrams showing pixel data of the search frame and memory locations within memory cell arrays, respectively;

FIG. 34 is a block diagram showing a configuration of another motion vector detection circuit;

FIGS. 36A and 36B are diagrams illustrating the hierarchical structure;

BEST MODE FOR CARRYING OUT THE INVENTION

Figure 1:
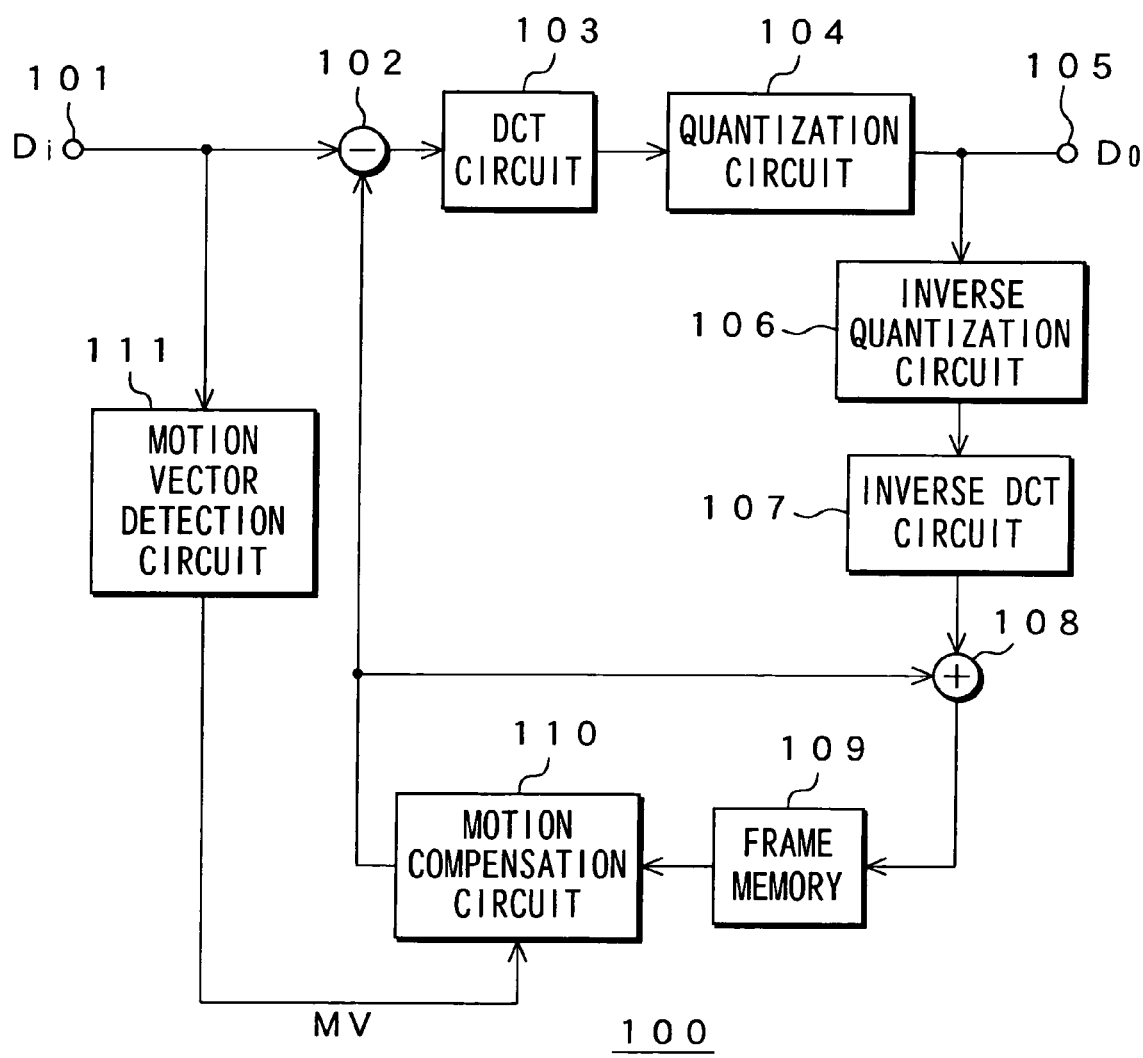
FIG. 1 is a block diagram showing a configuration of a motion compensation predictive encoder according to the invention.

FIG. 1 shows a configuration of a motion compensation predictive encoder 100 in accordance with an embodiment of the invention.

The encoder 100 comprises input terminal 101 for receiving image data (frame data constituting a moving image) Di, subtracter 102 for calculating the difference between the image data Di received at the input terminal 101 and prediction image data supplied from a motion compensation circuit 110, which will be described later, DCT (discrete cosine transformation) circuit 103 for performing DCT operation on the difference data obtained by subtracter 102, quantization circuit 104 for quantizing the DCT coefficient obtained in the DCT circuit 103, and output terminal 105 for outputting the encoded data Do obtained by the quantization circuit 104.

The encoder 100 also comprises an inverse quantization circuit 106 for performing inverse quantization on the encoded data Do obtained in the quantization circuit 104, an inverse DCT circuit 107 for performing an inverse DCT operation on the output data of the inverse quantization circuit 106 to obtain difference data, adder 108 for adding the difference data obtained in the inverse DCT circuit 107 and prediction image data obtained in the compensation circuit 110 to restore its original image data, and frame memory 109 for storing the image data restored in the adder 108.

The encoder 100 further comprises the motion compensation circuit 110 for reading image data stored in the frame memory 109, performing a motion compensation operation based on the motion vector MV received from a motion vector detection circuit 111 (described in detail later), and then supplying prediction image data to the subtracter 102 and the adder 108 described above, and the motion vector detection circuit 111 for detecting a motion vector MV of the image data Di received at the input terminal 101 and supplying it to the compensation circuit 110.

Referring to FIG. 1, operations of the motion compensation predictive encoder 100 will now be described.

The image data Di received at the input terminal 101 is supplied to the subtracter 102 and the motion vector detection circuit 111. The subtracter 102 calculates the difference between the image data Di and the prediction image data supplied from the motion compensation circuit 110.

The difference data obtained by the subtracter 102 is supplied to the DCT circuit 103 where it is subjected to the discrete cosine transformation. The DCT coefficient obtained by the DCT circuit 103 is supplied to the quantization circuit 104 for quantization of the coefficient. The encoded data Do obtained by the quantization circuit 104 is outputted to the output terminal 105.

The encoded data Do obtained by the quantization circuit 104 is supplied to the inverse quantization circuit 106 for the inverse quantization thereof. The output data of this inverse quantization circuit 106 is supplied to the inverse DCT circuit 107 where it is subjected to the inverse DCT to restore the difference data. The difference data and the prediction data supplied by the motion compensation circuit 110 are added by the adder 108 to restore the original image data, and the restored image data is stored in the frame memory 109.

The motion compensation circuit 110 reads the image data of the preceding frame stored in the frame memory 109 and performs motion compensation based on the motion vector MV received from the motion vector detection circuit 111 to obtain motion-compensated prediction image data. As described above, the prediction image data is supplied to the subtracter 102 to obtain the difference data, and to the adder 108 to restore the image data.

Next, the motion vector detection circuit 111 will be described in detail.

Figure 2:
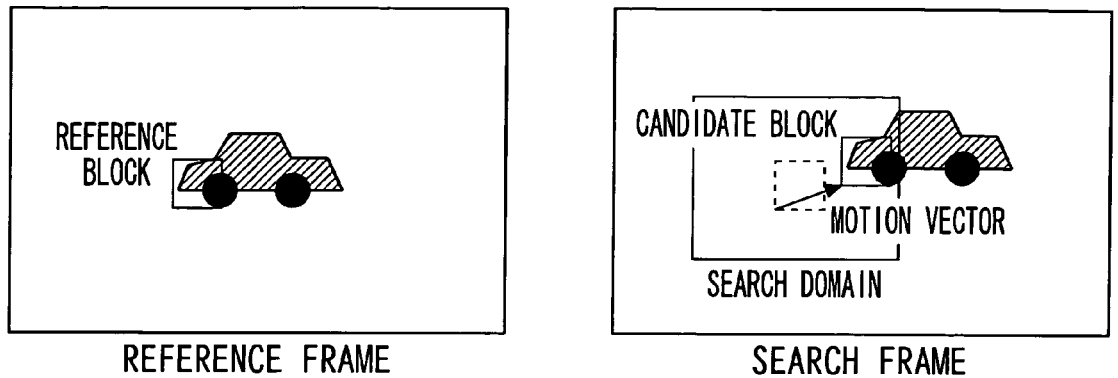
FIG. 2 is a diagram illustrating a block-matching method for detecting a motion.

In the motion vector detection circuit 111, a motion vector is detected using a block-matching method. According to the method, a motion vector is obtained by moving the candidate block of a search frame within a predetermined search domain to find the candidate block that matches best the reference block of the search frame, as shown in FIG. 2.

Figure 3A:
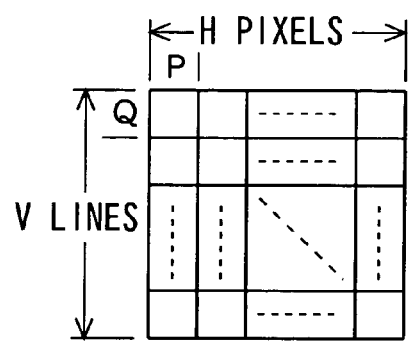
FIGS. 3A and 3B are diagrams each illustrating the block-matching method applied to motion detection.
Figure 3B:
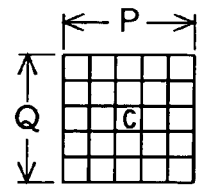

In the block-matching method, given an image having, for example, H pixels in the horizontal direction and V lines in the vertical direction as shown in FIG. 3A, the image is segmented into blocks of P pixels by Q lines, where P is the number of horizontal pixels and Q is the number of vertical pixels in one block, as shown in FIG. 3B. In the example shown in FIG. 3B, P=5 and Q=5. Pixel c is the central pixel position of the block.

Figure 4A:
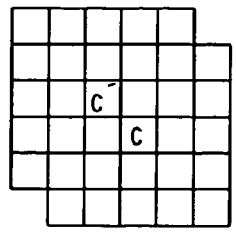
FIGS. 4A-4C are diagrams each illustrating the block-matching method applied to the motion detection.
Figure 4B:
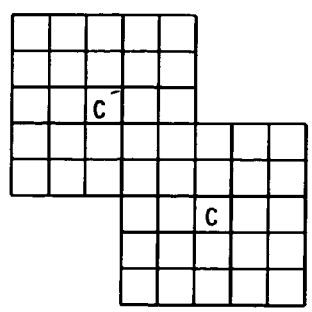
Figure 4C:
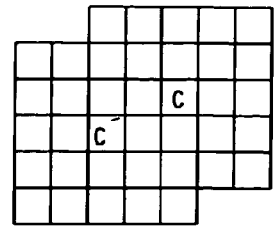

FIGS. 4A-4C show a positional relationship between a reference block having a central pixel at pixel position c and a candidate block having a central pixel at pixel position c'. It is noted that the reference block having a central pixel at a pixel position c is a target reference block in the reference frame and a candidate block in the search frame that matches the target reference block is positioned at a position of a block having a central pixel at pixel position c'. In the block-matching method, a motion vector is detected by finding the candidate block that matches best the reference block within the search domain.

In the example shown in FIG. 4A, a motion vector is detected that corresponds to a movement of +1 pixel in the horizontal direction and +1 line in the vertical direction, which will be represented by (+1, +1). In FIG. 4B, a motion vector MV (+3, +3) is detected. A motion vector (+2, −1) is detected in FIG. 4C. A motion vector is obtained for each reference block of the reference frame.

Assuming that an area for searching the motion vector is given by ±S pixels in horizontal direction and ±T lines in the vertical direction, the reference block needs to be compared with candidate blocks having their centers c' offset from the center c of the search block by ±S pixels in the horizontal direction and ±T lines in the vertical direction.

Figure 5:
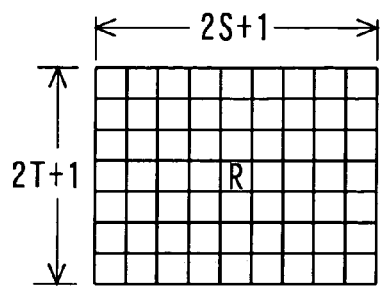
FIG. 5 is a diagram illustrating the block-matching method applied to the motion detection.

FIG. 5 shows that when the center c of a reference block in the reference frame is set at a position R, comparison between the reference block and (2S+1)(2T+1) candidate blocks in the search frame is necessary. That is, all the candidate blocks having their centers c' anywhere within the meshes of FIG. 5 can be a candidate for the comparison. FIG. 5 shows an example with S=4 and T=3.

A motion vector is detected by detecting the smallest assessment value among the assessment values (for example, the sum of the absolute values of the respective frame differences, the sum of squares of the respective frame differences, or the sum of the n-th powers of the respective absolute values of frame differences, etc.) obtained in the comparison performed within the search domain. The search domain shown in FIG. 5 is a domain in which the center of a candidate block is set. The dimensions of the search domain that can include all of such candidate blocks are (2S+P)×(2T+Q).

Figure 6:
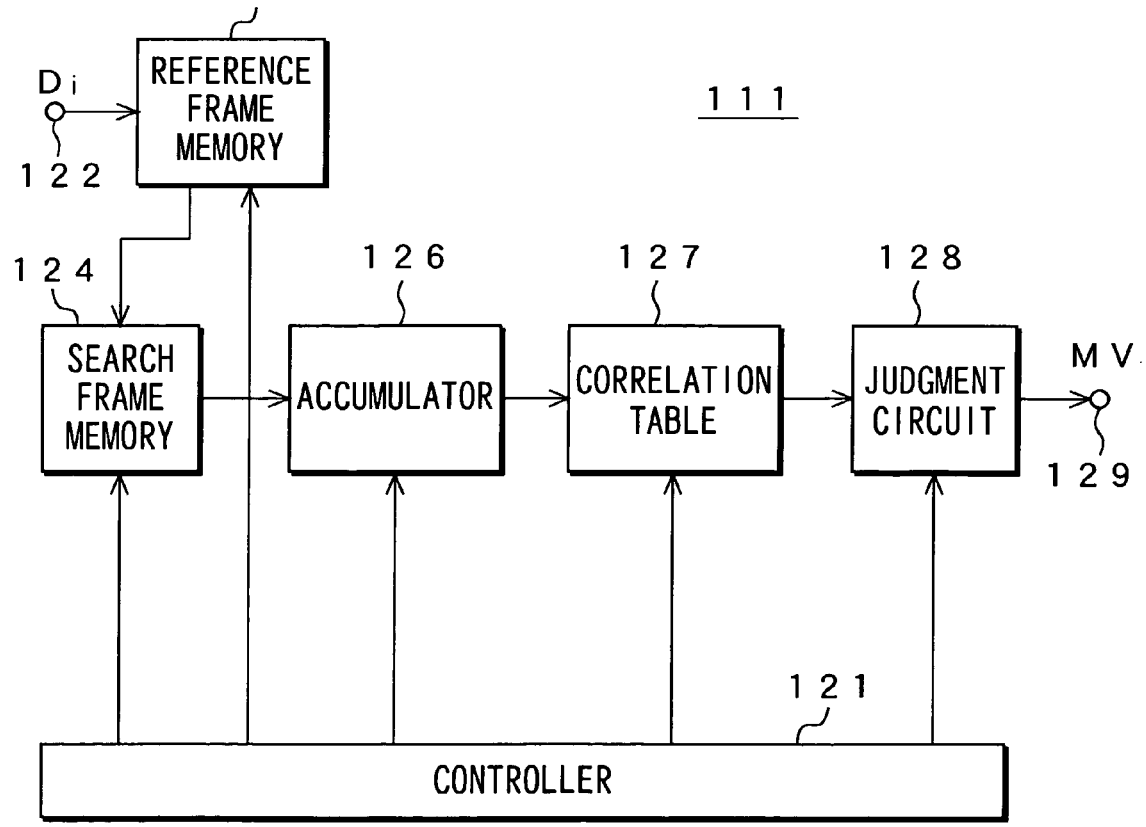
FIG. 6 is a block diagram showing a configuration of a motion vector detection circuit.

FIG. 6 shows a configuration of a motion vector detection circuit 111.

This motion vector detection circuit 111 has controller 121 for controlling the operations of the entire circuit, input terminal 122 for receiving the image data Di, frame memory 123 for accumulating image data of a reference frame, and frame memory 124 for accumulating image data of a search frame. The controller 121 controls reading and writing operations of these frame memories 123 and 124.

When the image data of a certain frame is supplied from the input terminal 122 to the frame memory 123 where it is written, the image data associated with the preceding frame and stored in the frame memory 123, is read out of the frame memory 123 and supplied to the frame memory 124 where it is written.

Under the control of the controller 121, the frame memory 124 is supplied with the pixel data of a reference block from the frame memory 123. The frame memory 124 calculates the difference absolute value between the respective pixel data of the candidate blocks and the pixel data of the reference block for every pixel data, in relation to the respective multiple candidate blocks corresponding to the reference block in the search domain, and outputs the difference absolute value.

The motion vector detection circuit 111 has accumulator 126 for receiving from the frame memory 124 the difference absolute values calculated for each pixel data associated with the respective candidate blocks and accumulating the difference absolute values, and a correlation table 127 for storing the accumulated difference absolute values obtained by the accumulator 126, which correspond to the multiple candidate blocks, as correlation values.

The motion vector detection circuit 111 also has judgment circuit 128 for detecting a motion vector MV based on the correlation value corresponding to the respective candidate blocks stored in the correlation table 127, and output terminal 129 for outputting the motion vector MV detected by the judgment circuit 128. The judgment circuit 128 detects a position of the candidate block having the smallest correlation value as a motion vector MV.

Referring to FIG. 6, the operations of the motion vector detection circuit 111 will be described.

The image data Di inputted to the input terminal 122 is supplied to the frame memory 123 where it is accumulated as image data of the reference frame. In this case, the image data of the preceding frame, stored in the frame memory 123, is retrieved from the frame memory 123 and supplied to the frame memory 124 where it is accumulated as the image data of the search frame.

The image data of the reference block is read out of the frame memory 123 and supplied to the frame memory 124. In the frame memory 124, the difference absolute values between the pixel data of candidate blocks and the pixel data of the reference block are calculated and outputted for each item of the pixel data, in relative to the respective multiple candidate blocks corresponding too the reference block in the search domain. If in this case, the reference block and the candidate block are composed of P pixels and Q lines (see FIG. 3B), then P×Q difference absolute values are available for each of the multiple candidate blocks.

Thus, the difference absolute values calculated for each item of the pixel data in relative to the respective multiple candidate blocks are outputted from the frame memory 124 and sequentially supplied to, and accumulated in, the accumulator 126. The cumulative values accumulated in the accumulator 126 for the respective multiple candidate blocks are supplied to the correlation table 127, and stored as correlation values. In the judgment circuit 128, the position of the candidate block having the smallest correlation value is detected as the motion vector MV based on the correlation values of the respective multiple candidate blocks stored in the correlation table 127.

The image data of the multiple reference blocks in the reference frame is supplied in sequence from the frame memory 123 to the frame memory 124. Similar operations are repeated for the respective reference blocks in the frame memory 124, the accumulator 126, the correlation table 127, and the judgment circuit 128. Thus, in the judgment circuit 128, a motion vector MV is detected in sequence for each of the reference blocks. In this way, the motion vectors MV detected in the judgment circuit 128 are sequentially outputted from the output terminal 129.

Next, the frame memory 124 will be described in detail.

Figure 7:
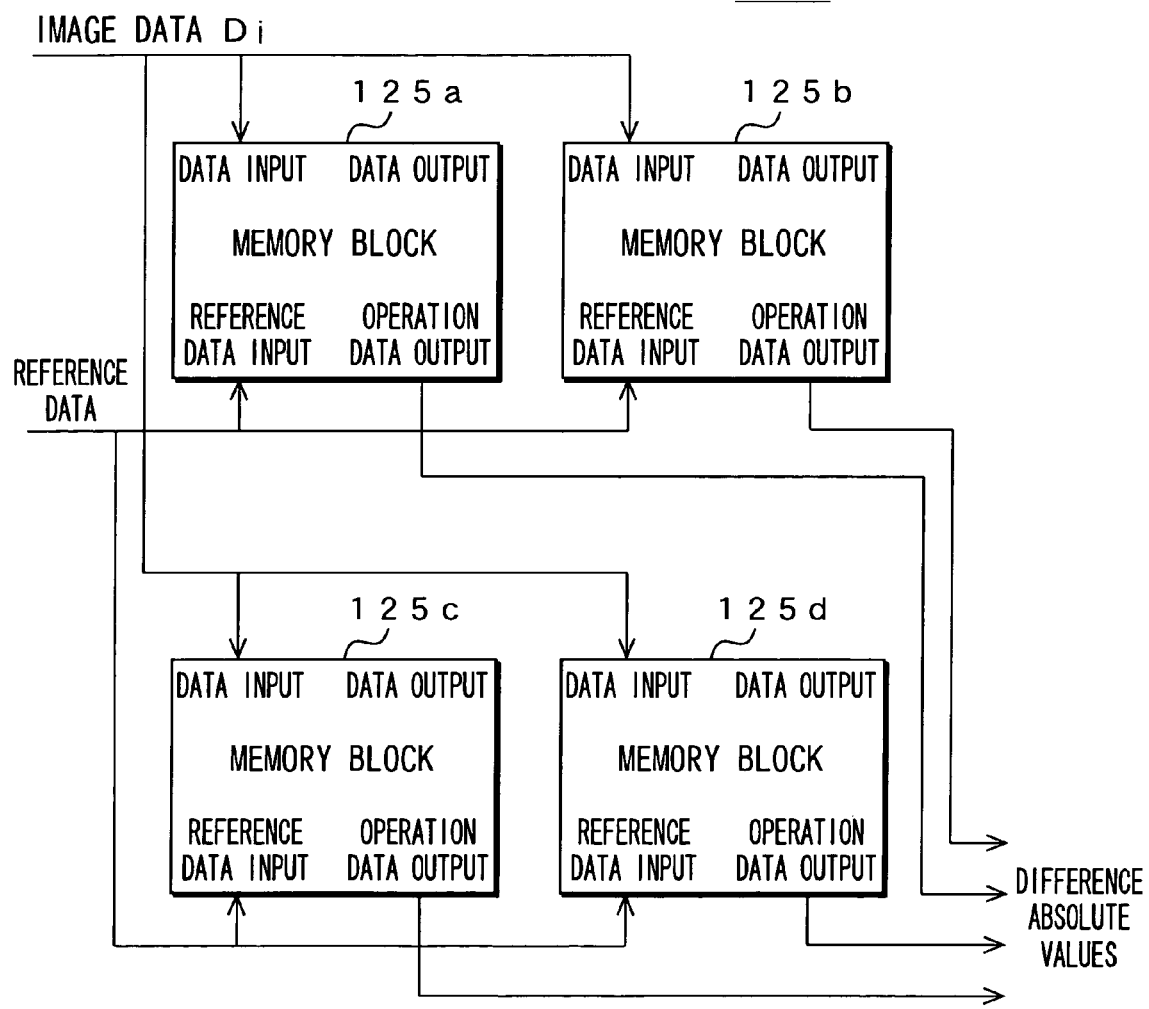
FIG. 7 is a diagram showing a configuration of a frame memory (a search frame memory) for accumulating image data of the search frame.

In the example shown in FIG. 7, the frame memory 124 comprises four memory blocks 125a-125d. However, the number of the memory blocks that constitute frame memory 124 is not limited to four. Each of the memory blocks 125a-125d comprises a data input unit, a data output unit, a reference data input unit, and an operation data output unit. The memory blocks 125a, 125b, 125c, and 125d store the pixel data of the upper left, upper right, lower left, and lower right sections of a search frame, respectively.

When a range of the central pixel of a predetermined candidate block is in any one of the upper left, upper right, lower left, and lower right sections of the search frame, it suffices to activate only the corresponding memory blocks 125a, 125b, 125c, and 125d, thereby suppressing power consumption.

In this case, items of pixel data near the boundaries of the upper left, upper right, lower left, and lower right boundary sections of the search frame are stored in duplication in the corresponding memory blocks 125a-125d. The reason for storing the pixel data in duplication in the memory blocks 125a-125d is because a candidate block having its central pixel located near a boundary requires pixel data beyond the boundary.

Figure 8:
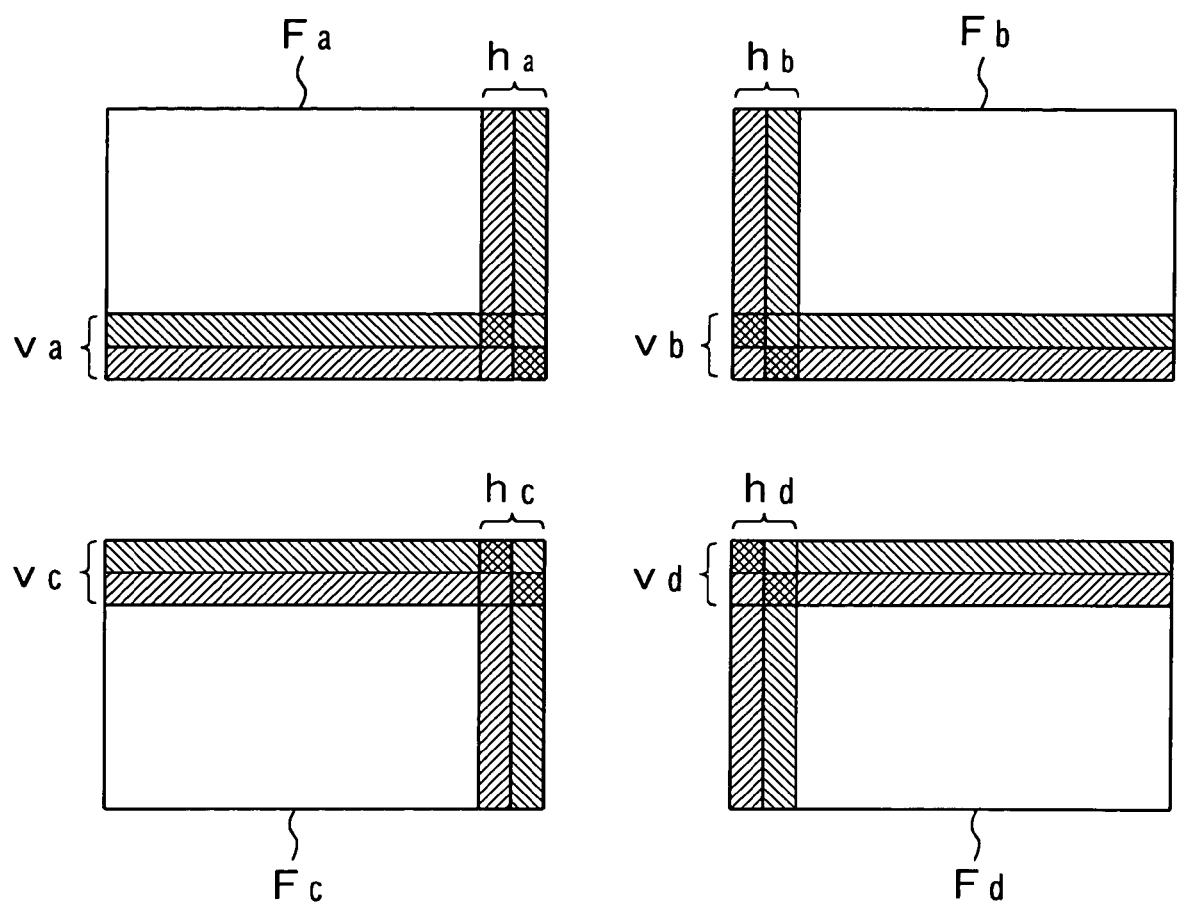
FIG. 8 is a diagram illustrating duplication of the pixel data among memory blocks that constitute the search frame memory.

FIG. 8 shows the upper left, upper right, lower left, and lower right sections Fa, Fb, Fc, and Fd of a search frame stored in the memory blocks 125a, 125b, 125c, and 125d, respectively. The memory blocks 125a and 125b store horizontally overlapped pixel data, ha and hb; the memory blocks 125c and 125d store horizontally overlapped pixel data, hc and hd; the memory blocks 125a and 125c store vertically overlapped pixel data, va and vc; and the memory blocks 125b and 125d store vertically overlapped pixel data, vb and vd. The number of pixels overlapped in the horizontal and vertical directions increases with the horizontal and vertical dimensions of the candidate block being increased.

Figure 9:
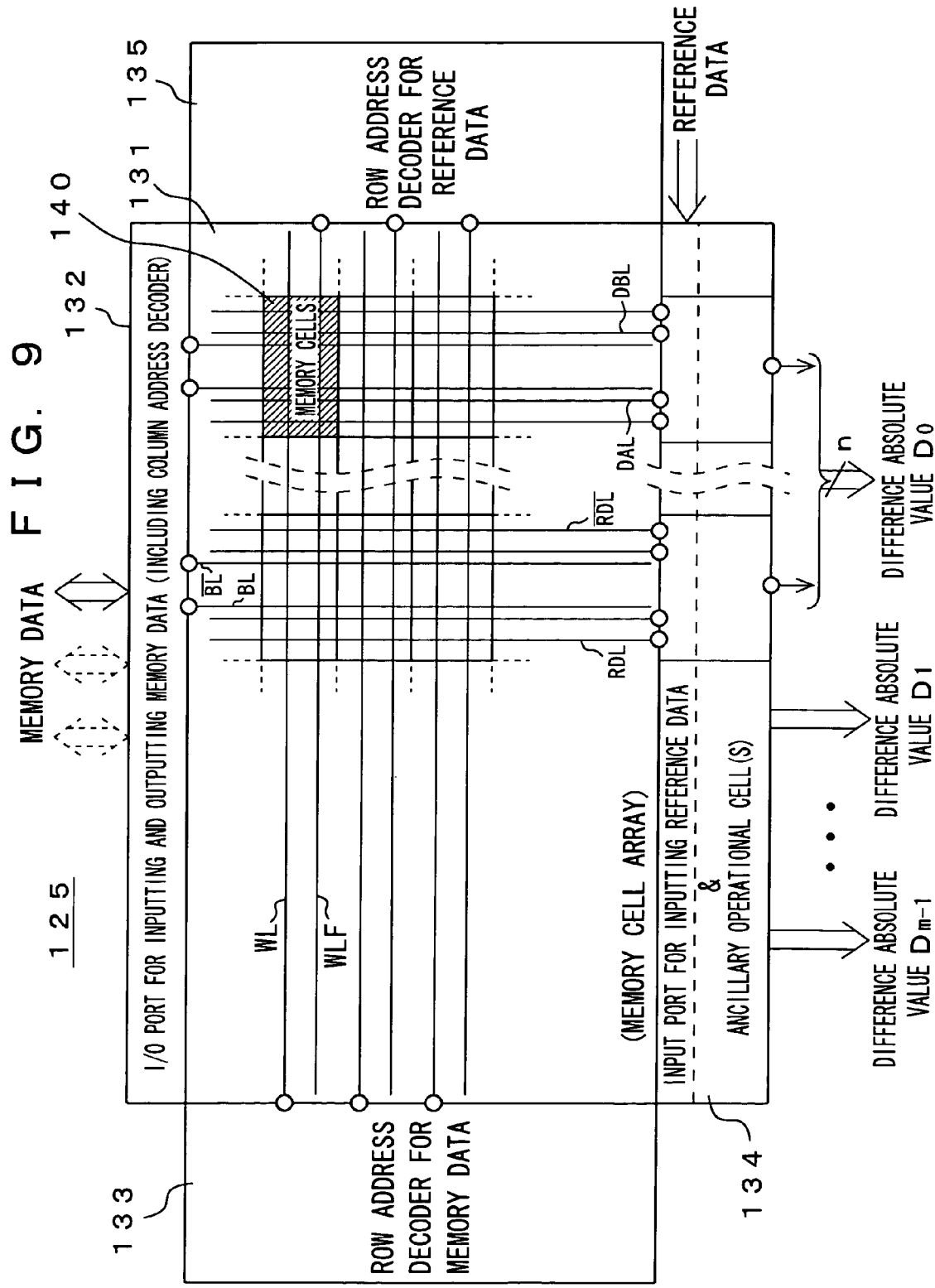
FIG. 9 is a diagram showing an arrangement of a memory block constituting the search frame memory.

FIG. 9 shows an arrangement of the memory block 125 (representing any of memory blocks 125a-125d).

Memory block 125 has memory cell array 131 of a multiple memory cells arranged in a matrix form, input/output port 132 (including a column address decoder) for inputting and outputting memory data, row address decoder 133 for memory data, input port for inputting the reference data and ancillary operational cell 134 (including a column address decoder), and row address decoder 135 for reference data.

Memory cell array 131 comprises multiple bit lines BL and /BL (/BL denoting BL overscored) for transferring the data that extend in the row direction, multiple word lines WL extending in the column direction and perpendicularly crossing the multiple bit lines BL and /BL, reference data input lines RDL and /RDL (/RDL representing RDL overscored) extending in parallel to multiple bit lines BL and /BL, for inputting reference data, operation data output lines DAL and DBL, extending in parallel to the multiple bit lines BL and /BL, for outputting operation data, cell selection lines WLF, extending in parallel to the word lines W, for inputting cell selection signals, and multiple memory cells 140 arranged in the matrix form and respectively connected with the respective bit lines BL and /BL, word lines WL, reference data input lines RDL and /RDL, operation data output lines DAL and DBL, and cell selection lines WLF.

Figure 10:
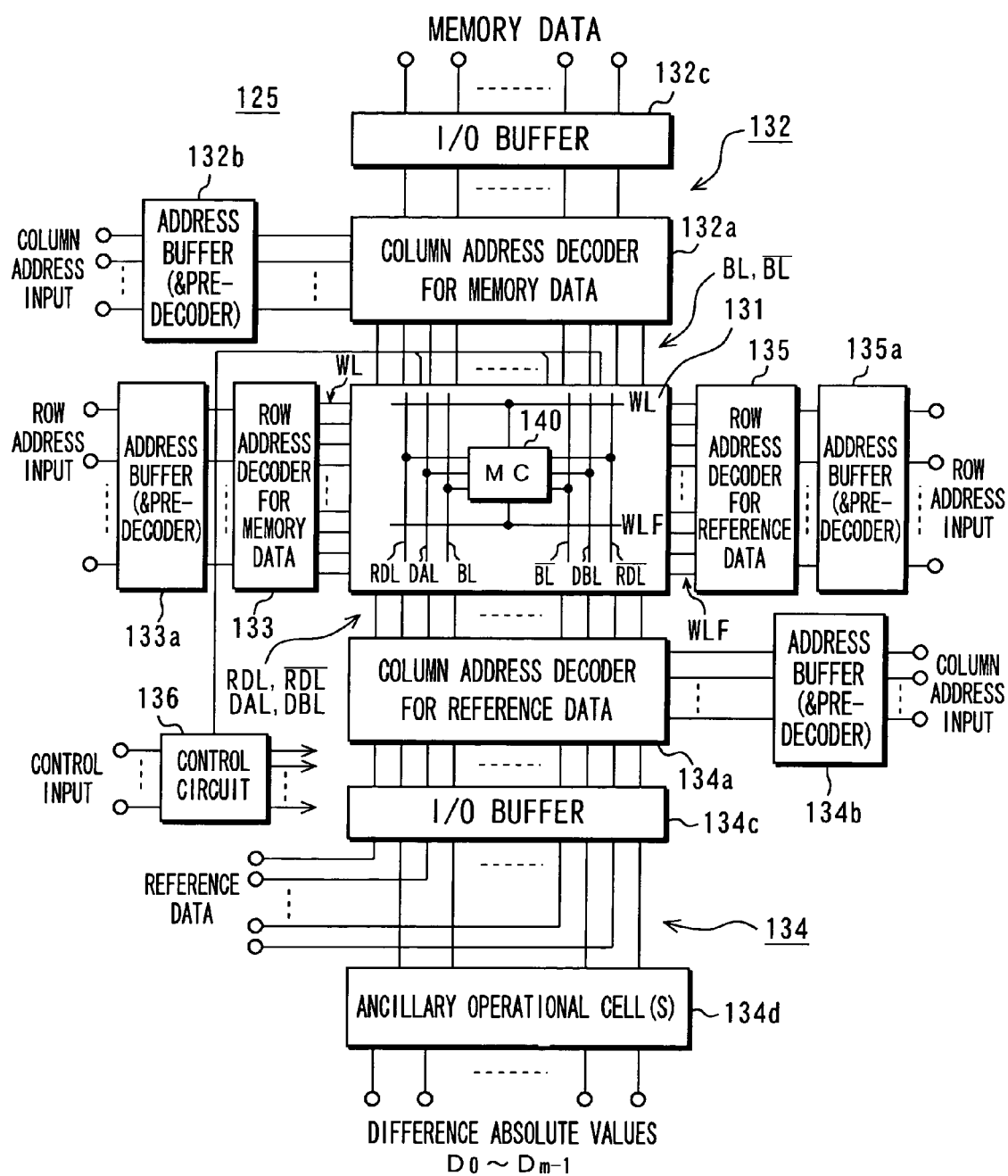
FIG. 10 is a diagram showing an arrangement of the memory block constituting the search frame memory.

FIG. 10 shows details of the sections of the memory block 125 shown in FIG. 9 other than the memory cell array 131.

Column address decoder 132a for memory data, address buffer 132b, and I/O buffer 132c constitute the input/output port 132 for inputting and outputting memory data, as shown in FIG. 9. The column address decoder 132a includes an I/O gate (column switch) and a sense amplifier. The column address decoder 132a receives column addresses via the address buffer 132b.

The column address decoder 132a keeps the multiple bit lines BL and /BL connected with a predetermined number of the multiple memory cells 140 located in the column direction of memory cell array 131 in response to each of the column addresses supplied via address buffer 132b to enable memory data to be written to and read out of the predetermined memory cells in the column direction via the I/O buffer 132c and the column address decoder 132a.

The row address decoder 133 for memory data receives row addresses via the address buffer 133a. The row address decoder 133 activates the word lines WL connected with predetermined row-wise memory cells 140 of the memory cell array 131 in response to the row address supplied via the address buffer 133a to enable memory data to be written to and read out of the predetermined row-wise memory cells 140 via the I/O buffer 132c and the column address decoder 132a.

Column address decoder 134a for reference data, address buffer 134b, I/O buffer 134c, and ancillary operational cell 134d constitute the input port for inputting the reference data and ancillary operational cell 134 shown in FIG. 9. The column address decoder 134a includes an I/O gate (column switch), and a sense amplifier. The column address decoder 134a receives column addresses via the address buffer 134b.

The column address decoder 134a keeps multiple operation data output lines DAL and DBL and multiple reference data input lines RDL and /RDL connected with a predetermined number of multiple columnar memory cells 140 of the memory cell array 131 in response to each of the column addresses supplied via the address buffer 134b. This enables reference data to be received with the predetermined number of multiple columnar memory cells 140, and operation data to be supplied from the predetermined number of multiple columnar memory cells 140 to the ancillary operational cell 134d via the I/O buffer 134c and the column address decoder 134a.

Row address decoder 135 for reference data receives row addresses via the address buffer 135a. The row address decoder 135 supplies a cell selection signal to the cell selection lines WLF connected with predetermined row-wise memory cells 140 of the memory cell array 131 in response to each of the row addresses supplied via the address buffer 135a to activate the cell selection lines WLF. Thus, reference data may be inputted to the predetermined row-wise memory cells 140 via the I/O buffer 134c and the column address decoder 134a, and operation data may be supplied from the predetermined row-wise memory cells 140 to the ancillary operational cell 134d via the column address decoder 134a and the I/O buffer 134c.

Control circuit 136 controls operations of the respective circuits of the memory block 125 described above based on a control input. As will be described in detail later, an area of multiple memory cells 140 arranged in the matrix form in the memory cell array 131 has multiple divisional domains divided in a direction along the cell selection lines WLF and each of the multiple cell selection lines WLF consist of multiple divisional cell selection lines associated with the respective divisional domains. The memory cell array 131 comprises switching mechanisms for switching the divisional cell lines that are simultaneously activated in each of the divisional domains. The control circuit 136 also controls the switching mechanisms.

Figure 11:
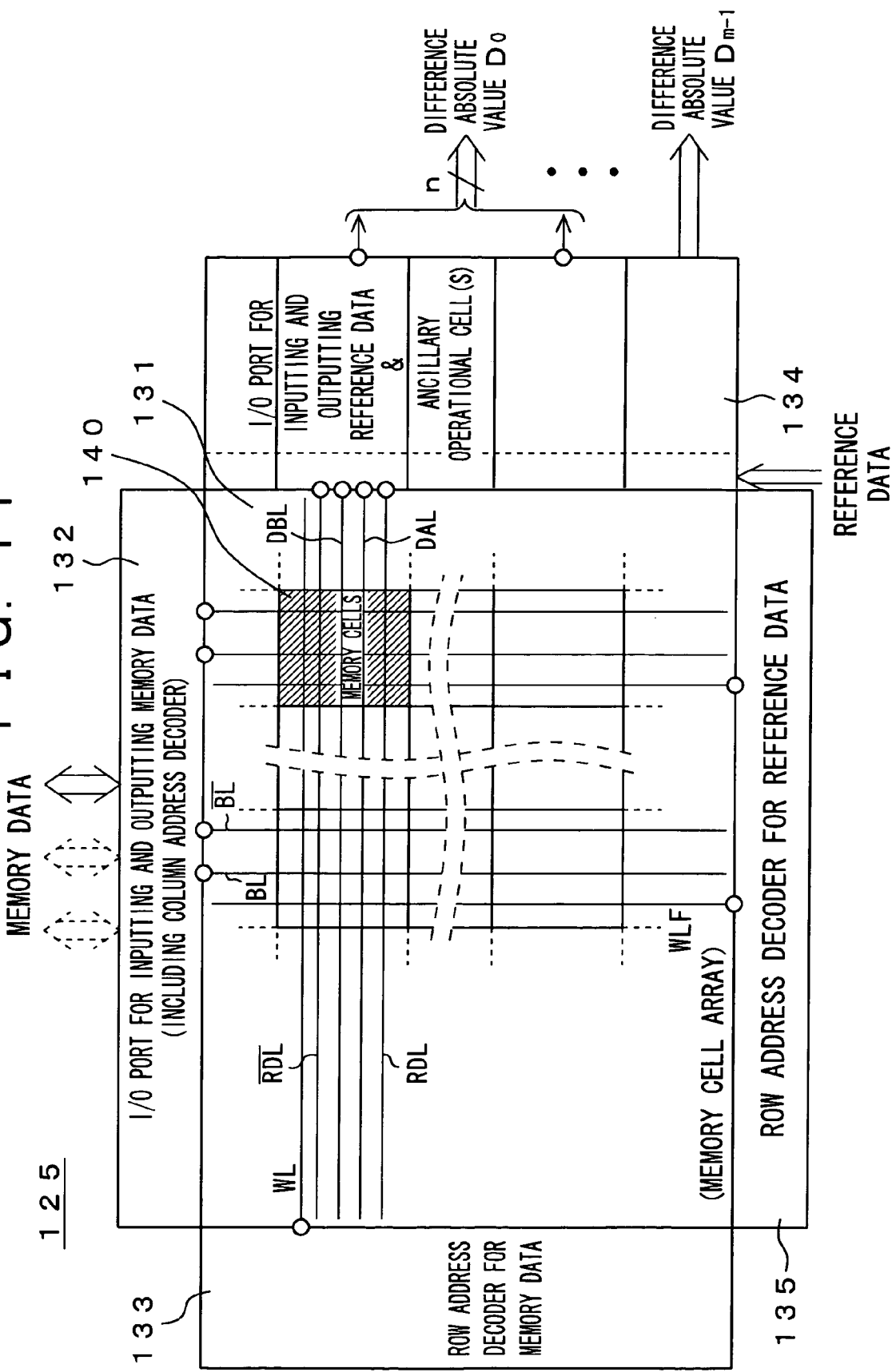
FIG. 11 is a diagram showing an arrangement of another memory block constituting the search frame memory.

FIG. 11 shows a configuration of another memory block 125 (125a-125d) of the invention. Like elements shown in FIGS. 11 and 9 are denoted by the same reference numerals. The configuration of the memory block 125 shown in this FIG. 11 differs from that of the memory block 125 shown in FIG. 9 in that reference data input lines RDL and /RDL, operation data output lines DAL and DBL, and cell selection lines WLF have different directions as compared to those of the memory block shown in FIG. 9.

The memory block 125 has memory cell array 131 having multiple memory cells arranged in the matrix form, input/output port 132 (including a column address decoder) for inputting and outputting memory data, row address decoder 133 for memory data, input port for inputting reference data and ancillary operational cell 134 (including a column address decoder), and row address decoder 135 for reference data.

The memory cell array 131 includes multiple bit lines BL and /BL for transferring data that extend in the row direction thereof, multiple word lines WL extending in the column direction and perpendicularly crossing the multiple bit lines BL and /BL, reference data input lines RDL and /RDL perpendicularly crossing the multiple bit lines BL and /BL to input reference data, lines DAL and DBL perpendicularly crossing the multiple bit lines BL and /BL to output operation data, cell selection lines WLF perpendicularly crossing the word lines WL to input a cell selection signal, and multiple memory cells 140 arranged in a matrix form and respectively connected to the bit lines BL and /BL, the word lines WL, the reference data input lines RDL and /RDL, the operation data output lines DAL and DBL, and the cell selection lines WLF.

Figure 12:
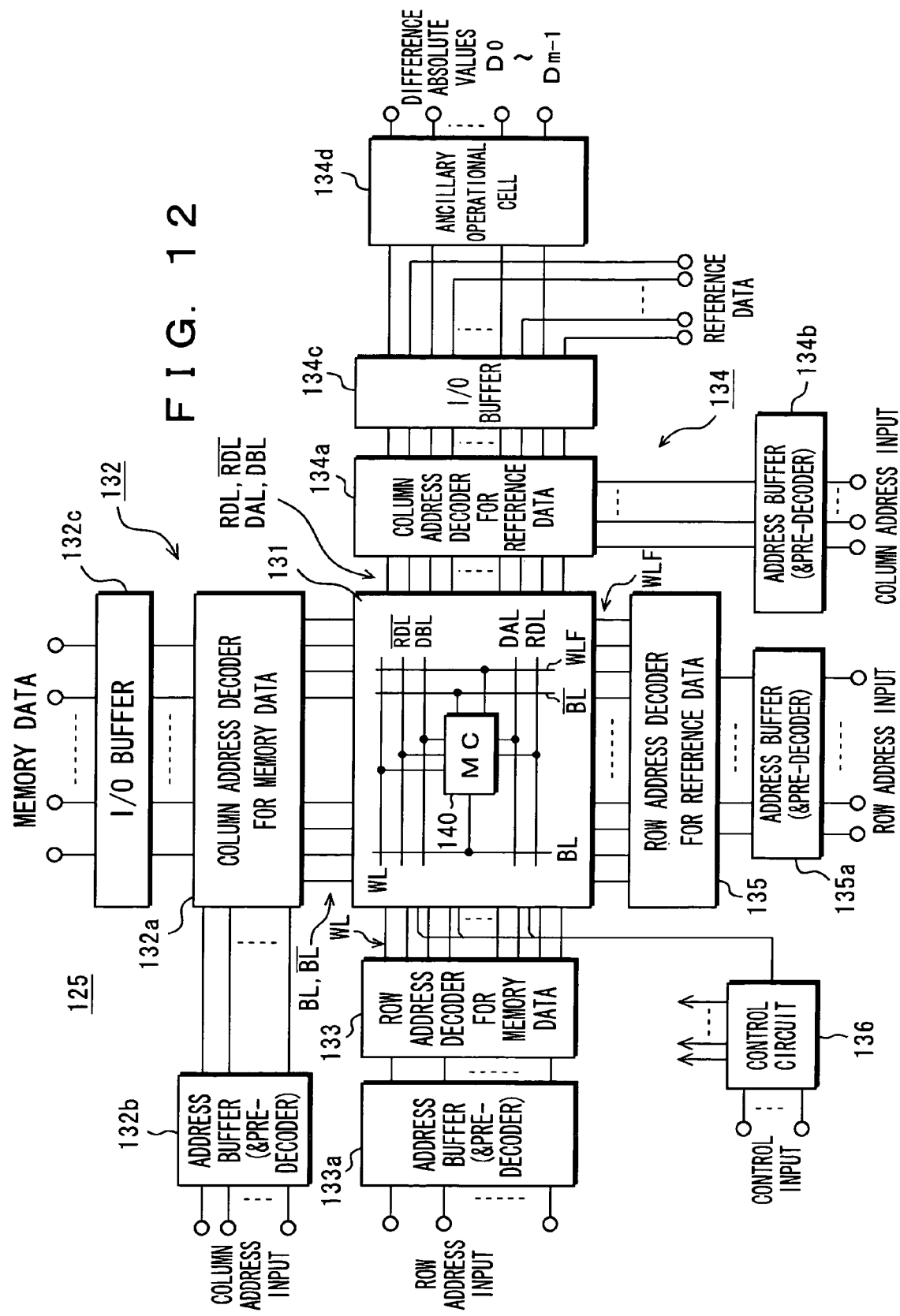
FIG. 12 is a diagram showing an arrangement of another memory block constituting the search frame memory.

FIG. 12 shows details of the sections of memory block 125 shown in FIG. 11 other than the memory cell array 131. Like elements of FIGS. 12 and 10 are denoted by the same reference numerals.

Column address decoder 132a for memory data, address buffer 132b, and I/O buffer 132c constitute input/output port 132 for inputting and outputting memory data shown in FIG. 11. The column address decoder 132a includes an I/O gate (column switch) and a sense amplifier. The column address decoder 132a receives column addresses via the address buffer 132b.

The column address decoder 132a keeps the multiple bit lines BL and /BL connected with a predetermined number of multiple columnar memory cells 140 of the memory cell array 131 in response to each of the column addresses supplied via the address buffer 132b to enable memory data to be written to and read out of the predetermined columnar memory cells via the I/O buffer132c and the column address decoder 132a.

Row address decoder 133 receives row addresses via the address buffer 133a. The row address decoder 133 activates word lines WL connected with predetermined row-wise memory cells 140 of the memory cell array 131 in response to each of the row addresses supplied via the address buffer 133a to enable memory data to be written to and read out of the predetermined row-wise memory cells 140 via the I/O buffer 132c and the column address decoder 132a.

Column address decoder 134a for reference data, address buffer 134b, I/O buffer 134c, and ancillary operational cell 134d constitute the input port for inputting reference data and ancillary operational cell 134 shown in FIG. 11. The column address decoder 134a includes an I/O gate (column switch) and a sense amplifier. The column address decoder 134a receives column addresses via the address buffer 134b.

The column address decoder 134a keeps multiple operation data output lines DAL and DBL and multiple reference data input lines RDL and /RDL connected with predetermined multiple row-wise memory cells 140 of the memory cell array 131 in response to each of the column addresses supplied via the address buffer 134b. This enables reference data to be received with the predetermined multiple row-wise memory cells 140, and operation data to be supplied from the predetermined multiple row-wise memory cells 140 to the ancillary operational cell 134d via the I/O buffer 134c and the column address decoder 134a.

The row address decoder 135 for reference data receives row addresses via address the buffer 135a. The row address decoder 135 supplies cell selection signal to the cell selection lines WLF connected to predetermined columnar memory cells 140 of the memory cell array 131 in response to each of the row addresses supplied via the address buffer 135a to activate the cell selection lines WLF. Thus, the reference data may be inputted to the predetermined columnar memory cells 140 via the I/O buffer 134c and the column address decoder 134a, and the operation data may be supplied from the predetermined row-wise memory cells 140 to the ancillary operational cell 134d via the column address decoder 134a and the I/O buffer 134c.

Further, control circuit 136 controls operations of the respective circuits of the memory block 125 described above based on a control input. As will be described in detail later, an area of multiple memory cells 140 arranged in a matrix form in the memory cell array 131 has multiple divisional domains divided in a direction along the cell selection lines WLF and each of the multiple cell selection lines WLF consist of multiple divisional cell selection lines associated with the respective multiple divisional domains. The memory cell array 131 comprises switching mechanism for switching the divisional cell lines that are simultaneously activated in the respective divisional domains. The control circuit 136 also controls the switching mechanism.

Next, the memory cell 140 will now be described.

First, a well-known SRAM (Static Random Access Memory) cell and a well-known DRAM (Dynamic Random Access Memory) cell will be described.

Figure 13:
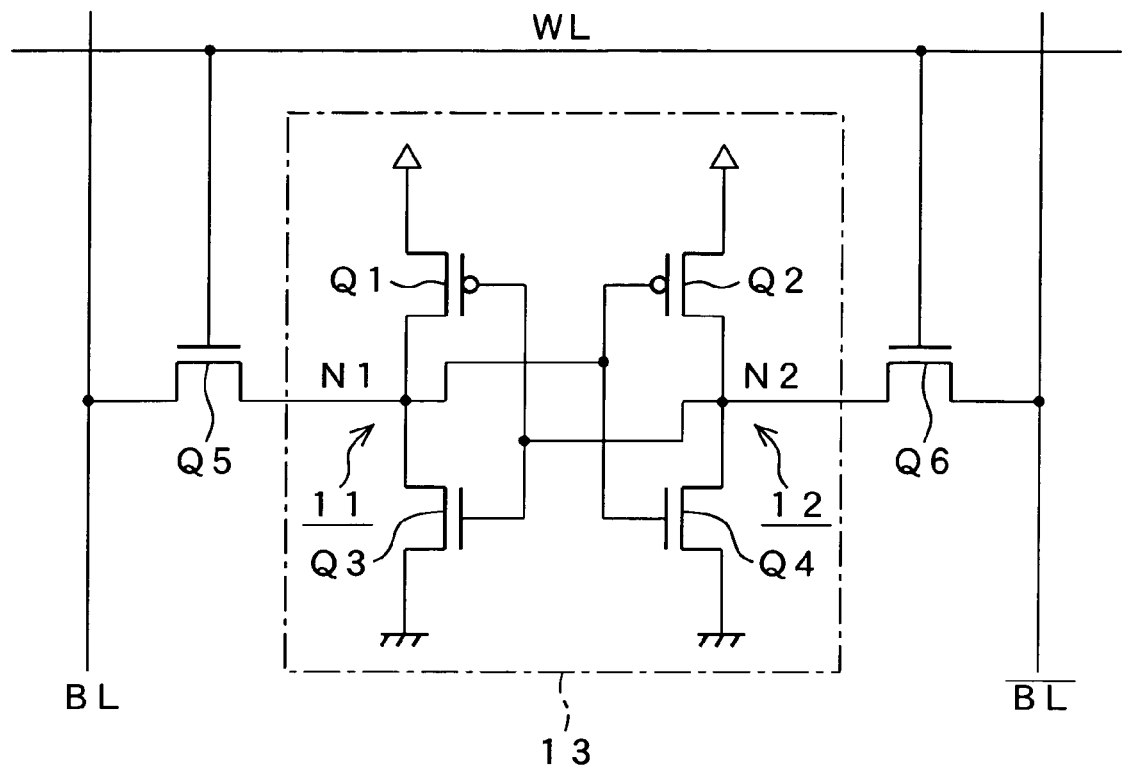
FIG. 13 is a diagram showing a configuration of a SRAM cell.

FIG. 13 shows a configuration of an exemplary SRAM cell. A p-type MOS transistor Q1 (representing a load) and an n-type MOS transistor Q3 are connected in series between a power supply and the ground, forming CMOS inverter 11, and a p-type MOS transistor Q2 (representing a load) and an n-type MOS transistor Q4 are connected in series between the power supply and the ground, forming CMOS inverter 12. The outputs of these CMOS inverters 11 and 12, i.e., potentials of the memory nodes N1 and N2, are respectively used as the inputs of CMOS inverters 12 and 11, i.e., the gate inputs of the n-type MOS transistors Q4 and Q3, respectively.

The memory node N1 of the CMOS inverter 11 is connected to the bit line BL via the access transistor Q5 having a gate thereof connected with the word line WL. On the other hand, the memory node N2 of CMOS inverter 12 is connected to the bit line /BL via the access transistor Q6 having a gate thereof connected to the word line WL.

In the SRAM cell having such the configuration shown herein, data of "1" or "0" is stored in memory cell unit 13 consisting of paired CMOS inverters 11 and 12.

Data transfers for read and write are performed between this memory cell unit 13 and the bit lines BL and /BL via the access transistors Q5 and Q6.

Figure 14:
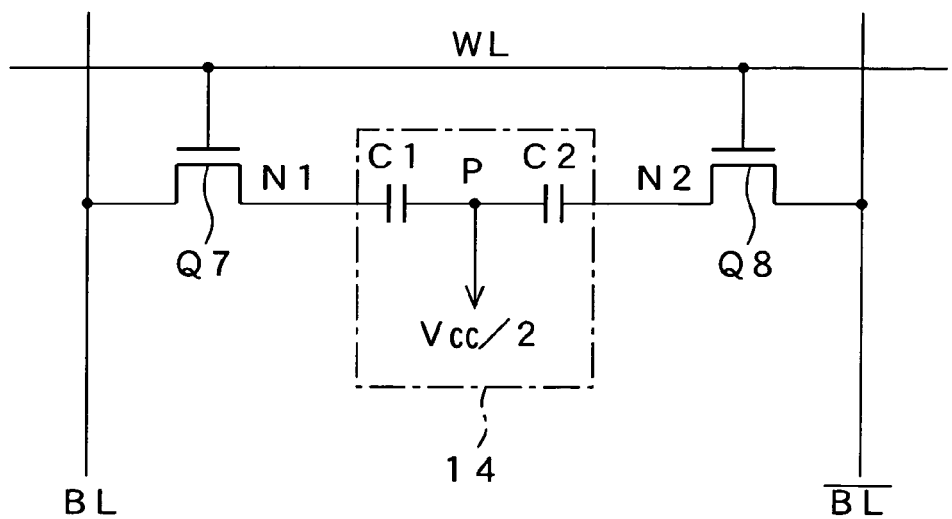
FIG. 14 is a diagram showing a configuration of a DRAM cell.

FIG. 14 shows a configuration of an exemplary DRAM cell. Capacitors C1 and C2 are connected in series, and a voltage Vcc/2 (Vcc being a power supply voltage) is supplied to the midpoint P of capacitors C1 and C2. One end of capacitor C1 opposite the point P is defined to be the memory node N1, which node is connected with a bit line BL via access transistor Q7 having its gate connected to the word line WL.

One end of capacitor C2 opposite the midpoint P is defined to be the memory node N2. The memory node N2 is connected with a bit line /BL via access transistor Q8 having its gate connected to the word line WL.

In the DRAM cell having such the configuration shown herein, data of "1" or "0" is stored in memory cell unit 14 consisting of paired capacitors C1 and C2. Data transfers for read and write are performed between this memory cell unit 14 and the bit lines BL and /BL via the access transistors Q7 and Q8.

Figure 15:
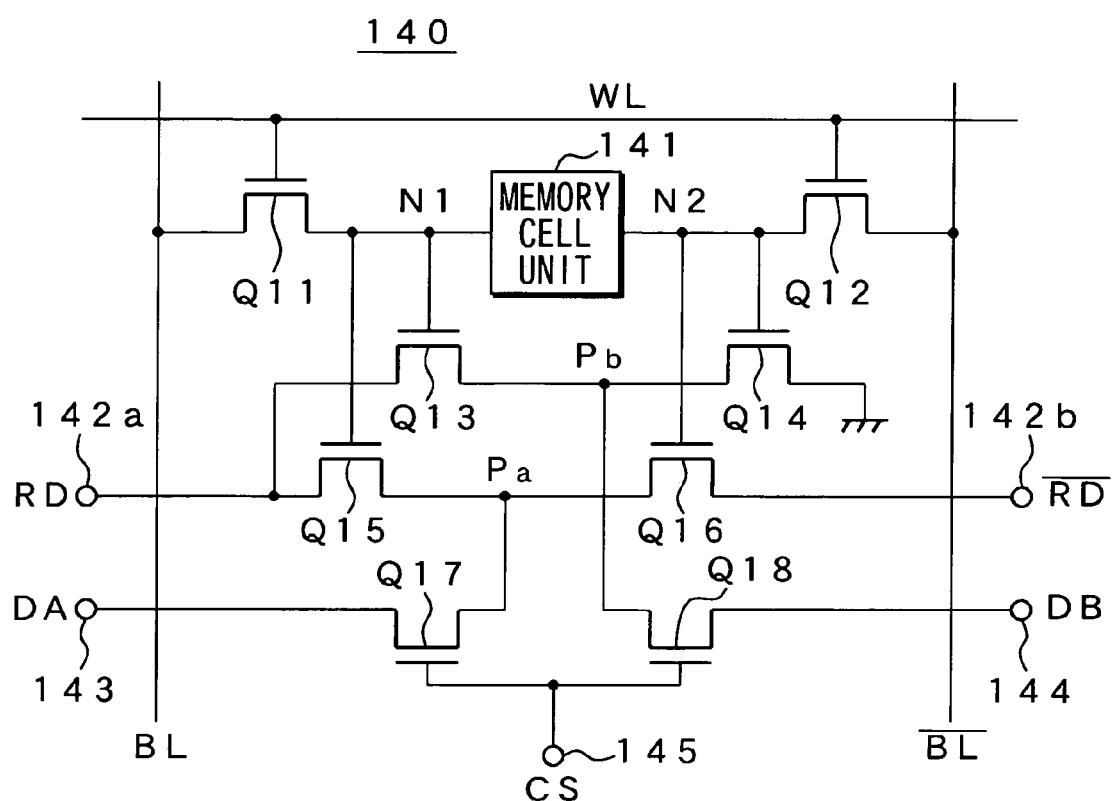
FIG. 15 is a diagram showing a configuration of a memory cell having an operation function unit.

FIG. 15 shows a configuration of the memory cell 140 in accordance with this embodiment of the invention.

The memory node N1 of the memory cell unit 141 is connected to a bit line BL via access transistor Q11 having its gate connected to the word line WL. On the other hand, the memory node N2 of memory cell unit 141 is connected to a bit line /BL via access transistor Q12 having its gate connected to the word line WL.

It should be understood that if memory cell 140 is DRAM-cell based one, its memory cell unit 141 is configured like memory cell unit 13 of the SRAM cell shown in FIG. 13, and if memory cell 140 is DRAM-cell based one, its memory cell unit 141 is configured like memory cell unit 14 of the DRAM cell shown in FIG. 14.

In this case, data of "1" or "0" is stored in the memory cell unit 141. Data transfers for read and write are performed between the memory cell unit 141 and the bit lines BL and /BL via the access transistors Q1 and Q12. That is, readout of memory data from the memory cell unit 141 and write of memory data to the memory cell unit 141 are carried out in the same manner as described in connection with the memory cell shown in FIGS. 13 and 14.

The drains of n-type MOS transistors Q13 and Q14 having their gates connected with the memory nodes N1 and N2 of the memory cell unit 141, respectively, are connected to each other. A source of MOS transistor Q13 is connected to input terminal 142a to which reference data RD is supplied, and a source of MOS transistor Q14 is grounded. The drains of n-type MOS transistors Q15 and Q16 having their gates connected with the memory nodes N1 and N2 of the memory cell unit 141, respectively, are connected to each other. A source of the MOS transistor Q15 is connected to the input terminal 142a, and a source of the MOS transistor Q16 is connected to input terminal 142b, to which reference data /RD (/RD represents RD overscored, representing inverted RD) is supplied.

The input terminal 142a is connected with the reference data input line RDL described above, through which the reference data RD is supplied. On the other hand, the input terminal 142b is connected to the reference data input line /RDL described above, through which the reference data /RD is supplied.

The MOS transistors Q13-Q18 constitute an operation function unit that carries out an exclusive OR (ExNOR) operation and logical product (AND) operation on the memory data stored in the memory cell unit 141 and the reference data RD. An output of the ExNOR operation is provided at a node Pa of the MOS transistors Q15 and Q16, and an output of the AND operation is provided at a node Pb of the MOS transistors Q13 and Q14.

A drain of n-type MOS transistor Q17 is connected to the node Pa of the MOS transistors Q15 and Q16, and a source of the MOS transistor Q17 is connected to output terminal 143 for outputting the operation data DA. A drain of n-type MOS transistor Q18 is connected to the node Pb of the MOS transistors Q13 and Q14, and a source of the MOS transistor Q18 is connected to output terminal 144 for outputting the operation data DB. Gates of the MOS transistors Q17 and Q18 are connected to input terminal 145, to which a cell selection signal CS is supplied.

The output terminal 143 is connected to the operation data output line DAL described above to which the operation data DA is supplied. On the other hand, the output terminal 144 is connected to the operation data output line DBL described above to which the operation data DB is supplied. The input terminal 145 is connected to the cell selection line WLF described above through which the cell selection signal CS is supplied.

It is noted that the MOS transistors Q17 and Q18 constitute a transfer gate as an output control unit, and become conductive when the cell selection signal CS of "1" is supplied to the input terminal 145. In this case, the output of ExNOR operation provided at the node Pa is delivered to the output terminal 143 through the MOS transistor Q17 as operation data DA. Similarly, the output of the AND operation provided at the node Pb is delivered to the output terminal 144 through the MOS transistor Q18 as operation data DB.

Thus, the operations on the memory data stored in the memory cell unit 141 and the reference data RD and outputs of the operation data DA and DB can be performed independently of read and write of the memory data, that is, without affecting the memory data.

Figure 16:
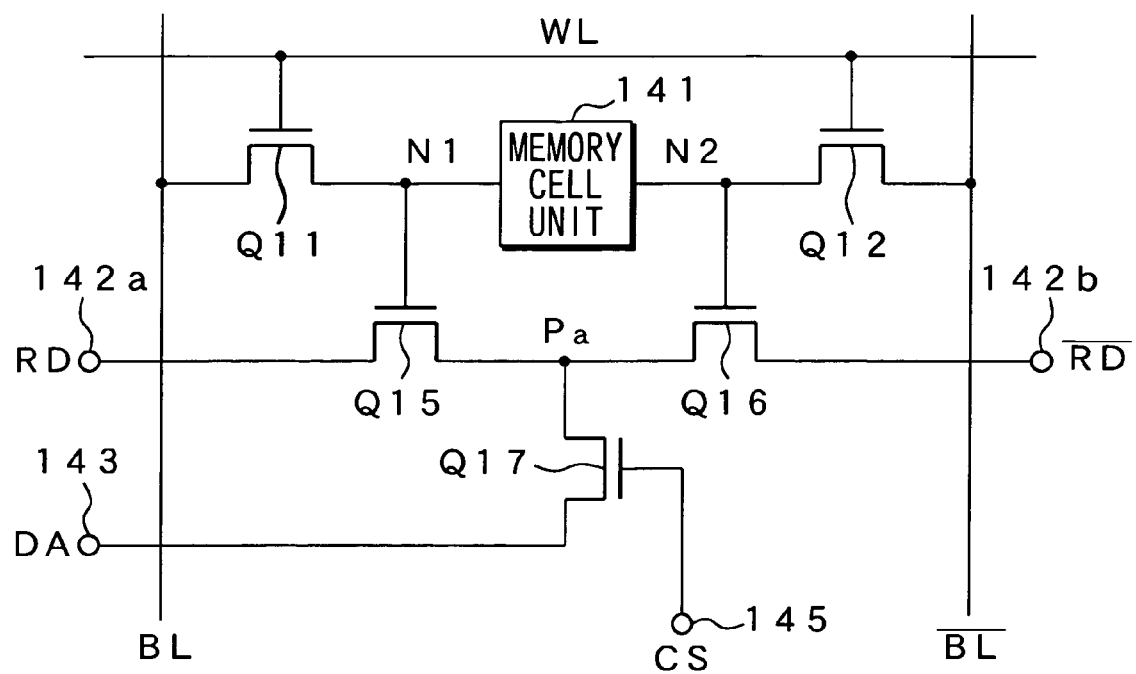
FIG. 16 is a diagram showing a configuration of another memory cell having an operation function unit.
Figure 17:
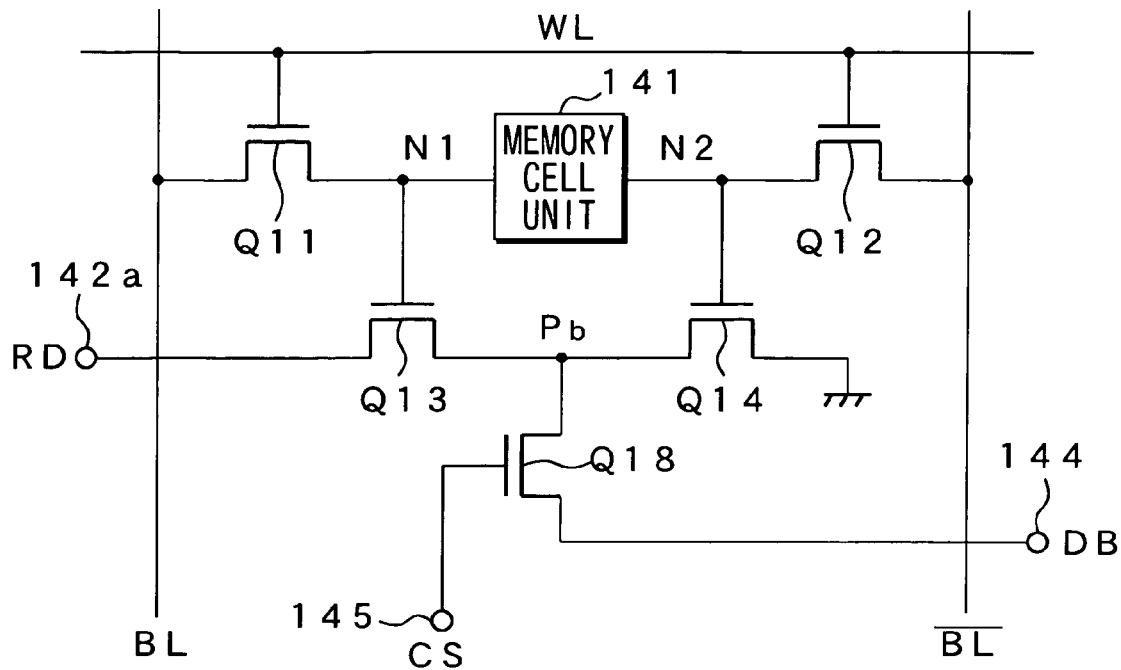
FIG. 17 is a diagram showing a configuration of still another memory cell having an operation function unit.
Figure 18:
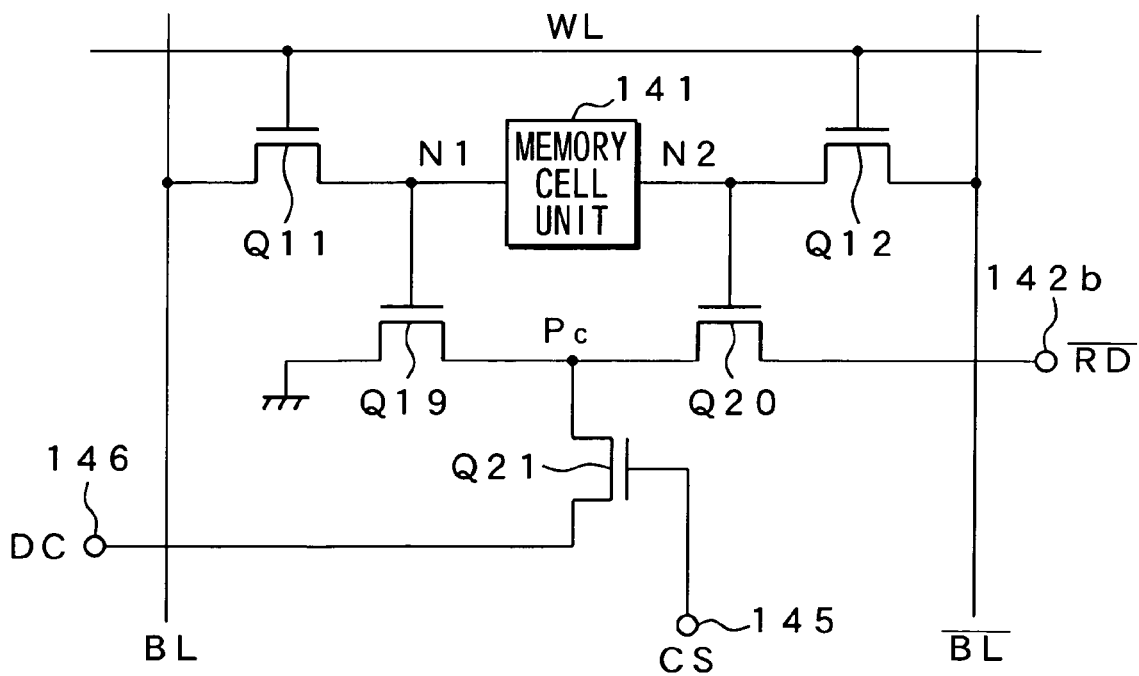
FIG. 18 is a diagram showing a configuration of further memory cell having an operation function unit.

Although the memory cell shown in FIG. 15 has been described as the memory cell 140 constituting the memory cell block 125, any other memory cell having similar operation function unit can be used alternatively for the same purpose. FIGS. 16-18 show other alternative memory cells. In these FIGS. 16-18, elements that correspond to like elements of FIG. 15 are denoted by the same reference numerals.

The memory cell shown in FIG. 16 has an operation function unit for performing ExNOR operation and an output control unit. The memory cell shown in FIG. 17 has an operation function unit for performing AND operation and an output control unit.

The memory cell shown in FIG. 18 has an operation function unit for performing NOR operation and an output control unit.

Drains of n-type MOS transistors Q19 and Q20 having their gates connected to the respective memory nodes N1 and N2 of the memory cell unit 141 are connected to each other. A source of the MOS transistor Q19 is grounded. A source of the MOS transistor Q20 is connected to input terminal 142b, to which the reference data /RD is supplied. The MOS transistors Q19 and Q20 constitute an operation function unit to obtain inverted logical sum (NOR) of the memory data stored in the memory cell unit 141 and the reference data RD. The result of the NOR operation is provided at the node Pc of the MOS transistors Q19 and Q20.

A drain of n-type MOS transistor Q21 is connected to the node Pc of the MOS transistors Q19 and Q20, and a source of MOS transistor Q21 is connected to output terminal 146 for outputting the operation data DC. A gate of the MOS transistor Q21 is connected to input terminal 145 to which the cell selection signal CS is supplied. The MOS transistor Q21 constitutes a transfer gate serving as an output control unit and becomes conductive when the cell selection signal CS of "1" is supplied to the input terminal 145. In that event, NOR operation output obtained at the node Pc is outputted as the operation data DC to the output terminal 146 through the MOS transistor Q21.

Next, ancillary operational cell 134d constituting the above-described memory block 125 will be explained.

Figure 19:
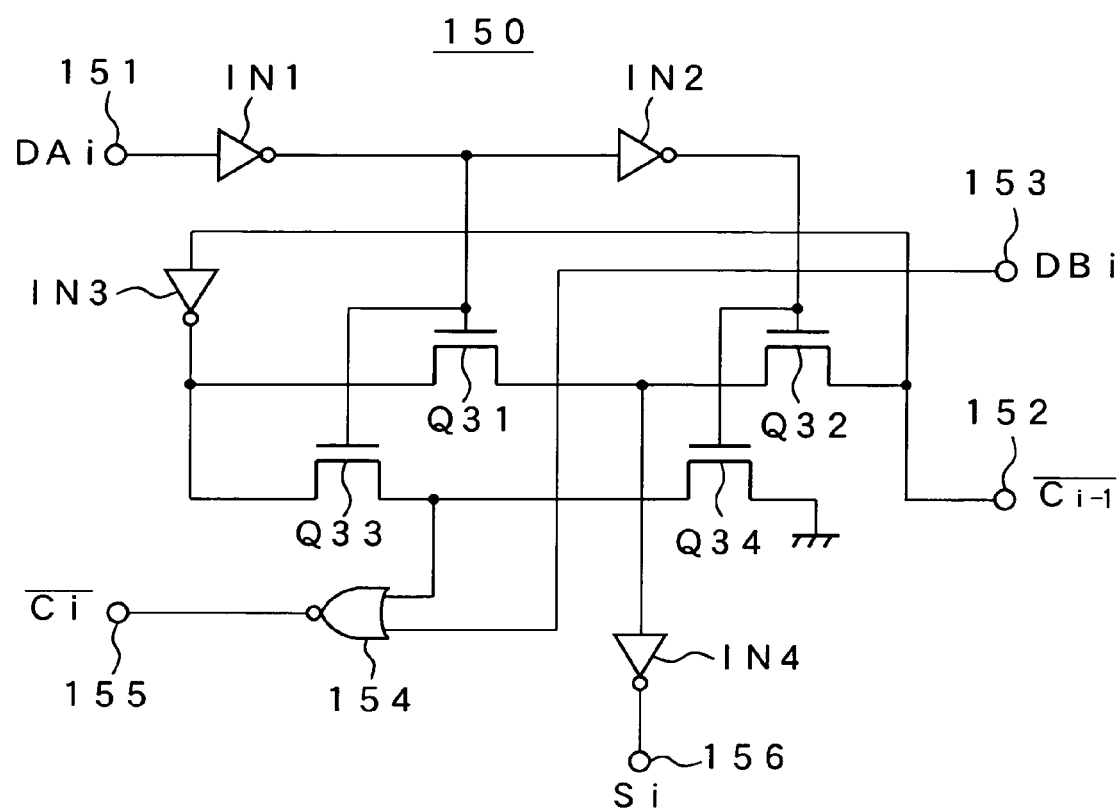
FIG. 19 is a diagram showing a configuration of an ancillary operational cell for performing addition and subtraction.
Figure 20:
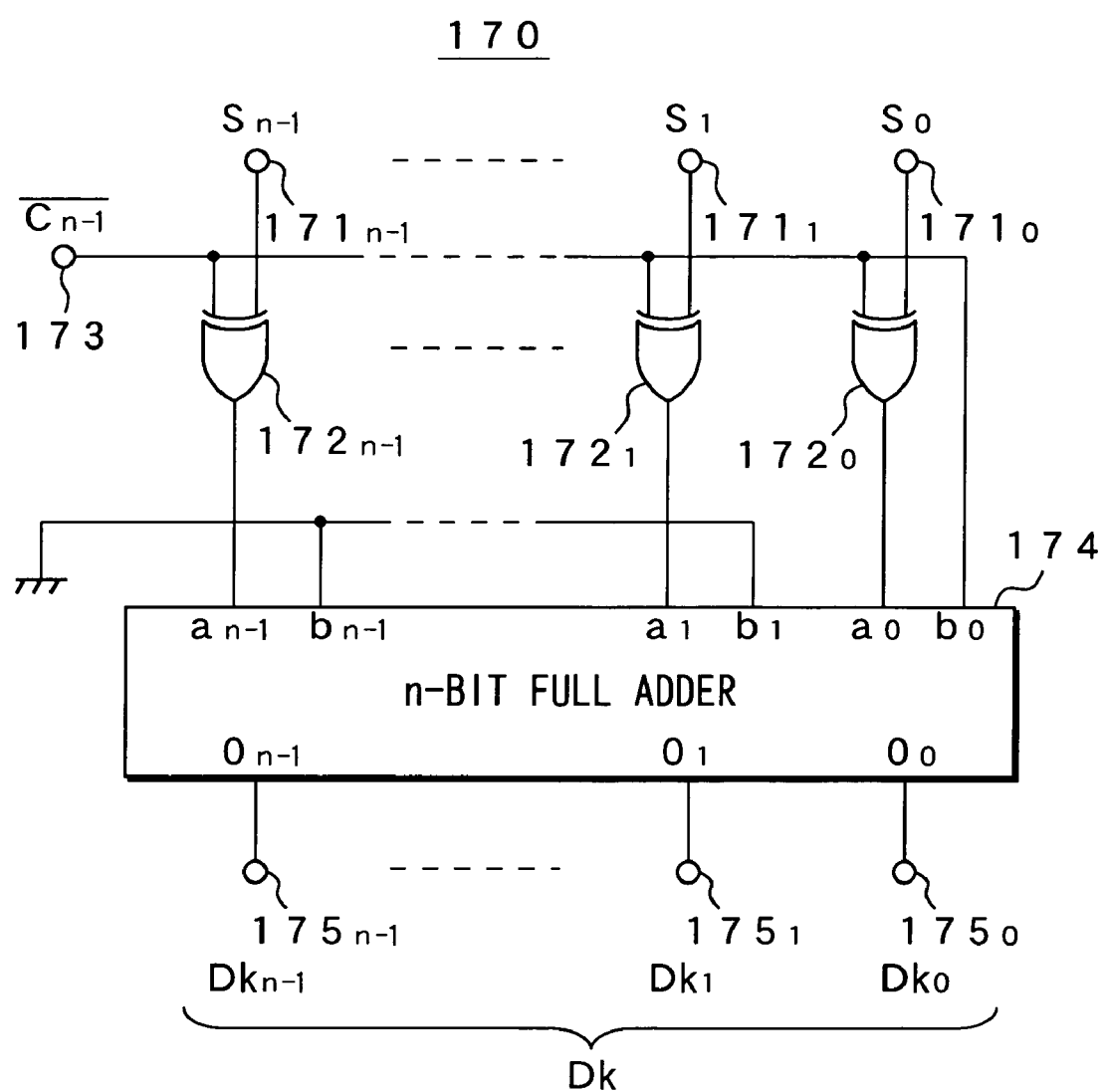
FIG. 20 is a diagram showing a configuration of an ancillary operational cell for calculating a difference absolute value.

In the embodiment shown herein, the ancillary operational cell 134d utilizes multiple ancillary operational cells 150 shown in FIG. 19 for performing addition and subtraction, and multiple ancillary operational cells 170 as shown in FIG. 20 for calculating the difference absolute value.

Of the multiple memory cells 140 arranged in a matrix form in the memory cell array 131, m×n memory cells 140 that store multiple items of pixel data constituting a candidate block every bit are simultaneously selected according to the row addresses inputted to the address buffer 135a and column addresses inputted to the address buffer 134b (see FIGS. 10 and 12), where m and n respectively represent the number of the pixel data that constitutes the candidate block and the number of bits of pixel data. The operation data DA and DB outputted to the output terminal 143 and 144 of each of the m×n memory cells 140 is simultaneously supplied to the ancillary operational cell 134d via m×n pairs of operation data output lines DAL and DBL.

Ancillary operational cell 150 will now be described. In the ancillary operational cell 134d, m×n ancillary operational cells 150 are provided in correspondence to m×n memory cells 140 described above. FIG. 19 shows ancillary operational cell 150 associated with i-th bit data of a particular pixel data of a candidate block, where $i = 0, 1, \ldots, n-1$.

The 0-th bit data is the LSB (Least Significant Bit), and the (n−1)-th bit data is the MSB (Most Significant Bit).

0 As seen in FIG. 19, drains of n-type MOS transistors Q31 and Q32 are connected to each other. Drains of the n-type MOS transistors Q33 and Q34 are also connected to each other. A source of the MOS transistor Q34 is grounded. Input terminal 151, to which the operation data DA (output ExNOR) from the corresponding memory cell 140 is supplied as operation data DAi, is connected to the respective gates of the MOS transistors Q32 and Q34 via inverters IN1 and IN2 in series. The node of the inverters IN1 and IN2 is connected to the gates of the MOS transistors Q31 and Q33.

The input terminal 152, to which the carry output /Ci−1 (/Ci−1 denotes Ci−1 overscored, representing inverted carry output Ci−1) from lower-order thereof is supplied, is connected to a source of the MOS transistor Q32 and to the respective sources of the MOS transistors Q31 and Q33 via the inverter IN3.

The input terminal 153, to which the operation data DB (output AND) from the corresponding memory cell 140 is supplied as operation data DBi, is connected to the input end of NOR gate 154. A node of the MOS transistors Q33 and Q34 is connected to the input end of NOR gate 154. The output end of this NOR gate 154 is connected to the output terminal 155 from which a carry output /Ci (/Ci denoting Ci overscored, and representing inverted carry output Ci) is outputted to higher-order thereof. The node of MOS transistors Q31 and Q32 is connected to the output terminal 156 from which operation data Si is outputted via inverter IN4.

It is noted here that n ancillary operational cells 150 corresponding to given pixel data (n bits) of the candidate block obtain subtraction value output given by subtracting the pixel data of the associated reference block from the pixel data of the candidate block. That is, denoting by Xi and Yi (i=0, 1, . . . , n−1) the given pixel data of the candidate block and the pixel data of the corresponding reference block, respectively, the operation output Si and the carry output Ci are obtained according to the following formulas (1) and (2), respectively, by supplying /Yi (/Yi expressing Yi overscored, representing inverted data Yi) as reference data RD of the memory cell 140 described above, and by setting $C_{-1}=1$:

$$Si = Xi \oplus \overline{Yi} \oplus Ci-1 \qquad (1)$$

$$Ci = Xi \cdot \overline{Yi} + (Xi \oplus \overline{Yi}) \cdot Ci-1 \qquad (2)$$

where the respective symbols of operations, "⊕" denotes exclusive OR operation, "·" denotes AND operation, and "+" denotes OR operation.

This subtraction value output is obtained in offset binary format in which carry output Cn−1 has either a positive or a negative sign.

Although the subtraction value output is used in the embodiment described above, the operation output Si and the carry output Ci may be obtained as an addition value output according to the following formulas (3) and (4) by supplying Yi as reference data RD of the memory cell 140 and by setting $C_{-1}=0$:

$$Si = Xi \oplus Yi \oplus Ci-1 \qquad (3)$$

$$Ci = Xi \cdot Yi + (Xi \oplus Yi) \cdot Ci-1 \qquad (4)$$

where the respective symbols of operations, "⊕" denotes exclusive OR operation, "·" denotes AND operation, and "+" denotes OR operation.

Next, ancillary operational cell 170 will be described.

In the ancillary operational cell 134d of the memory block 125, the ancillary operational cell 170 is provided for each of n ancillary operational cells 150 to obtain the subtraction value output given by subtracting the pixel data of a reference block from the pixel data of the corresponding candidate block, as described above. That is, m ancillary operational cells 170 having the same number as that of the pixel data constituting a candidate block are provided in the ancillary operational cell 134d. FIG. 20 shows a k-th ancillary operational cell (k=0, 1, . . . , and m−1) 170 of m ancillary operational cells 170.

As seen in FIG. 20, input terminals $171_0$, $171_1$, . . . , and $171_{n-1}$, to which the respective operation outputs Si (i=0, 1, . . . , n−1) of n ancillary operational cells 150 are supplied, are connected to the respective input ends of exclusive OR (ExOR) gates $172_0$, $172_1$, . . . , and $172_{n-1}$.

Input terminal 173 to which the carry output /Cn−1 of the (n−1)-th ancillary operational cell 150 is supplied is connected in common with the ExOR gates $172_0$, $172_1$, . . . , and $172_{n-1}$. The output ends of these ExOR gates $172_0$, $172_1$, . . . , and $172_{n-1}$ are connected to respective input terminals $a_0$, $a_1$, . . . , and $a_{n-1}$ of n-bit full adder 174.

Input terminal b0 of the n-bit full adder 174 is connected to the above input terminal 173, and input terminals $b_1$, . . . , and $b_{n-1}$ of the n-bit full adder 174 are grounded. Output terminals $o_0$, $o_1$, . . . , and $o_{n-1}$ of the n-bit full adder 174 are respectively connected with output terminals $175_0$, $175_1$, . . . , and $175_{n-1}$ for outputting difference absolute values Dk ($Dk_0$-$Dk_1$).

In the ancillary operational cell 170 shown in FIG. 20, when Cn−1 equals 1 and the operation outputs Si (i=0 1, . . . , and n−1) indicate positive values, difference absolute values Dk (i=0, 1, . . . , and n−1) turn out to be Si (i=0, 1, . . . , n−1), respectively. On the other hand, when Cn−1 equals 0 and the operation outputs Si (i=0, 1, . . . , and n−1) indicate negative values, all the bits of the operation output Si (i=0, 1, . . . , and n−1) are inverted by the ExOR gates $172_0$, $172_1$, . . . , and $172_{n-1}$. Subsequently, 1 is added to the LSB by the n-bit full adder 174 to calculate the absolute values of the operation outputs Si (i=0, 1, . . . , and n−1), which result in the difference absolute values Dk (i=0, 1, . . . , and n−1).

Figure 21:
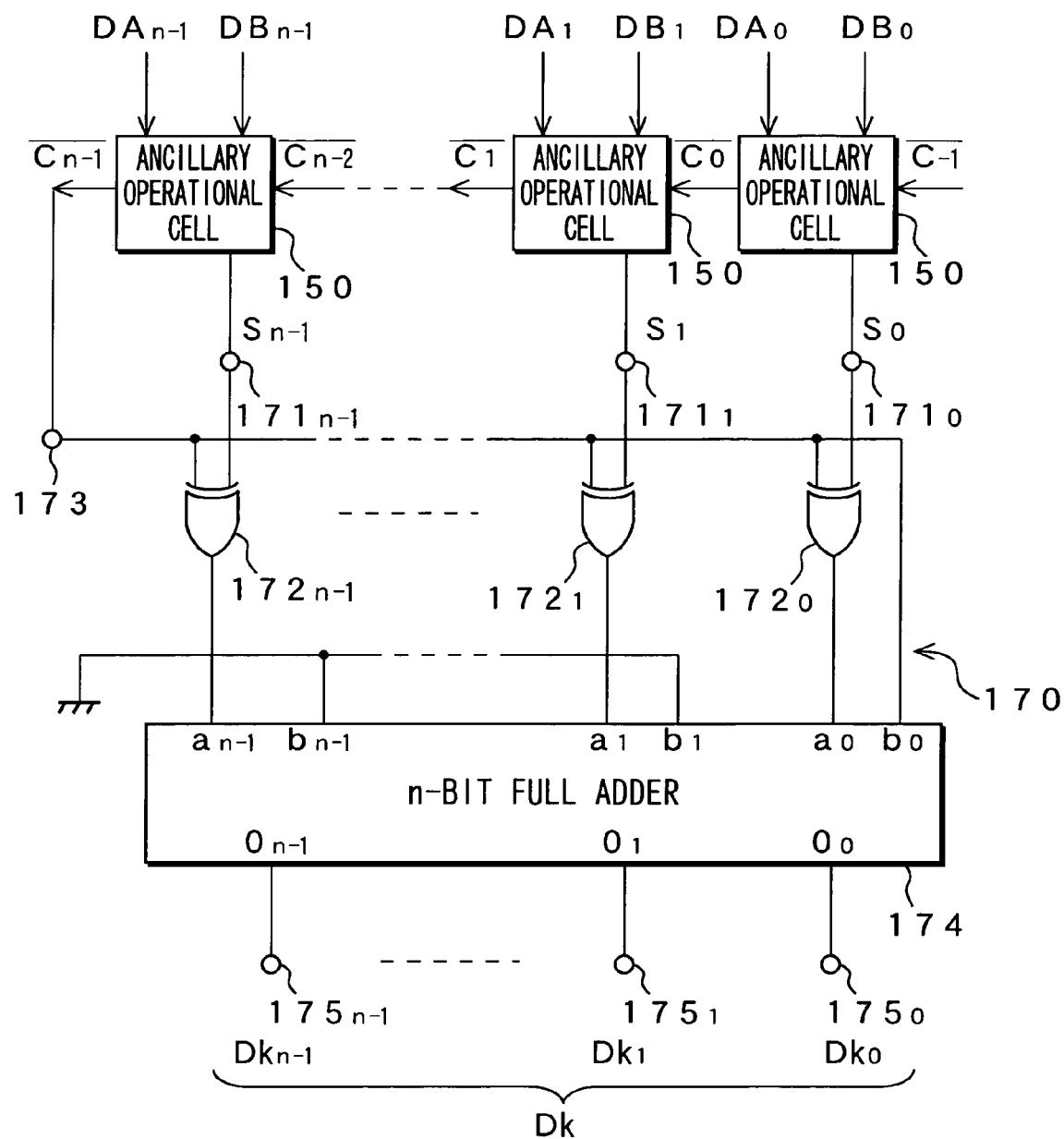
FIG. 21 is a diagram showing a configuration of an ancillary operational cell (for one pixel data) for calculating the difference absolute value.

FIG. 21 shows a part of the ancillary operational cell 134d for obtaining difference absolute values Dk (i=0, 1, . . . , n−1) associated with the k-th pixel data constituting a candidate block, the cell including n ancillary operational cells 150 and one ancillary operational cell 170. In the ancillary operational cell 134d, there are m systems as shown in FIG. 21 having the same number as that of the pixel data constituting a candidate block.

As described above, in the ancillary operational cell 134d, subtractions and difference absolute operations can be simultaneously and parallel calculated for m pixel data by simultaneously selecting, from multiple memory cells 140 arranged in the matrix form, m×n memory cells 140 that stores for each bit m pixel data constituting a candidate block, in response to each of the row addresses supplied to the address buffer 135a and each of the column addresses supplied to the address buffer 134b.

In what follows, an arrangement that enables simultaneously selection of m×n memory cells 140 storing for each bit m pixel data constituting a candidate block, will be described.

Figures 22A, 22B:
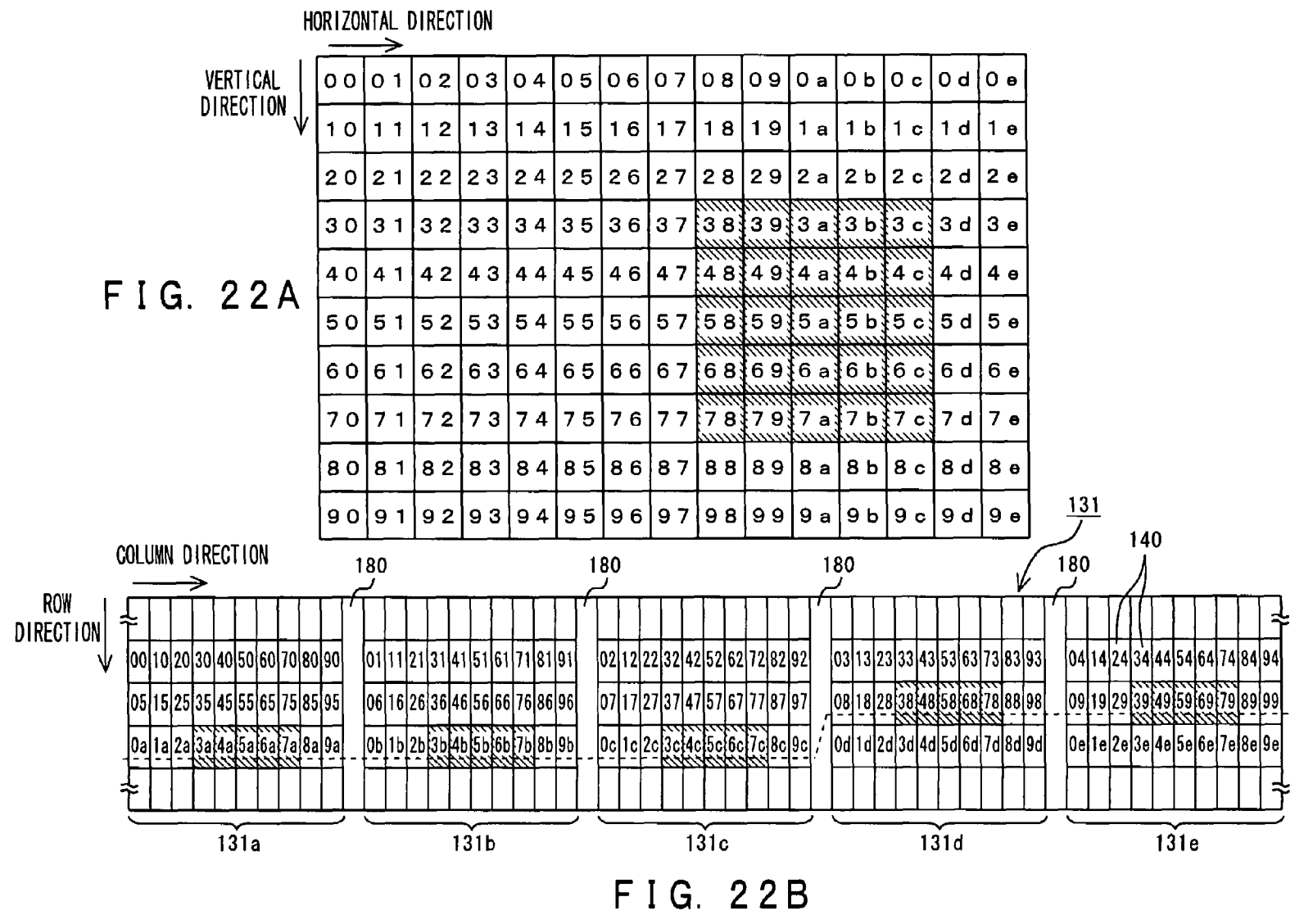

FIG. 22A schematically illustrates pixel data stored in one memory block 125 that constitutes a search frame memory 124. For simplicity, one memory block 125 is assumed to store the pixel data consisting of 15 pixels in the horizontal direction and 10 rows in vertical direction, with each pixel data being one-bit data.

FIG. 22B shows respective memory locations of the pixel data in the memory cell array 131. In the example shown herein, each of the square meshes represents memory cell 140. Memory cell array 131 has fifty memory cells 140 lined in the column direction of the reference data (with the column direction being the same as the column direction of the memory data in memory block 125 of FIG. 10, and the same as the row-wise direction of the memory data in the memory block 125 of FIG. 12). It is noted that the multiple memory cells 140 in the memory cell array 131 are divided into 5 divisional domains 131a-131e along the column direction.

In the example shown herein, 10 memory cells of the first, second, and third rows that are continuous in the divisional domain 131a, respectively store pixel data of one vertical column, "00"-"90", "05"-"95", and "0a"-"9a". Similarly, 10 memory cells of the first, second, and third rows that are continuous in the divisional domain 131b, respectively store pixel data of one vertical column, "01"-"91", "06"-"96", and "0b"-"9b". Further, 10 memory cells of the first, second, and third rows that are continuous in the divisional domain 131c, respectively store pixel data of one vertical column, "02"-"92", "07"-"97", and "0c-9c".

In the same manner, 10 memory cells of the first, second, and third rows that are continuous in the divisional domain 131d, respectively store pixel data of one vertical column, "03"-"93", "08"-"98", and "0d"-"9d". Additionally, 10 memory cells of the first, second, and third rows that are continuous in the divisional domain 131e, respectively store pixel data of one vertical column, "04"-"94", "09"-"99", and "0e"-"9e".

Multiple cell selection lines WLF (see FIGS. 9 and 11) described above consist of five divisional cell selection lines WLFa-WLFe (not shown in FIG. 22B) divided corresponding to the divisional domains 131a-131e, respectively. The memory cell array 131 is provided with multiple switching mechanisms for switching the divisional cell selection lines that can be simultaneously activated within the respective divisional domains 131a-131e. For example, as shown in FIG. 22B, the multiple switching mechanisms 180 are provided between each pair of two adjacent divisional domains 131a-131e.

Figure 23:
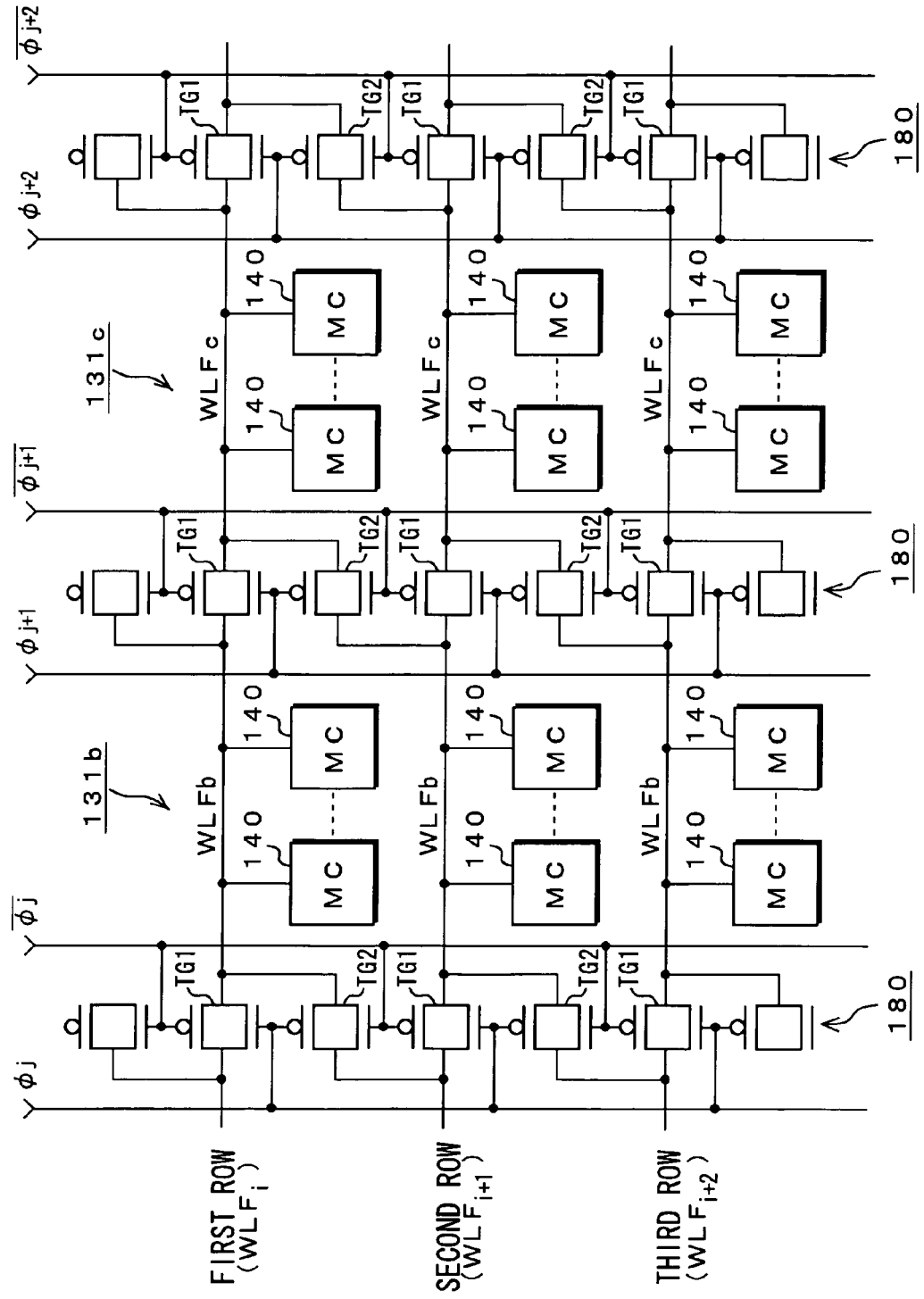
FIG. 23 is a diagram showing an arrangement of switching mechanisms for switching divisional cell selection lines.

FIG. 23 shows another arrangement of exemplary switching mechanisms 180. Each of the switching mechanisms 180 comprises CMOS transfer gates consisting of an n-type MOS transistor connected in parallel with a p-type MOS transistor.

This switching mechanism 180 has transfer gates TG1 positioned between two adjacent divisional cell selection lines belonging to the same row to connect them, and transfer gate TG2 positioned between two divisional cell selection lines belonging to neighboring rows to connect them.

A switching control signal $\phi$ is supplied to the gates of the n-type MOS transistors of the transfer gates TG1 and the gates of the p-type MOS transistors of the transfer gates TG2. A switching control signal/ $\phi$ (/ $\phi$ denotes $\phi$ overscored, implying inverted switching control signal $\phi$) is supplied to the gates of the p-type MOS transistors of the transfer gates TG1 and the gates of the n-type MOS transistor of the transfer gates TG2. These switching mechanisms 180 arranged between two neighboring divisional domains 131a-131e are independently supplied with the control signals $\phi$ and /$\phi$.

Operations of the switching mechanisms 180 will now be described. When $\phi=1$ and /$\phi=0$, the transfer gates TG1 become conductive to connect the divisional cell selection lines of the same row. On the other hand, when $\phi=0$ and /$\phi=1$, the transfer gates TG2 become conductive to connect the divisional cell selection lines of adjacent rows.

Since such the switching mechanisms 180 are provided between any of two neighboring divisional domains 131a-131e of memory cell array 131 as described above, multiple memory cells 140 storing for each bit all the pixel data constituting an arbitrary candidate block can be simultaneously selected.

For example, regarding the candidate block hatched in FIG. 22A, a cell selection signal of "1" maybe supplied from the row address decoder 135 for reference data (see FIGS. 10 and 12) to the divisional cell selection lines WLFa-WLFe of the respective divisional domains 131a-131e connected in FIG. 22B indicated by a broken line to activate the divisional cell selection lines, using switching mechanisms 180, thereby selecting memory cells 140 hatched in FIG. 22B by the I/O gates (column switches) of the column address decoder 134a (see FIGS. 10 and 22) for reference data.

Figures 24A, 24B:
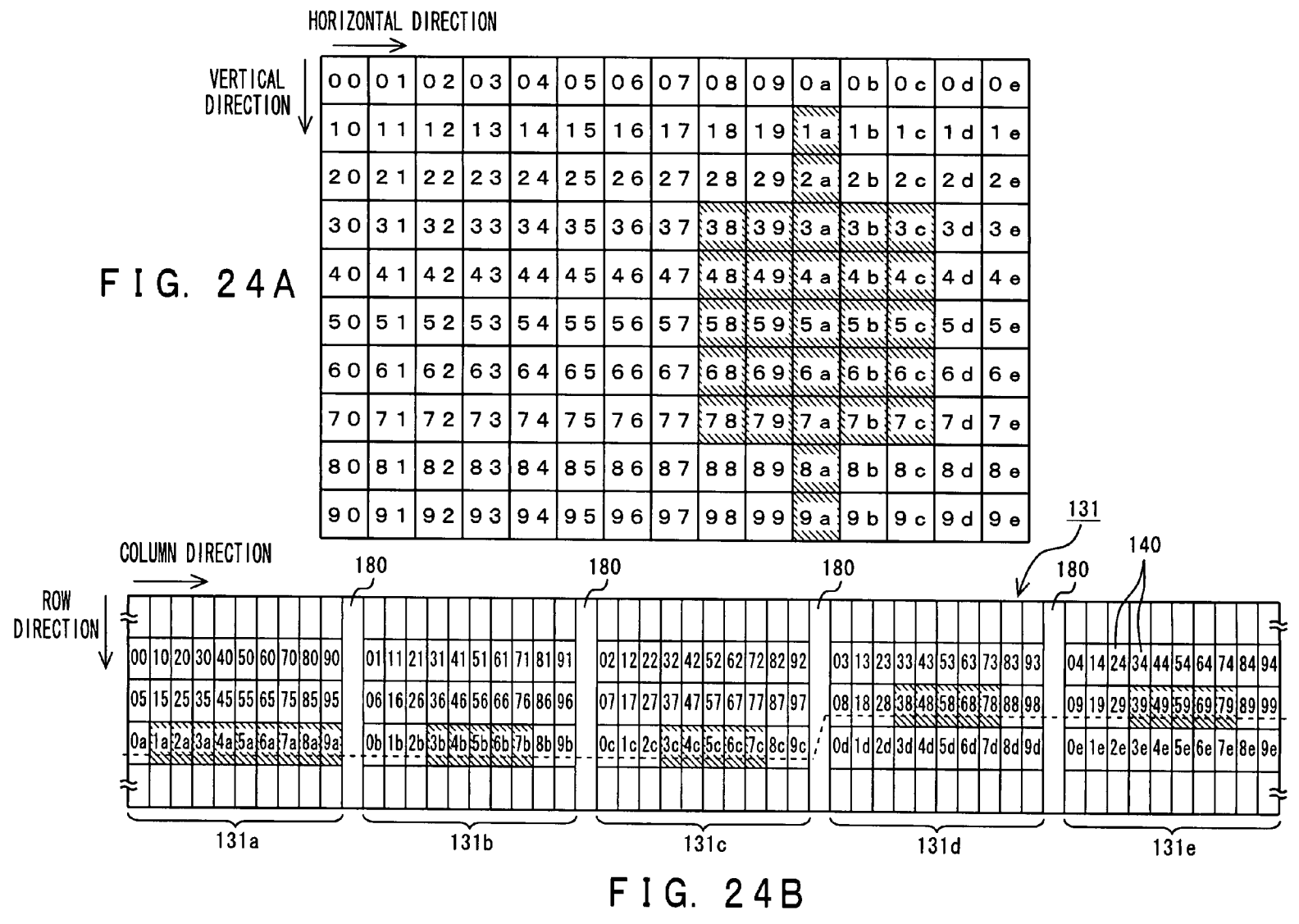

As another example, regarding the candidate block hatched in FIG. 24A, a cell selection signal of "1" may be supplied from the row address decoder 135 for reference data to the divisional cell selection lines WLFa-WLFe of the respective divisional domains 131a-131e connected in FIG. 24B indicated by a broken line to activate the divisional cell selection lines, using the switching mechanisms 180, and by selecting the memory cells 140 hatched in FIG. 24B by the I/O gates (column switches) of the column address decoder 134a for reference data.

In this way, any candidate block having an arbitrary shape such as a rectangle or a cross can be dealt with by appropriately selecting the memory cells 140 by the I/O gates (column switches). It is noted that the candidate block can be moved in units of one pixel in the horizontal and/or vertical direction(s) by means of the switching mechanisms 180 in cooperation with the I/O gates (column switches) since pixel data of one vertical column constituting the image data is stored in multiple memory cells 140 associated with one divisional cell selection line.

It should be understood that although each pixel data is assumed to have one bit for simplicity in the description above, when each pixel data is n-bit data (for example 8-bit data), it is necessary to provide n memory cells 140 in order to store all the pixel data, thereby arranging these memory cells 140 continuously in the column direction, for example.

It has been also described in the examples shown in FIGS. 22B and 24B above that the multiple memory cells 140 associated with the respective divisional cell selection lines WLFa-WLFe store pixel data of one vertical column. However, the multiple memory cells 140 associated with the respective divisional cell selection lines WLFa-WLFe may store pixel data of one horizontal row.

Multiple memory cells 140 associated with the respective divisional cell selection lines WLFa-WLFe may also store pixel data of m rows by m columns (with m being an integer larger than 1) constituting image data. In this case, a position of the candidate block can move in the vertical direction in units of m pixels when the pixel data of m horizontal rows is stored, while it can move in the horizontal direction in units of m pixels when the pixel data of m vertical columns is stored.

Figures 25A, 25B:
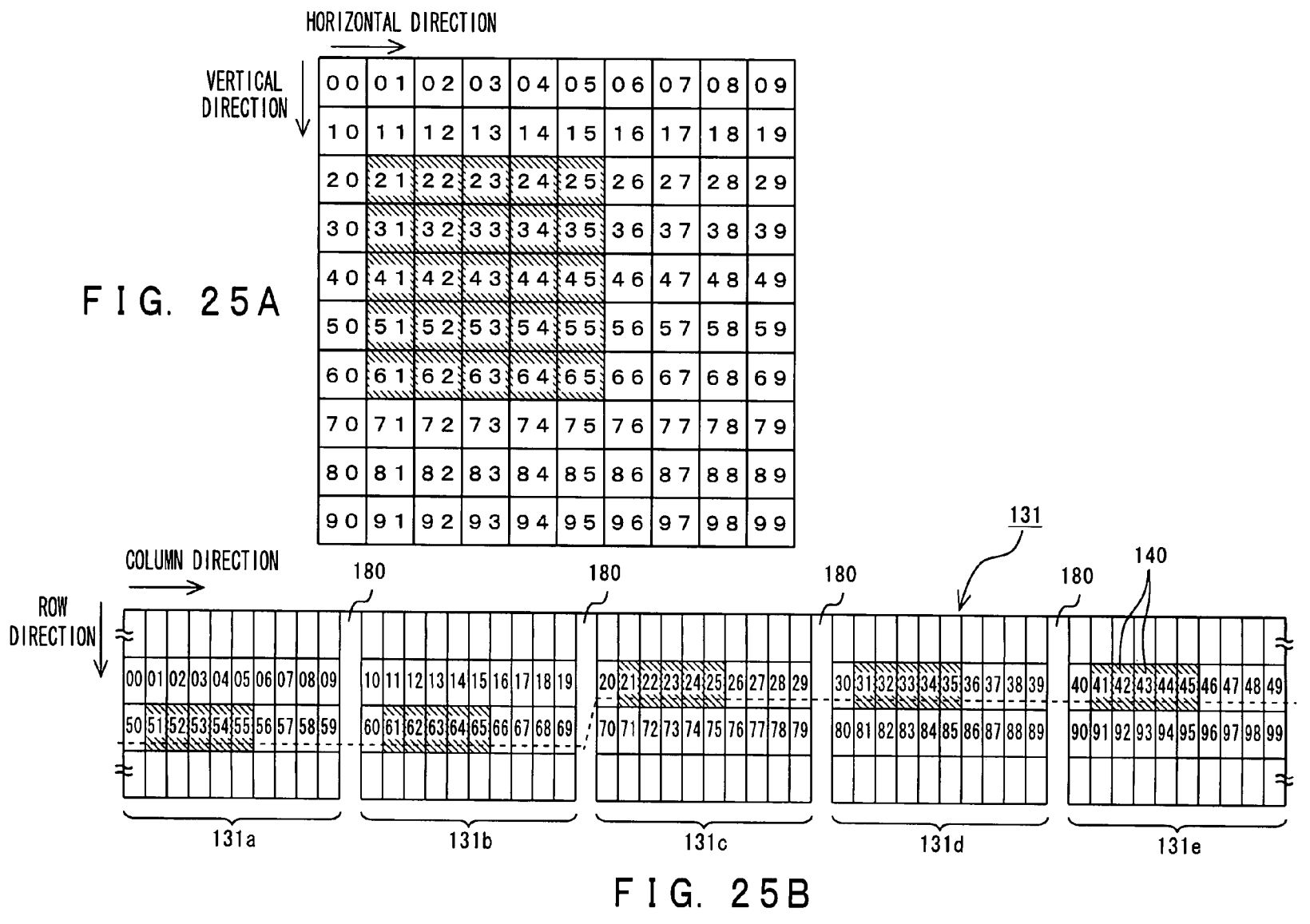

FIG. 25A schematically illustrates pixel data stored in one memory block 125 that constitutes a search frame memory 124. For simplicity, one memory block 125 is assumed to store the pixel data consisting of 10 pixels in the horizontal direction and 10 rows in the vertical direction, with each pixel data being one-bit data.

FIG. 25B shows respective memory locations of the pixel data in the memory cell array 131. In the example shown here, each of the square meshes correspond to the respective memory cells 140. Memory cell array 131 has fifty memory cells 140 lined in the column direction of the reference data (with the column direction being the same as the column direction of the memory data in memory block 125 of FIG. 10, and the same as the row-wise direction of the memory data in the memory block 125 of FIG. 12). It is noted that the multiple memory cells 140 in the memory cell array 131 are divided into 5 divisional domains 131a-131e along the column direction.

In the example shown herein, 10 memory cells of the first and second rows that are continuous in the divisional domain 131a, respectively store pixel data of one horizontal row, "00"-"09" and "05"-"59". Similarly, 10 memory cells of the first and second rows that are continuous in the divisional domain 131b, respectively store pixel data of one horizontal row, "10"-"19" and "60"-"69". Further, 10 memory cells of the first and second rows that are continuous in the divisional domain 131c, respectively store pixel data of one horizontal row, "20"-"29" and "70"-"79".

In the same manner, 10 memory cells of the first and second rows that are continuous in the divisional domain 131d, respectively store pixel data of one horizontal row, "30"-"39" and "80"-"89". Additionally, 10 memory cells of the first and second rows that are continuous in the divisional domain 131e, respectively store pixel data of one horizontal row, "40"-"49" and "90"-"99".

Multiple cell selection lines WLF (see FIGS. 9 and 11) described above consist of five divisional cell selection lines WLFa-WLFe (not shown in FIG. 22B) divided corresponding to the divisional domains 131a-131e, respectively. The memory cell array 131 is provided with multiple switching mechanisms (see FIG. 23) for switching the divisional cell selection lines that can be simultaneously activated within the respective divisional domains 131a-131e.

Since such the switching mechanisms 180 are provided between any of two neighboring divisional domains 131a-131e of memory cell array 131 if multiple memory cells 140 corresponding to the respective divisional cell selection lines WLFa-WLFe store the pixel data of one horizontal row, the multiple memory cells 140 storing for each bit all the pixel data constituting an arbitrary candidate block can be simultaneously selected.

For example, regarding the candidate block hatched in FIG. 25A, a cell selection signal of "1" maybe supplied from the row address decoder 135 for reference data (see FIGS. 10 and 12) to the divisional cell selection lines WLFa-WLFe of the respective divisional domains 131a-131e connected in FIG. 25B indicated by a broken line to activate the divisional cell selection lines, using switching mechanisms 180, and by selecting memory cells 140 hatched in FIG. 25B by the I/O gates (column switches) of the column address decoder 134a (see FIGS. 10 and 22) for reference data.

As another example, regarding the candidate block hatched in FIG. 26A, a cell selection signal of "1" may be supplied from the row address decoder 135 for reference data to the divisional cell selection lines WLFa-WLFe of the respective divisional domains 131a-131e connected in FIG. 26B indicated by a broken line to activate the divisional cell selection lines, using the switching mechanisms 180, and by selecting the memory cells 140 hatched in FIG. 26B by the I/O gates (column switches) of the column address decoder 134a for reference data.

It has been shown in the example shown above that switching mechanisms 180 (FIG. 23) are provided between pairs of neighboring divisional domains 131a-131e of the memory cell array 131 in order to switch the divisional cell selection lines that are simultaneously activated in the associated divisional domains 131a-131e of memory cell array 131. However, switching mechanisms may have other configurations.

FIG. 27 shows a configuration of another switching mechanism. Switching mechanisms 180A are provided in association with the respective divisional domains 131a-131e. FIG. 27 shows only the divisional domains 131b and 131c.

These switching mechanisms 180A require global selection lines /GWL (/GWL denoting GWL overscored for inputting a cell selection signal "0") for inputting a cell selection signal that are positioned in parallel to each of the cell selection lines WLF (consisting of the divisional cell selection lines WLFa-WLFe).

Each of the switching mechanisms 180A comprises a NOR gate and an OR gate. Specifically, each switching mechanism in any odd row in the row direction has a NOR gate having its input end connected to a global selection line /GWL, and its output end connected to an associated divisional cell selection line, while each switching mechanism in any even row in the row direction has an OR gate OG having its input end connected to a global selection line GWL and its output end connected to an associated divisional cell selection line. NOR gates NG and OR gates OG are supplied at their input ends with switching control signal /φ (/φ denoting φ overscored, denoting inverted switching control signal φ). The switching mechanisms 180A provided in association with the respective divisional domains 131 a-131 e are independently supplied with control signals /φ.

Selection operations of cell selection lines in the respective divisional domains 131a-131e using the switching mechanisms 180A will now be described.

In the example shown in FIG. 27, suppose that the divisional cell selection line WLFb of the second row is selected in the divisional domain 131b, and the divisional cell selection line WLFc of the first row is selected in the divisional domain 131c.

In this instance, cell selection signals "0" are supplied to global selection lines /GWLi and /GWLi+1, respectively, of the first and second rows. Switching control signal /φj of "1" is supplied to the switching mechanism 180A of the divisional domain 131b. This causes the OR gate OG of the second row to output "1" at its output end, activating the divisional cell selection line WLFb of the second row.

On the other hand, a switching control signal /φj of "0" is supplied to the switching mechanism 180A of the divisional domain 131c. This causes the NOR gate NG of the first row to output "1" at its output end, activating the divisional cell selection line WLFc of the first row.

Thus, when the respective divisional domains 131a-131e of the memory cell array 131 are provided with the switching mechanisms 180A as described above, divisional cell selection lines can be simultaneously activated in the respective divisional domains 131a-131e in the same manner as in the preceding example utilizing the switching mechanisms 180 between the adjacent divisional domains 131a-131e, permitting simultaneous selection of the multiple memory cells 140 storing for each bit the entire pixel data constituting an arbitrary candidate block.

According to this arrangement using the switching mechanisms 180A, because no transfer gate is provided in a cell selection signal transmission line, this avoids transmission delay of the cell selection signal as encountered in the multiple transfer gates TG1 and TG2 provided in the transmission line of the switching mechanism 180.

Figure 28:
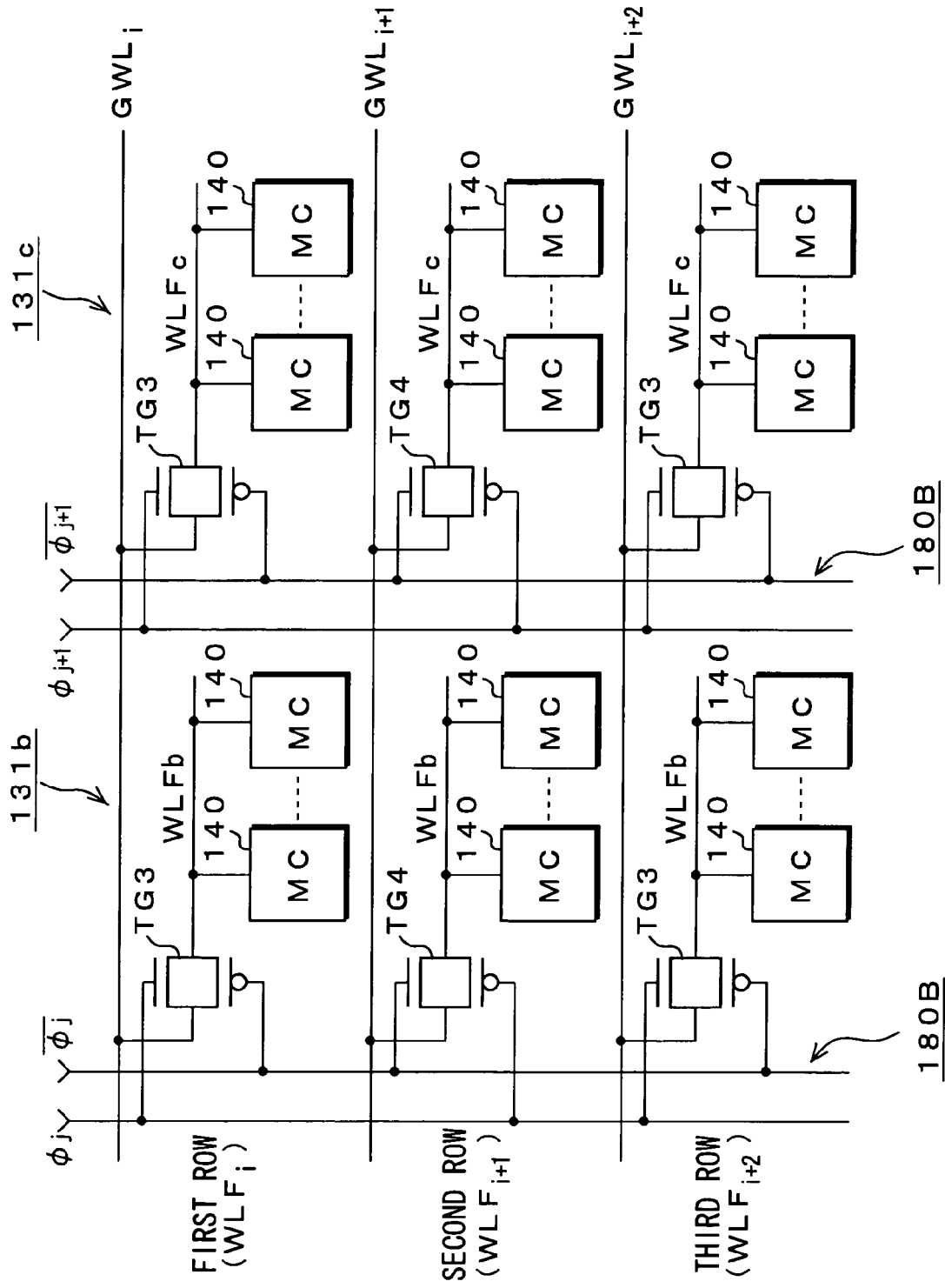
FIG. 28 is a diagram showing still another arrangement of the switching mechanisms for switching divisional cell selection lines.

FIG. 28 shows a configuration of still another switching mechanism. The switching mechanisms 180B are also provided in association with the divisional domains 131a-131e. FIG. 28 shows only the divisional domains 131b and 131c.

These switching mechanisms 180B require global selection lines GWL (GWL supplied with a cell selection signal "1") for inputting a cell selection signal that are positioned in parallel to each of the cell selection lines WLF (consisting of the divisional cell selection lines WLFa-WLFe).

Switching mechanism 180B utilizes a CMOS transfer gate. Specifically, each switching mechanism in any odd row in the row direction is provided with a transfer gate TG3 for connecting a global selection line GWL and each of the divisional cell selection lines WLFa-WLFe, while each switching mechanism in any even row in the row direction is provided with transfer gate TG4 for connecting the global selection line GWL and each of the divisional cell selection lines WLFa-WLFe.

Gates of n-type MOS transistor of the transfer gate TG3 and p-type MOS transistor of the transfer gate TG4 are supplied with a switching control signal φ, and gates of p-type MOS transistor of the transfer gate TG3 and n-type MOS transistor of the transfer gate TG4 are supplied with a switching control signal /φ (/φ denoting φ overscored, implying an inverted switching control signal φ). The switching mechanisms 180B provided in association with the respective divisional domains 131a-131e are independently supplied with the control signals φ and /φ.

Selection operations of the cell selection lines in the respective divisional domains 131a-131e using the switching mechanisms 180B will now be described.

In the example shown in FIG. 28, suppose that the divisional cell selection line WLFb of the second row is selected in the divisional domain 131b, and the divisional cell selection line WLFc of the first row is selected in the divisional domain 131c.

In this instance, cell selection signals "1" are supplied to global selection lines GWLi and GWLi+1, respectively, of the first and second rows. Switching control signals φ, /φj of "0", "1" are respectively supplied to the switching mechanism 180A of the divisional domain 131b. This causes the transfer gate TG4 of the second row to be conductive to supply a cell selection signal of "1" from the global selection line GWLi+1 to the divisional cell selection line WLFc, activating the divisional cell selection line WLFb of the second row.

On the other hand, switching control signals φ, /φj of "1", "0" are supplied to the switching mechanism 180B of the divisional domain 131c. This causes the transfer gate TG3 of the first row to be conductive to supply a cell selection signal of "1" from the global selection line GWLi to the divisional cell selection line WLFc, activating the divisional cell selection line WLFc of the first row.

Thus, when the respective divisional domains 131a-131e of the memory cell array 131 are provided with the switching mechanisms 180B as described above, divisional cell selection lines can be simultaneously activated in the respective divisional domains 131a-131e in the same manner as in the preceding example utilizing the switching mechanisms 180 between the adjacent divisional domains 131a-131e, permitting simultaneous selection of the multiple memory cells 140 storing for each bit the entire pixel data constituting an arbitrary candidate block.

According to this arrangement using the switching mechanism 180B, because only one transfer gate is provided in a cell selection signal transmission line, this makes transmission delay of the cell selection signal reduced as compare with the one encountered in the multiple transfer gates TG1 and TG2 provided in the transmission line of the switching mechanism 180.

Next, frame memory 123 (see FIG. 6) for accumulating image data of the reference frame will be described.

Figure 29:
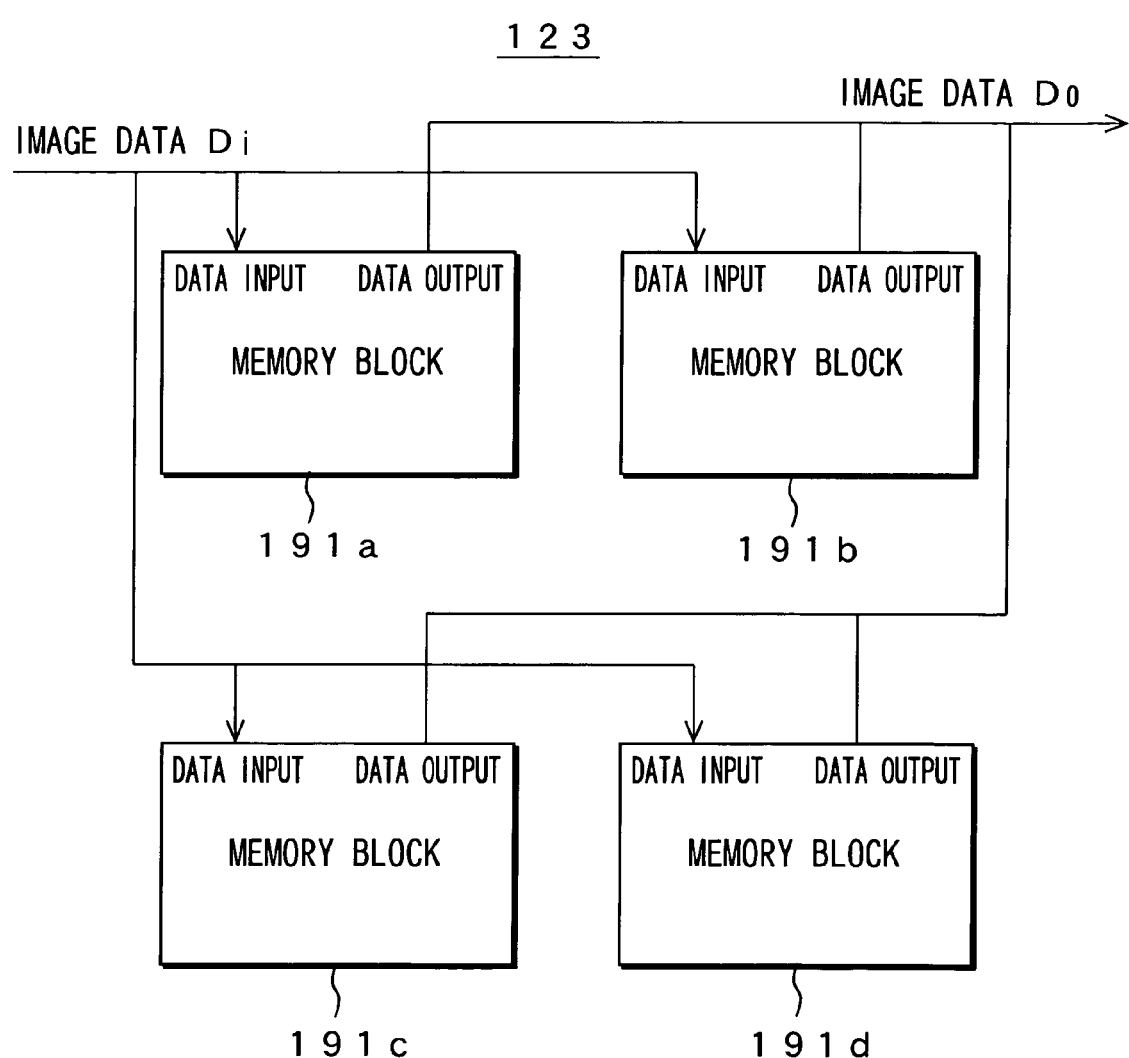
FIG. 29 is a diagram showing a configuration of a frame memory (a reference frame memory) for accumulating the image data of the reference frame.

As shown in FIG. 29, the frame memory 123 also comprises four memory blocks 191a-191d like the frame memory 124 described previously. Each of the memory blocks 191a-191d comprises a data input unit and a data output unit. Image data Di is inputted to the data input unit and image data Do is outputted from the data output unit. The memory blocks 191a, 191b, 191c, and 191d store pixel data of the upper left, upper right, lower left, and lower right sections of the reference frame, respectively.

When a range of the central pixel of a predetermined reference block is in any one of the upper left, upper right, lower left, and lower right sections of the reference frame, it suffices to activate only the corresponding memory blocks 191a, 191b, 191c, and 191d, thereby suppressing power consumption.

In this case, items of pixel data are stored in duplication in the corresponding memory blocks 191a-191d corresponding to the boundaries of the upper left, upper right, lower left, and lower right boundary sections of the reference frame as in the foregoing example of memory block 125a-125d of the frame memory 124. The reason for storing the pixel data in duplication in the memory blocks 191a-191d is because a reference block having its central pixel located near a boundary requires pixel data beyond the boundary.

Figure 30:
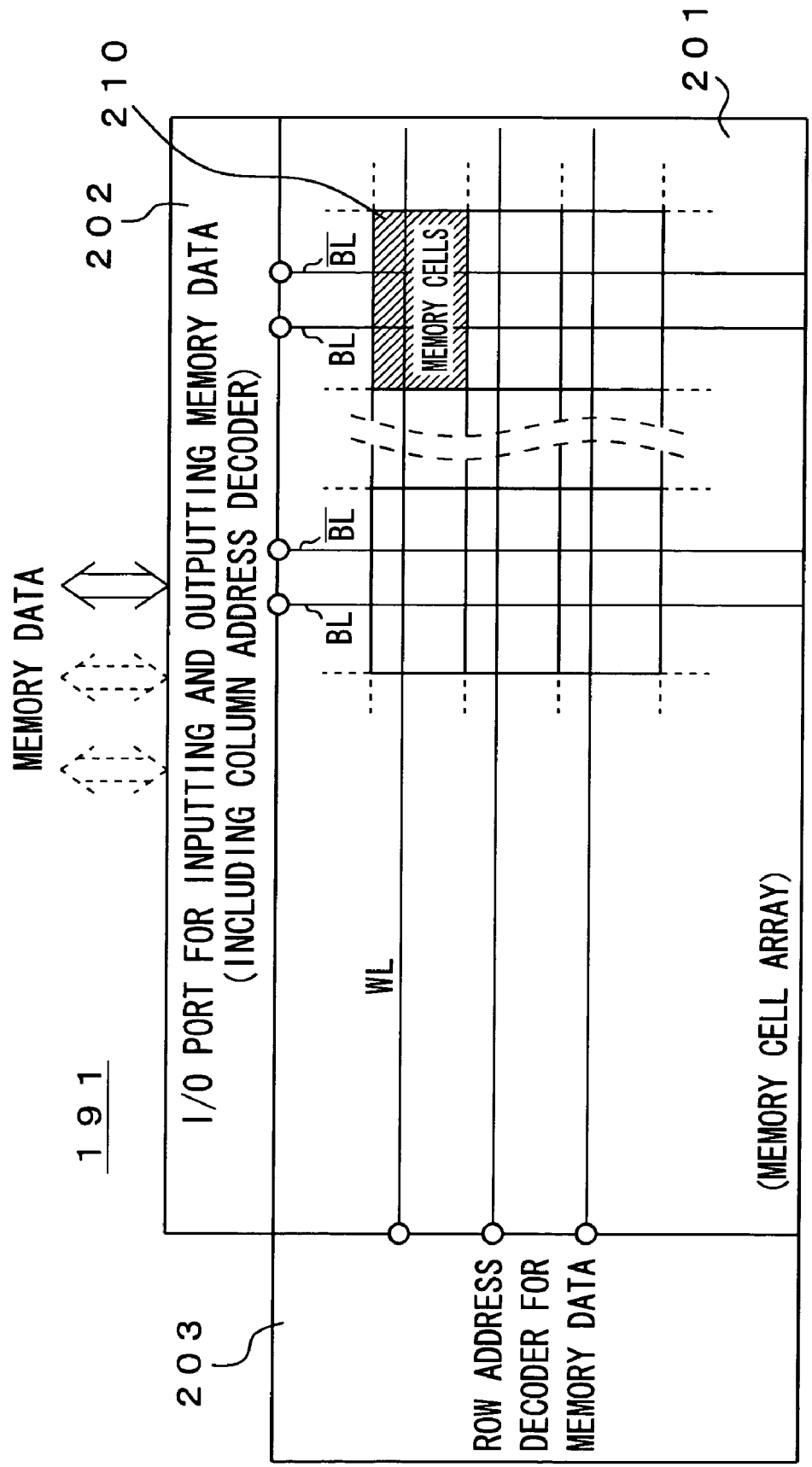
FIG. 30 is a diagram showing an arrangement of a memory block constituting a reference frame memory.

FIG. 30 shows an arrangement of another exemplary memory block 191 (191a-191d).

Memory block 191 has memory cell array 201 of multiple memory cells arranged in a matrix form, input/output port 202 (including a column address decoder) for inputting and outputting memory data, and row address decoder 203 for memory data.

Memory cell array 201 comprises multiple bit lines BL and /BL (/BL denoting BL overscored) for transferring the data that extend in the row direction, multiple word lines WL extending in the column direction and perpendicularly crossing the multiple bit lines BL and /BL, and multiple memory cells 210 arranged in a matrix form and connected with the respective bit lines BL and /BL, and word lines WL.

Figure 31:
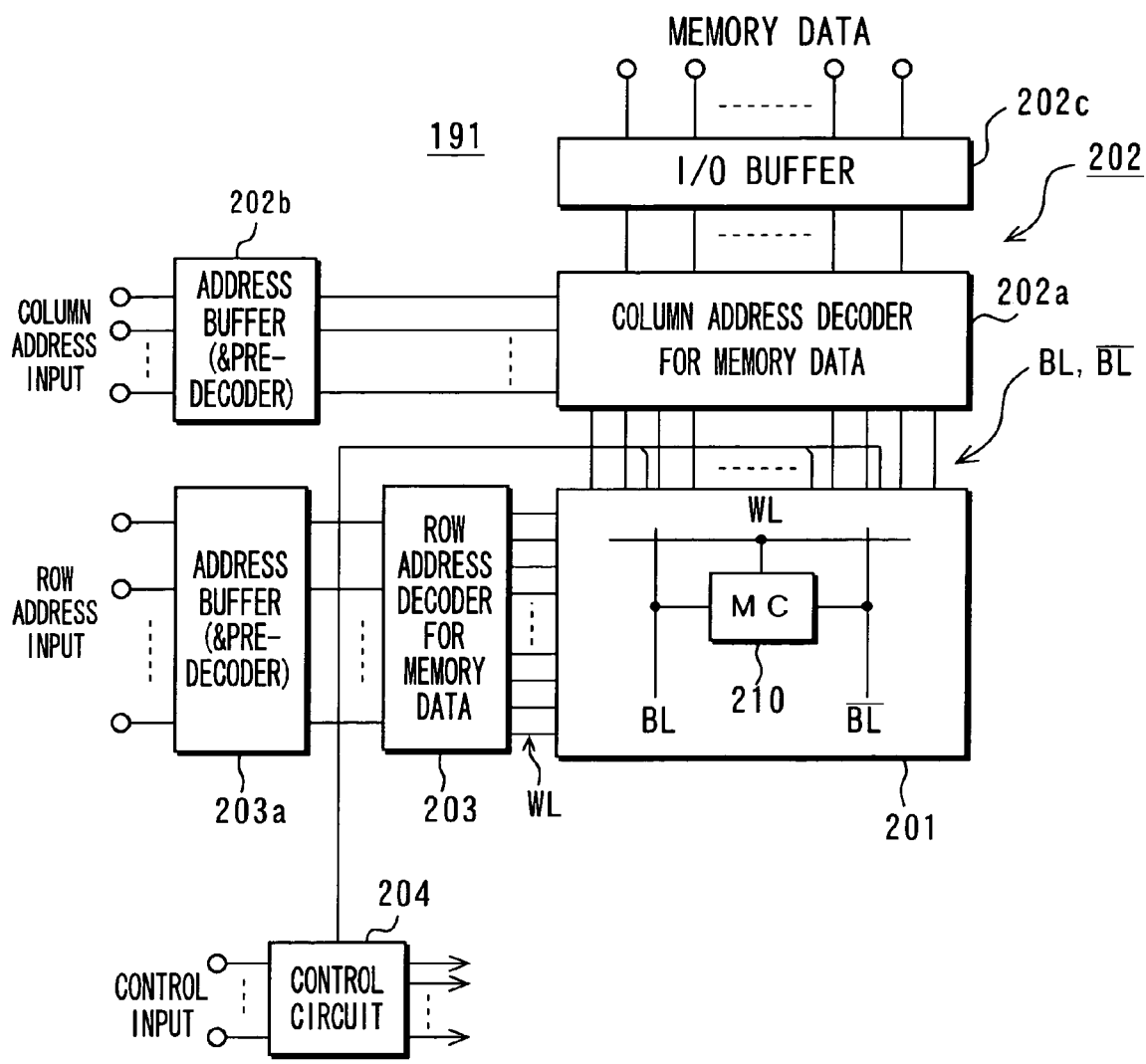
FIG. 31 is a diagram showing an arrangement of the memory block constituting the reference frame memory.

FIG. 31 shows details of the sections of the memory block 191 shown in FIG. 30 other than the memory cell array 201.

Column address decoder 202a for memory data, address buffer 202b, and I/O buffer 202c constitute input/output port 202 for inputting and outputting memory data, as shown in FIG. 30. The column address decoder 202a includes an I/O gate (column switch) and a sense amplifier. The column address decoder 202a receives column addresses via the address buffer 202b.

The column address decoder 202a keeps the multiple bit lines BL and /BL connected with a predetermined number of the multiple memory cells 210 located in the column direction of memory cell array 201 in response to each of the column addresses supplied via address buffer 202b to enable memory data to be written to and read out of the predetermined memory cells in the column direction via the I/O buffer 202c and the column address decoder 202a.

The row address decoder 203 for memory data receives row addresses via the address buffer 203a. The row address decoder 203 then activates the word lines WL connected with predetermined row-wise memory cells 210 of the memory cell array 201 in response to the row address supplied via the address buffer 203a to enable memory data to be written to and read out of the predetermined row-wise memory cells 210 via the I/O buffer 202c and the column address decoder 202a.

Control circuit 204 controls operations of the respective circuits of memory block 191 described above based on a control input. As will be described in detail later, an area of multiple memory cells arranged in the matrix form in the memory cell array 201 has multiple divisional domains divided in a direction along the word lines WL and each of the multiple cell selection lines WLF consist of multiple divisional cell selection lines associated with the multiple divisional domains. The memory cell array 201 comprises switching mechanisms for switching the divisional cell lines that are simultaneously activated in each of the divisional domains. The control circuit 204 also controls the switching mechanisms.

Unlike memory block 125 described above, the memory cell 210 has no operation function unit. The memory cell 210 may have the same structure as the SRAM cell shown in FIG. 13, or the DRAM cell shown in FIG. 14. Hence, further details of the memory 210 will be omitted.

Memory block 191 may simultaneously select the multiple memory cells 210 storing for each bit all the pixel data that constitute an arbitrary reference block. This arrangement will be further described below.

Figures 32A, 32B:
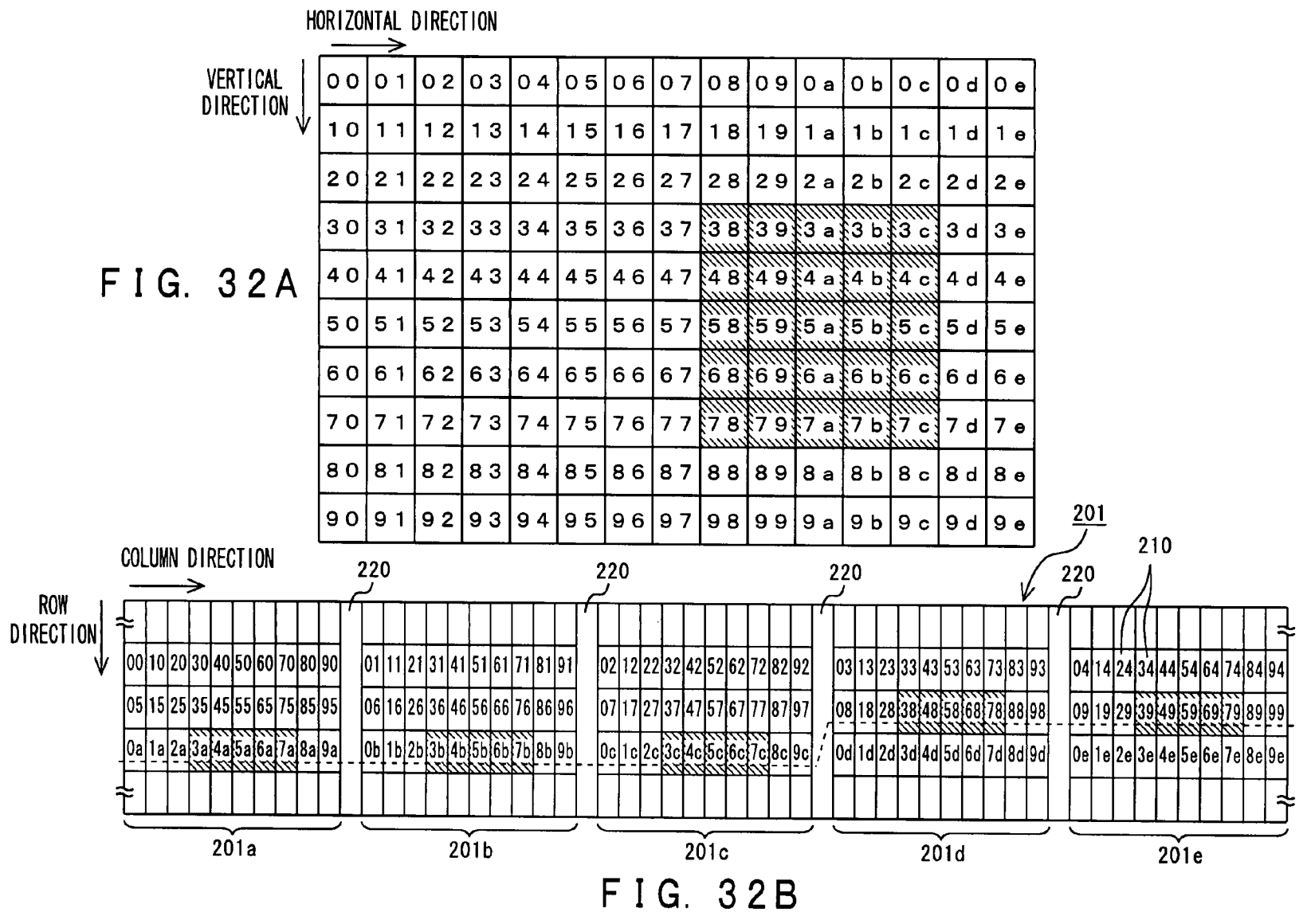

FIG. 32A schematically illustrates pixel data stored in one memory block 191 that constitutes a reference frame memory 123. For simplicity, one memory block 191 is assumed to store the pixel data consisting of 15 pixels in the horizontal direction and 10 rows in vertical direction, with each pixel data being one-bit data.

FIG. 32B shows respective memory locations of the pixel data in the memory cell array 201. In the example shown herein, each of the square meshes represents memory cell 210. Memory cell array 201 has fifty memory cells 210 lined in the column direction. It is noted that the multiple memory cells 210 in memory cell array 201 are divided into 5 divisional domains 201a-201e along the column direction.

In the example shown herein, 10 memory cells of the first, second, and third rows that are continuous in the divisional domain 201a respectively store pixel data of one vertical column, "00"-"90", "05"-"95", and "0a"-"9a". Similarly, 10 memory cells of the first, second, and third rows that are continuous in the divisional domain 201b, respectively store pixel data of one vertical column, "01"-"91", "06"-"96", and "0b"-"9b". Further, 10 memory cells of the first, second, and third rows that are continuous in the divisional domain 201c, respectively store pixel data of one vertical column, "02"-"92", "07"-"97", and "0c"-"9c".

In the same manner, 10 memory cells of the first, second, and third rows that are continuous in the divisional domain

201*d*, respectively store pixel data of one vertical column, "03"-"93", "08"-"98", and "0d"-"9d". Additionally, 10 memory cells of the first, second, and third rows that are continuous in the divisional domain 201*e*, respectively store pixel data of one vertical column, "04"-"94", "09"-"99", and "0e"-"9e".

Each of the multiple word lines WL (see FIG. 30) described above consists of 5 divisional word lines WLa-WLe (not shown in FIG. 30B) divided corresponding to the divisional domains 201*a*-201*e*. The memory cell array 201 is provided with switching mechanisms for switching the divisional word lines that are simultaneously activated within the respective divisional domains 201*a*-201*e*. For example, as shown in FIG. 32B, switching mechanism 220 is provided between each pair of two neighboring divisional domains 201*a*-201*e*.

Figure 33:
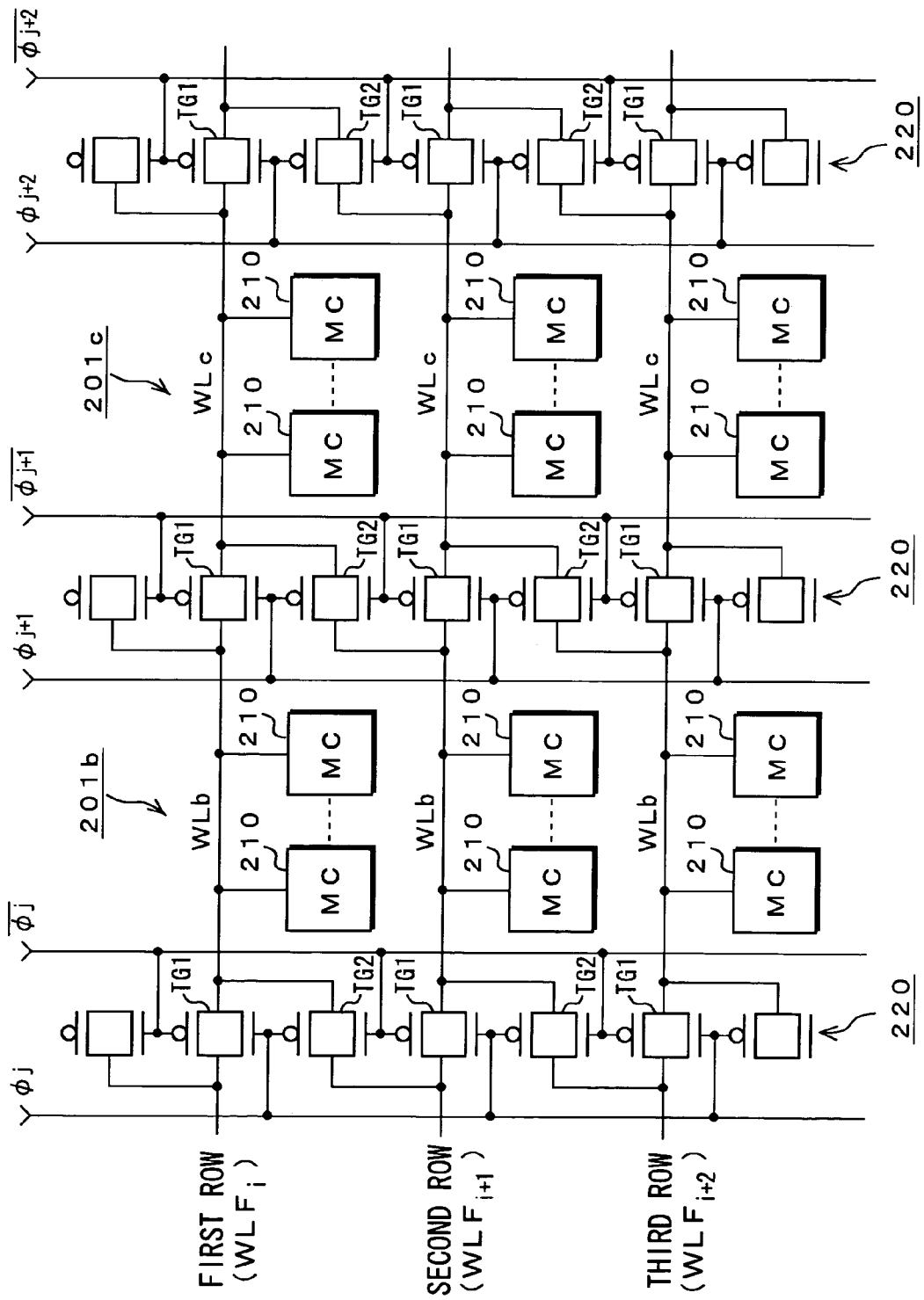
FIG. 33 is a diagram showing an arrangement of switching mechanisms for switching divisional word lines.

FIG. 33 shows another arrangement of exemplary switching mechanisms 220. Each of the switching mechanisms 220 has the same configuration as that of switching mechanisms 180 (see FIG. 23) provided in the memory cell array 131 of the memory block 125 described above.

Each of the switching mechanism 220 comprises CMOS transfer gates consisting of an n-type MOS transistor connected in parallel with a p-type MOS transistor. This switching mechanism 220 has transfer gate TG1 positioned between two adjacent divisional word lines belonging to the same row to connect them, and transfer gate TG2 positioned between two divisional cell selection lines belonging to neighboring rows to connect them.

A switching control signal φ is supplied to the gates of the n-type MOS transistors of the transfer gates TG1 and the gates of the p-type MOS transistors of the transfer gates TG2. A switching control signal/ φ (/φ denotes φ overscored, implying inverted switching control signal φ) is supplied to the gates of the p-type MOS transistors of the transfer gates TG1 and the gates of the n-type MOS transistor of the transfer gates TG2. These switching mechanisms 220 arranged between two neighboring divisional domains 201*a*-201*e* are independently supplied with the control signals φ and /φ.

Operations of the switching mechanisms 220 will now be described. When φ=1 and /φ=0, transfer gates TG1 become conductive to connect the divisional cell selection lines of the same row. On the other hand, when φ=0 and /φ=1, the transfer gates TG2 become conductive to connect the divisional cell selection lines of adjacent rows.

Since such the switching mechanisms 220 are provided between any of two neighboring divisional domains 201*a*-201*e* of memory cell array 131 as described above, multiple memory cells 210 storing for each bit all the pixel data constituting an arbitrary reference block can be simultaneously selected. It is thus possible to supply, as reference data, the bit data of all the pixel data constituting a reference block from the reference frame memory 123 to the search frame memory 124.

For example, regarding the candidate block hatched in FIG. 32A, a signal of "1" may be supplied from the row address decoder 203 for memory data (see FIG. 31) to the divisional word lines WLa-WLe of the respective divisional domains 201*a*-201*e* connected in FIG. 32B indicated by a broken line to activate the divisional word lines, using switching mechanisms 220, thereby selecting memory cells 210 hatched in FIG. 32B by the I/O gates (column switches) of the column address decoder 202*a* (see FIG. 31) for memory data.

In this way, any reference block having an arbitrary shape such as a rectangle or a cross can be dealt with by appropriately selecting the memory cells 210 by the I/O gates (column switches). It is noted that the reference block can be moved in units of one pixel in the horizontal and/or vertical direction(s) by means of the switching mechanisms 220 in cooperation with the I/O gates (column switches) since pixel data of one vertical column constituting the image data is stored in multiple memory cells 140 associated with one divisional word line.

It should be understood that although each pixel data is assumed to have one bit for simplicity in the description above, when each pixel data is n-bit data (for example 8-bit data), it is necessary to provide n memory cells 210 in order to store all the pixel data, thereby arranging these memory cells 210 continuously in the column direction, for example.

It has been also described in the example shown in FIG. 32B above that the multiple memory cells 210 associated with the respective divisional word lines WLa-WLe store pixel data of one vertical column. However, the multiple memory cells 210 associated with the respective divisional word lines WLa-WLe may store pixel data of one horizontal row.

Multiple memory cells 210 associated with the respective divisional word lines WLa-WLe may also store pixel data of m rows by m columns (with m being an integer larger than 1) constituting image data. In this case, a position of the reference block can move in the vertical direction in units of m pixels when the pixel data of m horizontal rows is stored, while it can move in the horizontal direction in units of m pixels when the pixel data of m vertical columns is stored.

It has been shown in the example shown above that switching mechanisms 220 (see FIG. 33) are respectively provided between pairs of neighboring divisional domains 201*a*-201*e* in order to switch the divisional word lines that are simultaneously activated within the respective divisional domains 201*a*-201*e* of the memory cell array 201. However, switching mechanisms 220 may have alternative configuration similar to that of switching mechanisms 180A or 180B as shown in FIGS. 27 or 28, respectively, as in the memory cell array 131 of the memory block 125 described above. In this case, however, the memory cell array 201 needs to have a global word line for inputting a cell selection signal, provided in parallel to the word lines WL (consisting of divisional word lines WLa-WLe).

Although detailed description thereof is omitted, the configuration of memory block 191 described above may be adopted also in memory data side of the memory block 125. This configuration enables simultaneous read and write of the entire pixel data constituting an arbitrary block by simultaneously selecting the multiple memory cells 140 storing for each bit the entire pixel data forming the block.

As described above, in accordance with the embodiments of the invention, the memory cells 140 that constitutes the memory block 125 include operation function unit for performing logical operations (see FIG. 15), and the memory block 125 has ancillary operational cells 134*d* (see FIGS. 10 and 12) for executing numerical calculation using the operation data, thereby allowing fast and efficient operation processing to be carried out without transmitting the data to a processing circuit through a wide data bus.

In the memory block 125, write and read of memory data are performed using multiple bit lines BL and /BL and multiple word lines WL, while operation data $D_0$-$D_{m-1}$ is outputted through the multiple reference data input lines RDL and /RDL, the multiple operation data output lines DAL and DBL, and the multiple cell selection lines WLF (see FIGS. 9 and 11). This arrangement allows the memory data to independently be written and read out and the operation data to be output, thereby making the processing as a whole flexible and efficient.

In the memory block 125 constituting a search frame memory 124, a region of the multiple memory cells 140 arranged in a matrix form in memory cell array 131 consists of the multiple divisional domains 131a-131e divided in the direction along the cell selection lines WLF; each of the multiple cell selection lines WLF consists of the multiple divisional cell selection lines WLFa-WLFe divided in association with the multiple divisional domains 131a-131e; and the switching mechanisms 180, 180A, and 180B are provided to switch the divisional cell selection lines that are simultaneously activated within the respective divisional domains 131a-131e (see FIGS. 22A, 22B, 23, 27, and 28), thereby enabling the ancillary operational cells 134d to operate so as to output the operation data of the multiple memory cells 140 arranged in an echelon form in units of divisional cell selection lines to the multiple operation data output lines DAL and DBL.

In this case, the multiple memory cells 140 associated with one divisional cell selection line store pixel data of an integral number of vertical column or horizontal row, one column or row or m columns or rows (m being larger than 1), which constitute an image data; the operation data associated with multiple items of the pixel data forming a candidate block can be simultaneously outputted to the multiple operation data output lines DAL and DBL; and the multiple ancillary operational cells 150, 170 simultaneously can perform numerical calculations in parallel using these data (FIGS. 19 and 20). Accordingly, difference absolute values $D_0$-$D_{m-1}$ can be simultaneously obtained for the multiple pixel data belonging to a given candidate block needed to find a motion vector MV, thereby improving data-processing efficient significantly.

It will be recalled that an arbitrary form of candidate block such as a rectangle and a cross can be coped with by selecting the memory cells 140 with the I/O gates (column switches) of the column address decoder 134a for reference data of the memory block 125. Since the multiple memory cells 140 associated with one divisional cell selection line store pixel data of an integral number of vertical columns or horizontal rows constituting the image data, a position of the candidate block can be easily moved in both the horizontal and vertical directions by means of the switching mechanisms 180 (180A, 180B) in cooperation with the I/O gates (column switches).

In the memory block 191 constituting the reference frame memory 123, a region of the multiple memory cells 210 arranged in a matrix form in the memory cell array 201 consists of the multiple divisional domains 201a-201e divided in the direction along the word lines WL; each of the word line WL consists of the multiple divisional word lines WLa-WLe in association with the multiple divisional domains 201a-201e; and the switching mechanisms 220 are provided to switch the divisional cell selection lines that are simultaneously activated in the respective divisional domains 201a-201e (see FIGS. 32A, 32B, and 33), thereby allowing the multiple memory cells 210 arranged in an echelon form in units of divisional word lines to be selected simultaneously.

In this case, the multiple memory cells 140 associated with one divisional word line store pixel data of an integral number of vertical columns or horizontal rows (one column or row or m columns or rows (m being larger than 1) that constitute an image data so that the multiple items of the pixel data constituting a reference block can be read simultaneously, thereby simultaneously supplying them to the search frame memory 124 and enabling a high speed data processing.

An arbitrary form of reference block including a rectangle or a cross can be dealt with by selecting the memory cells 210 with the I/O gates (column switches) of the column address decoder 202a for memory data of the memory block 191. Since the multiple memory cells 210 associated with one divisional word line store pixel data of an integral number of vertical columns or horizontal rows constituting the image data, a position of the reference block can be easily moved in both the horizontal and vertical directions by the switching mechanisms 220 in cooperation with the I/O gates (column switches).

The search frame memory 124 comprises multiple memory blocks, for example, four memory blocks 125a-125d, in which the pixel data of the upper left, upper right, lower left, and lower right boundary sections of the search frame is stored in duplication. When a range of the central pixel of a predetermined candidate block is in any one of the upper left, upper right, lower left, and lower right sections of the search frame, it suffices to activate only the memory blocks 125a, 125b, 125c, and 125d, respectively, thereby suppressing power consumption.

The reference frame memory 123 comprises multiple memory blocks, for example, four memory blocks 191a-191d, in which the pixel data of the upper left, upper right, lower left, and lower right boundary sections of the reference frame is stored in duplication. When the range of the central pixel of a predetermined reference block is in any one of the upper left, upper right, lower left, and lower right sections of the reference frame, it suffices to activate only the memory blocks 191a, 191b, 191c, and 191d, respectively, thereby suppressing power consumption.

Thus, in the search frame memory 124 and in the reference frame memory 123, in order to obtain the operation data on the pixel data of a candidate block and the pixel data of the reference block, respectively, only one of the memory blocks needs to be activated and other memory blocks may be used for other processing. This allows for efficient processing of complex processing.

Motion vector detection circuit 111 and motion compensation predictive encoder 100 utilizing the reference frame memory 123 and the search frame memory 124 as described above can enhance the speed and efficiency of processing for detection of a motion vector MV.

In the embodiment described above, the search frame memory 124 consists of memory block 125a-125d, and these memory blocks output the difference absolute values $D_0$-$D_{m-1}$ as they are. Alternatively, the search frame memory 124 may further include a circuit block that includes integrally a circuit for accumulating the difference absolute values $D_0$-$D_{m-1}$, a circuit for storing the accumulated values, and a circuit for detecting a motion vector MV from the accumulated values. This arrangement further facilitates faster and more efficient data processing.

In the embodiment described above, four memory blocks constituting the respective frame memory 123 and 124 have been shown to store pixel data of the upper left, upper right, lower left, and lower right sections of the respective frame. The pixel data may be stored in the four memory blocks in accordance with their orders they are inputted or with the phases associated with the positions of the respective pixels.

In the motion vector detection circuit 111 shown in FIG. 6, difference absolute values are calculated in the frame memory 124 storing the pixel data of a search frame, from which difference absolute values are obtained for each item of the pixel data corresponding to the respective multiple candidate blocks are obtained. Alternatively, operation circuit for obtaining these difference absolute values may be set outside the frame memory.

FIG. 34 shows a configuration of such motion vector detection circuit 111A as described above. Like elements in FIGS. 34 and 6 are denoted by the same reference numerals.

This motion vector detection circuit 111A has controller 121 for controlling the operations of the entire circuit 111A, input terminal 122 for receiving image data Di, frame memory 123 for accumulating image data of a reference frame, and frame memory 124A for accumulating image data of a search frame. The controller 121 controls write and read operations of these frame memories 123 and 124A.

When image data of a frame inputted through the input terminal 122 is written to the memory frame 123, the image data associated with the preceding frame, stored in frame memory 123, is read out of the frame memory 123 and supplied to the frame memory 124A.

Under the control of controller 121, as the image data of a predetermined reference block are outputted from the frame memory 123, pixel data of multiple candidate blocks in the search domain associated with the reference block is outputted in sequence from the frame memory 124A.

In the example shown herein, the frame memory 123 may have four memory blocks 191; in each of the memory blocks, the multiple memory cells 210 storing the pixel data constituting an arbitrary reference block can be selected simultaneously; and the pixel data of the reference block can be outputted simultaneously (see FIGS. 29-33), as described above. In the example shown, the frame memory 124A also has four memory blocks 191 like the frame memory 123, which are configured such that in each of the memory block, the multiple memory cells 210 storing multiple pixel data constituting an arbitrary candidate block can be simultaneously selected, and that the pixel data of the candidate block can be simultaneously outputted, though detailed description thereof is omitted.

The motion vector detection circuit 111A also has operation circuit 130 for receiving pixel data of a reference block from the frame memory 123 and pixel data of multiple candidate blocks in a search domain associated with the reference block from the frame memory 124A, and for calculating and outputting difference absolute values for each item of corresponding pixel data between pixel data of candidate blocks and pixel data of the reference block, in respect of the respective candidate blocks.

The motion vector detection circuit 111A further has accumulator 126 for receiving from the operation circuit 130 the difference absolute values calculated for each item of the pixel data associated with the respective candidate blocks to accumulate the difference absolute values and a correlation table 127 for storing as correlation values the accumulated values for the respective candidate blocks obtained by the accumulator 126.

The motion vector detection circuit 111A also has judgment circuit 128 for detecting a motion vector MV based on the correlation values for the respective candidate blocks stored in the correlation table 127, and output terminal 129 for outputting the motion vector MV detected by the judgment circuit 128. The judgment circuit 128 detects the position of the candidate block having the smallest correlation value as the motion vector MV.

Referring to FIG. 34, operations of the motion vector detection circuit 111A will be described.

The image data Di inputted to the input terminal 122 is supplied to the frame memory 123 where it is accumulated as image data of the reference frame. In this case, the image data of the preceding frame, stored in the frame memory 123, is retrieved from the frame memory 123 and supplied to the frame memory 124 where it is accumulated as the image data of the search frame.

The image data of the reference block is read out of the frame memory 123 and supplied to the operation circuit 130. The operation circuit 130 is also read and supplied with pixel data of the multiple candidate blocks in the search domain associated with the reference block. In the operation circuit 130, the difference absolute values between pixel data of candidate blocks and pixel data of the reference block are calculated for each item of the pixel data in respect of the respective multiple candidate blocks and outputted.

Thus, the difference absolute values calculated for each item of the pixel data in respect of the respective multiple candidate blocks are outputted from the operation circuit 130 and sequentially supplied to, and accumulated in, the accumulator 126. The cumulative values accumulated in the accumulator 126 for the respective multiple candidate blocks are supplied to the correlation table 127, and stored as correlation values. In the judgment circuit 128, the position of the candidate block having the smallest correlation value is detected as the motion vector MV based on the correlation values of the respective multiple candidate blocks stored in correlation table 127.

The image data of the multiple reference blocks in the reference frame is supplied in sequence from the frame memory 123 to the operation circuit 130. In association with the pixel data of the respective reference blocks, pixel data of the multiple candidate blocks is supplied from the frame memory 124A to the operation circuit 130. Similar operations are repeated for the respective reference blocks in the operation circuit 130, the accumulator 126, the correlation table 127, and the judgment circuit 128. Therefore, in the judgment circuit 128, motion vectors MV are detected in sequence for the respective reference blocks. Thus, the motion vectors MV detected by judgment circuit 128 are sequentially outputted from the output terminal 129.

In this way, also in the motion vector detection circuit 111A shown in FIG. 34, a motion vector MV can be detected efficiently, as in the motion vector detection circuit 111 shown in FIG. 6.

According to the above embodiment, in the judgment circuit 128 described above, a motion vector MV has been detected in the motion vector detection circuit 111 or 111A based on accumulation (sum) of the difference absolute values. It, however, is noted that a motion vector may be detected equally well by calculating a sum of squares or n-th powers of the difference absolute values. To do this, the motion vector detection circuit 111 shown in FIG. 6 may be configured to calculate the square or n-th power of each difference directly from the frame memory 124, or motion vector detection circuit 111A shown in FIG. 34 may be configured to calculate the square or n-th power of each difference in the operation circuit 130.

Although, in the above embodiment, the inventive memory device has been illustrated as being applied to the motion vector detection circuits 111 and 111A and the motion compensation predictive encoder 100, it may be applied to different types of apparatus, of course.

According to the inventive memory device, it has multiple selection lines, each selection line consisting of multiple divisional selection lines, and switching mechanisms for switching the divisional cell selection lines that are simultaneously activated in the respective divisional domains. Thus, by allocating the pixel data constituting given image data within multiple memory cells arranged in a matrix form, simultaneous access to the pixel data that constitute a pixel block having an arbitrary configuration such as a rectangle and a cross becomes possible, thereby simultaneously processing the pixel data that constitute a pixel block by one operation and easily changing position of the pixel block. Thus, it is possible to perform fast and efficient data processing using the pixel data forming such pixel block.

For example, by storing an integral number of vertical columns or horizontal rows of pixel data constituting given image data in the multiple memory cells associated with one divisional cell selection line, it is possible to move the pixel block in the horizontal or vertical direction in units of the integral number of pixels, and move the pixel block in the vertical or horizontal direction in units of one pixel.

According to the memory device embodying the invention, the memory cell constituting the memory block includes an operation function unit for performing logical operations and an ancillary operational cell for performing numerical calculations using the operation data on the memory block. This allows fast and efficient desired operation processing to be performed without transferring data to a processing circuit using a wide band data bus.

In the memory device in accordance with the invention, write and read of memory data are performed using multiple bit lines and multiple word lines, and operation data is outputted through multiple reference data input lines, multiple operation data output lines, and multiple cell selection lines. Thus, read and write of memory data can be performed independently of outputting operation data, thereby enabling flexible and efficient data processing on the whole.

In the memory device according to the invention, the memory device comprises multiple memory blocks configured in such a way that only necessary memory blocks may be activated to suppress power consumption.

In the memory device according to the invention, the memory device comprises, in addition to one or more memory blocks, a further circuit block for processing operation data outputted from the memory blocks, thereby enabling faster and more efficient data processing.

The inventive motion vector detector and the motion compensation predictive encoder utilize the memory device according to the invention, thereby attaining faster and more efficient processing for detection of a motion vector. This attains faster and more efficient processing for detection of a motion vector.

Next, an arrangement of another motion vector detection circuit 111 of the motion compensation predictive encoder 110 shown in FIG. 1 will be described. In what follows, this another motion vector detection circuit 111 is referred to by reference numeral 300 for convenience.

The block-matching method is also used in the motion vector detection circuit 300 to detect a motion vector. The motion vector detection circuit 300 first hierarchizes input image data to form multiple hierarchical classes of image data using a method of mean-value hierarchy and hierarchizes data representing high-frequency components of the respective hierarchical classes (referred to as activity) to form activity data (referred to as hierarchical activity), thereby detecting a motion vector (an amount of movement) in the respective hierarchical classes using the data.

In actuality, each of the hierarchized classes of image data and the activity data are assessed in sequence from the highest ranking class using the block-matching method to obtain their assessment values. Motion vectors in the respective hierarchical classes are then determined through comprehensive evaluation of the assessment values. A motion vector of the input image may be detected by reference through motion-compensation when assessment values of lower rank classes are determined in sequence based on the motion vector.

Figure 35A:
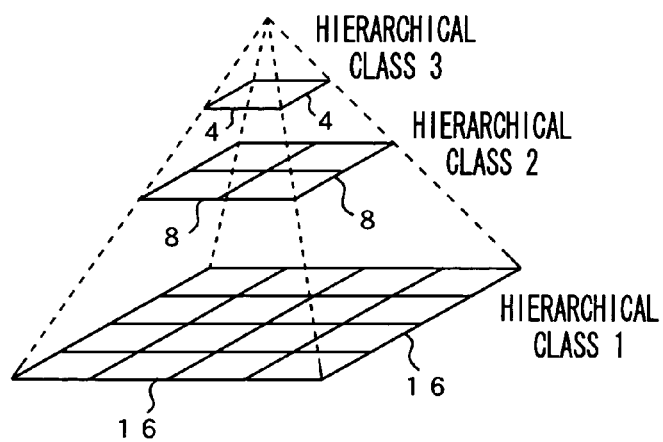
FIGS. 35A and 35B are diagrams illustrating a hierarchical structure.
Figure 35B:
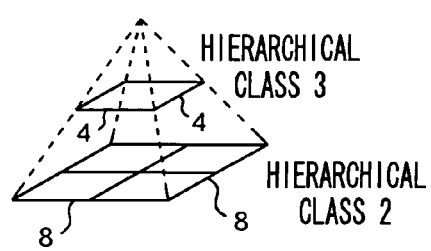

FIGS. 35A and 35B show how to generate hierarchical image data. FIG. 35A particularly illustrates a case where three hierarchical classes of image data are generated from input image data. Hierarchical class 1 represents nothing but the input image data. In the example shown herein, image data $M_n$ (x, y) of n-th hierarchical class (n=2, 3) can be obtained by calculating the mean value according to Formula (5) below:

$$Mn(x, y) = \frac{1}{4}\sum_{i=0}^{1}\sum_{j=0}^{1} Mn-1(2x-1+i, 2y-1+j) \qquad (5)$$

Here, the dimension of block size of n-th hierarchical class is reduced to ½ the dimension of the (n−1)-th hierarchical class in both of the horizontal and vertical directions. Thus, the image data of the hierarchical class 1 through class 3 thus formed differs in resolution.

The mean-value hierarchical image data is further activity-hierarchized as shown in FIG. 35B to form the activity data. The activity data of hierarchical class 2, denoted by Δ2 (x, y), is obtained by calculating the sum of difference absolute values of the corresponding pixels included in the image data of hierarchical class 2 and input image data (image data of hierarchical class 1), as shown in Formula (6) below:

$$\Delta 2(x, y) = \frac{1}{4}\sum_{i=0}^{1}\sum_{j=0}^{1} |M1(2x-1+i, 2y-1+j) - M2(x, y)| \qquad (6)$$

Similarly, activity data of hierarchical class 3, denoted by Δ3 (x, y), is obtained by calculating the sum of difference absolute values of the corresponding pixels included in the image data of hierarchical class 3 and pixel data of the input image data (image data of hierarchical class 1), as shown in Formula (7) below:

$$\Delta 3(x, y) = \frac{1}{16}\sum_{i=0}^{3}\sum_{j=0}^{3} |M1(4x-3+i, 4y-3+j) - M3(x, y)| \qquad (7)$$

Since activity data Δ2 (x, y) and Δ3 (x, y) is based on the input image data as seen in Formulas (6) and (7), high frequency components thereof faithful to that of the input image data can be extracted in the activity data.

Thus, through the calculation of activity data, a hierarchy structure thereof is obtained as shown in FIG. 35B. It is seen that the hierarchy may include hierarchical planes above the lowest ranking class. Such the activity data reflects a characteristic missing quantity that appears in the mean-value hierarchized image data.

FIGS. 36A and 36B illustrate a specific example of hierarchy structure. FIG. 36A shows a mean-value hierarchy, and FIG. 36B shows an activity hierarchy.

When a block of 4×4 pixels consisting of x1, x2, . . . , x15, and x16 associated with input image data (image data of hierarchical class 1) is hierarchized, the pixels y1, y2, y3, and y4 in the image data of mean-value hierarchized class 2 are obtained using Formula (8) below based on Formula (5):

$y1=(x1+x2+x3+x4)/4$ $y2=(x5+x6+x7+x8)/4$ $y3=(x9+x10+x11+x12)/4$ $y4=(x13+x14+x15+x16)/4$ \qquad (8)

When the 2×2 pixels consisting of y1, y2, y3, and y4 in accordance with the class 2 are hierarchized, the pixel z1 in the image data of mean-value hierarchized class 3 may be obtained using Formula (9) below based on Formula (5):

$$z1=(y1+y2+y3+y4)/4 \qquad (9)$$

The activity data of activity-hierarchized class 2 is calculated from the pixels y1, y2, y3, and y4 in the image data of the mean-value hierarchized class 2 and pixels x1, x2, . . . , x15, and x16 in the image data of the class 1, using Formula (10) below based on Formula (6):

$$a1=(|x1-y1|+|x2-y1|+|x3-y1|+|x4-y1|)/4$$

$$a2=(|x5-y2|+|x6-y2|+|x7-y2|+|x8-y2|)/4$$

$$a3=(|x9-y3|+|x10-y3|+|x11-y3|+|x12-y3|)/4$$

$$a4=(|x13-y4|+|x14-y4|+|x15-y4|+|x16-y4|)/4 \qquad (10)$$

Further, the activity data of activity-hierarchized class 3 is calculated from the pixel z1 in the image data of mean-value hierarchized class 3 and pixels x1, x2, . . . , x15, and x16 in the image data of the class 1, using Formula (11) below based on Formula (7):

$$b1 = \qquad (11)$$
$$(|x1 - z1| + |x2 - z1| + |x3 - z1| + |x4 - z1| + |x5 - z1| + |x6 - z1| +$$
$$|x7 - z1| + |x8 - z1| + |x9 - z1| + |x10 - z1| +$$
$$|x11 - z1| + |x12 - z1| + |x13 - z1| +$$
$$|x14 - z1| + |x15 - z1| + |x16 - z1|)/16$$

A motion vector is then detected in the respective hierarchical classes by the block-matching method, using the mean-value hierarchical image data and the activity-hierarchized activity data thus obtained. A block-matching evaluation function is given by Formula (12) below in terms of current field t.

$$E(Y)n(u_n, v_n) = \qquad (12)$$
$$\sum_x \sum_y |Mn^{t-2}(x - u_n - 2u_{n+1}, y - v_n - 2v_{n+1}) - Mn^t(x, y)|$$

where a doublet $(u_n, v_n)$ represents a motion vector in the hierarchical class n.

Vector $V'_n=(u_{n, vn})$ that gives the minimum value of the evaluation function $E(Y)_n$ is identified as the motion vector to be detected. The motion vector $V_n$ in the current class is obtained based on Formula (13) below:

$$V_n=V'_n+2V_{n+1} \qquad (13)$$

In the embodiment shown herein, an evaluation function for activity data of FIG. 35B is also obtained in the same manner as in Formula (12), using Formula (14) below:

$$E(D)n(u_n, v_n) = \qquad (14)$$
$$\sum_x \sum_y |\Delta n^{t-2}(x - u_n - 2u_{n+1}, y - v_n - 2v_{n-1}) - \Delta n^t(x, y)|$$

Let a new evaluation function $E(G)_n$ be given by Formula (15) below:

$$E(G)n=w_1 \cdot E(Y)_n + w_2 \cdot E(D)_n \qquad (15)$$

where $w_1$ and $w_2$ are weighting factors.

A motion vector is then determined by finding a vector that minimizes the evaluation function $E(G)_n$. In the lowest hierarchical class where no activity data exists, evaluation is made using only the evaluation function $E(Y)_n$ as given by Formula (12).

Thus, the evaluation using both of the mean-value hierarchized image data and the activity-hierarchized activity data allows correct motion vector to be detected, if an optimal evaluation value in a given hierarchical class is incorrect, using the other evaluation value. Thus, the accuracy of motion vector detection in each hierarchical class is improved. Since the accuracy of motion vector detection is improved in the respective hierarchical classes, accuracy of the final motion vector detection given by Formula (13) is improved accordingly.

Figure 37:
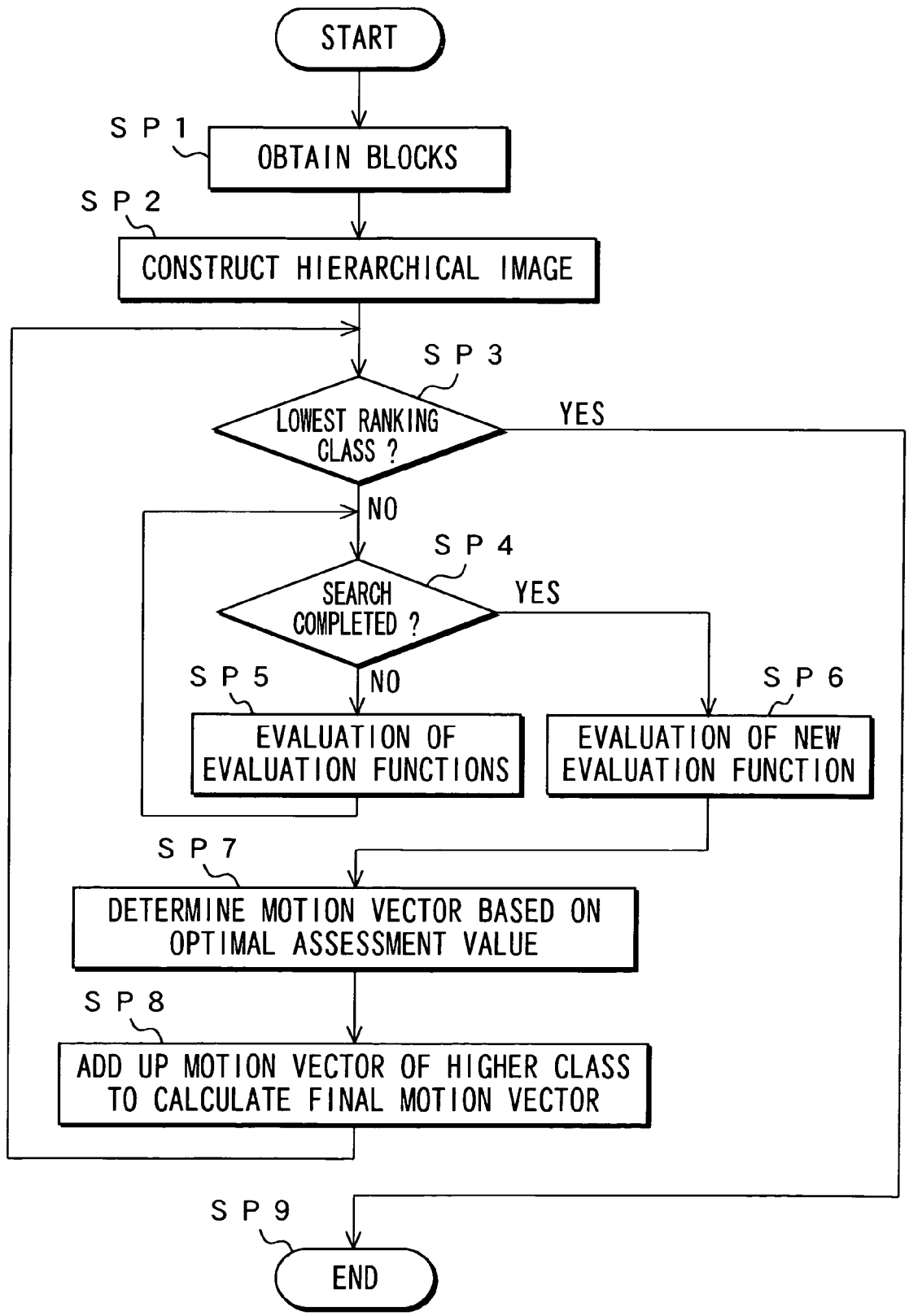
FIG. 37 is a flowchart showing the procedure of motion vector detection.

FIG. 37 is a flowchart showing a procedure of detecting a motion vector in a given reference block (e.g. a block size consisting of 16×16 pixels).

First, in step SP 1, a reference block is obtained through which a motion vector is detected from the input image data. Next, in step SP 2, the image data of the reference block is mean-value hierarchized following Formula (5), and activity-hierarchized following Formulas (6) and (7) to generate, for example, image data of hierarchized class 1, class 2, and class 3, and activity data of the hierarchized class 3.

In the next step SP 3, a determination is made as to whether the currently processed class is the lowest class (class 1) or not. If it is not, then in step SP 4 a query is made as to whether search is completed in the entire search domain. If the search is not completed, the procedure proceeds to step SP 5 where values (referred to as assessment value) of evaluation functions $E(Y)_n$ and $E(D)_n$ are calculated using past data (stored in a memory) and current data of the image data and the activity data, based on Formulas (12) and (14), and then the procedure returns to step SP 4.

On the other hand, if the search is completed in step SP 4, the procedure goes to step SP 6 where the new evaluation function $E(G)_n$ obtained by Formula (15) is evaluated to obtain optimal assessment value, using the evaluation functions $E(Y)_n$ and $E(D)_n$ obtained for the image data and the activity data. The procedure then proceeds to step SP 7.

In step SP 7, a motion vector $V'_n$ is determined from the optimal assessment value. In the next step SP 8, motion vector Vn+1 determined in the upper class is doubled and added on the basis of Formula (13) to obtain a motion vector Vn in the currently processing class. Then, the procedure returns to step SP 3.

If it is determined in step SP 3 that the currently processed class is the lowest class, then the processing of motion vector detection for a reference block is ended in step SP 9.

Figure 38:
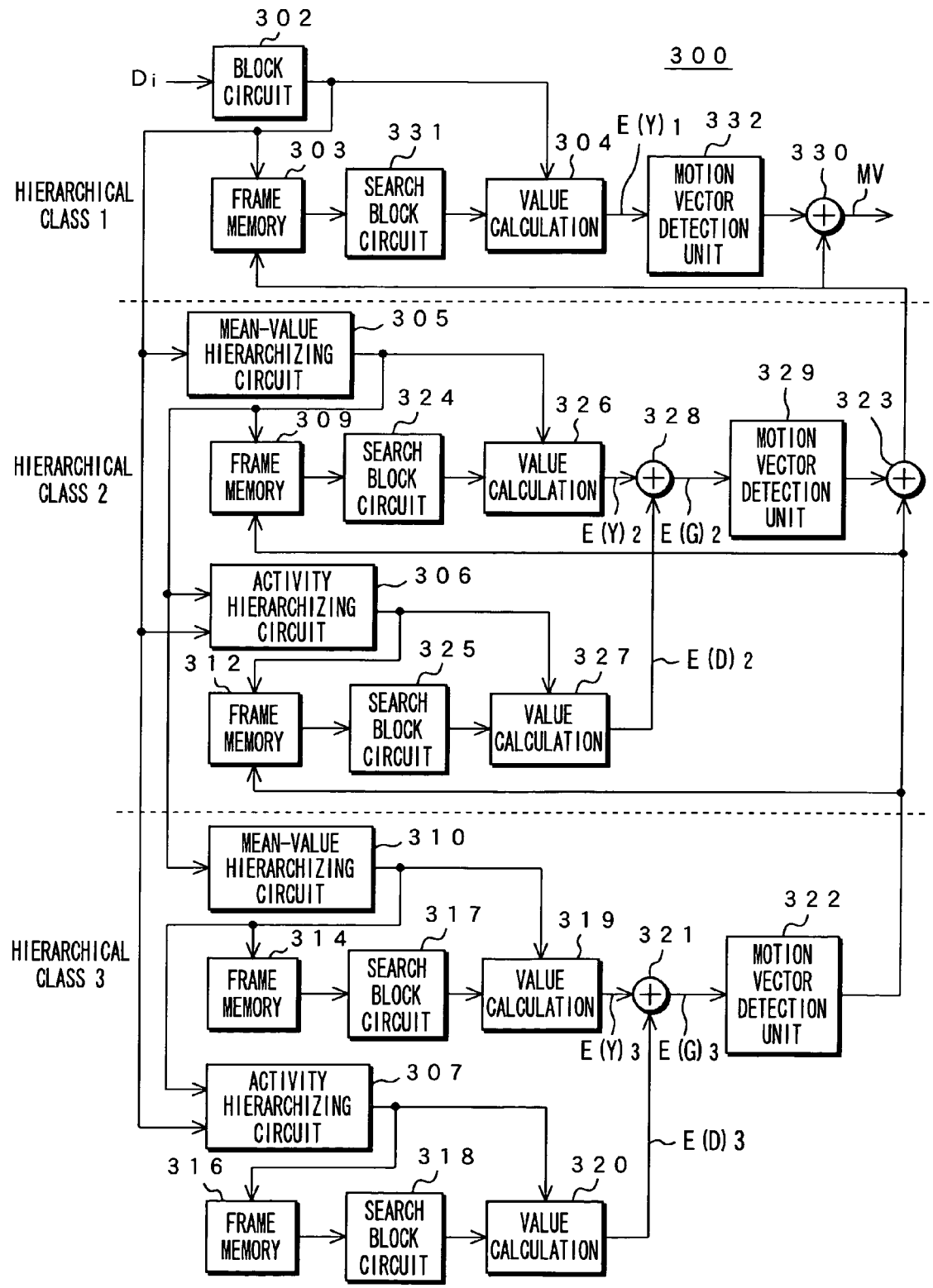
FIG. 38 is a block diagram showing a configuration of still another motion vector detection circuit.

FIG. 38 shows a configuration of motion vector detection circuit 300. In this motion vector detection unit 300, input image data Di are inputted to block circuit 302 where the data is sequentially divided into blocks of a predetermined size (e.g. block size consisting of 16×16 pixels). Image data of the reference block sequentially outputted from the block circuit 302 is supplied to frame memory 303 and assessment value calculation circuit 304 of hierarchical class 1, mean-value hierarchizing circuit 305 and activity hierarchizing circuit 306 of hierarchical class 2, and activity hierarchizing circuit 307 of hierarchical class 3.

The mean-value hierarchizing circuit 305 of hierarchical class 2 performs mean-value-hierarchizing processing defined by Formula (5) on the image data of the reference block of class 1 sequentially outputted from the block circuit 302, to obtain image data of the reference block of class 2. The resultant image data of class 2 is supplied to frame memory 309, the activity hierarchizing circuit 306, and assessment value calculation circuit 326 of class 2, and mean-value hierarchizing circuit 310 of class 3.

The activity hierarchizing circuit 306 of class 2 performs activity-hierarchizing processing defined by Formula (6), using the image data of the reference block of class 1 outputted in sequence from the block circuit 302 and the image data of the reference block of class 2 outputted from the mean-value hierarchizing circuit 305 to obtain activity data of the reference block of class 2. The resultant activity data of class 2 thus obtained is supplied to frame memory 312 of class 2 and assessment value calculation circuit 327, respectively.

The mean-value hierarchizing circuit 310 of class 3 performs mean-value-hierarchizing processing defined by Formula (5) on the image data of the reference block sequentially outputted from the mean-value hierarchizing circuit 305 to obtain the image data of the reference block of class 3. The resultant image data of class 3 thus obtained is supplied to frame memory 314, the activity hierarchizing circuit 307, and assessment value calculation circuit 319 of class 3.

The activity hierarchizing circuit 307 of class 3 performs activity-hierarchizing processing defined by Formula (7) using the image data of the reference block sequentially outputted from the block circuit 302 and the image data of class 3 of the reference block outputted from the mean-value hierarchizing circuit 310 to obtain the activity data of the reference block of class 3. The resultant activity data of class 3 thus obtained is supplied to frame memory 316 and assessment circuit 320 of class 3.

In the motion vector detection circuit 300, image data of reference block sequentially outputted from the block circuit 302 is mean-value hierarchized as image data of hierarchical classes 1, 2, and 3 as shown in FIG. 35A, and activity-hierarchized as activity data of hierarchical classes 2 and 3 as shown in FIG. 35B.

In detecting each of the motion vectors of the respective reference blocks, a motion vector in the highest ranking class (class 3) is first detected. Search block circuit 317 sequentially reads out the image data of class 3 associated with the respective candidate blocks in the search domain from the image data of class 3 in the immediately preceding (search) frame stored in the frame memory 314, and supplies the data thus read to the assessment value calculation circuit 319.

The assessment value calculation circuit 319 obtains assessment value of each of the candidate blocks based on evaluation function $E(Y)_3$ defined by Formula (12) using the image data of the reference block of class 3 supplied from the mean-value hierarchizing circuit 310 and the image data of each of the candidate blocks of class 3 from a search block 317.

Also, search block circuit 318 sequentially reads out the activity data of class 3 associated with the respective candidate blocks in the search domain from the activity data of class 3 in the immediately preceding frame (i.e. search frame) stored in the frame memory 316, and supplies the activity data to the assessment value calculation circuit 320.

The assessment value calculation circuit 320 obtains assessment value of each of the candidate blocks based on evaluation function $E(D)_3$ defined by Formula (14) using the activity data of the reference block of class 3 supplied from the activity hierarchizing circuit 307 and the activity data of each of the candidate blocks of class 3 supplied from the search block 318.

The assessment value of each of the candidate blocks obtained by the respective assessment value calculation circuits 319 and 320 is first weighted and then summed in addition circuit (adder) 321 based on Formula (15). The assessment value of each of the candidate blocks based on the new assessment function $E(G)_3$ thus obtained is entered in motion vector detection unit 322.

Figure 39:
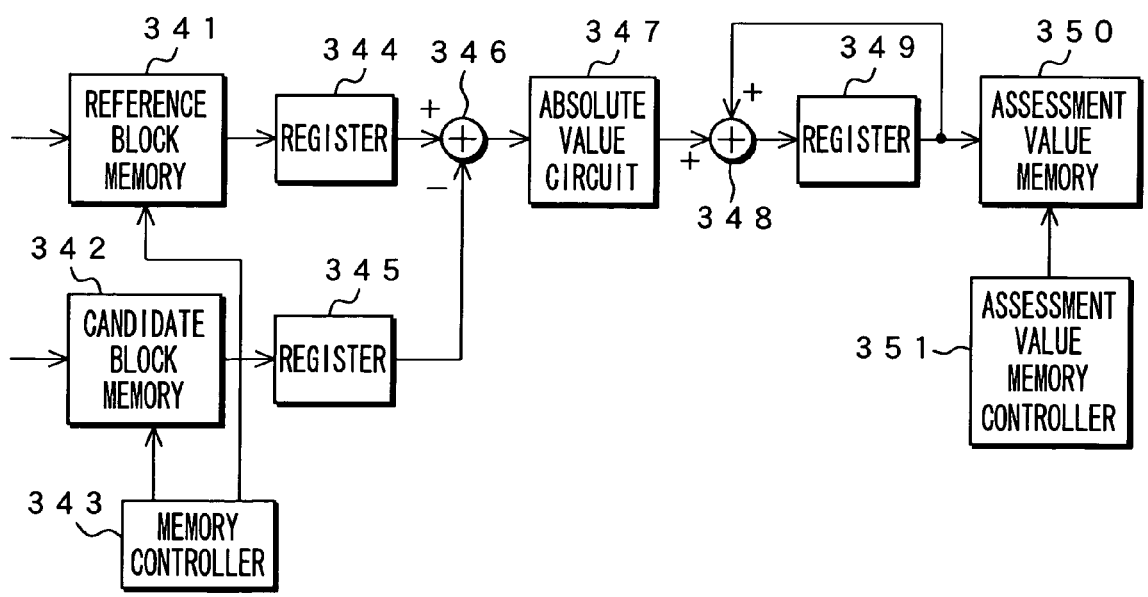
FIG. 39 is a block diagram showing a configuration of an assessment calculation circuit.

In this embodiment, assessment value calculation circuit 340 (319 and 320) has a configuration as shown in FIG. 39. More particularly, the assessment value calculation circuit 340 has reference block memory 341 and candidate block memory 342. The reference block memory 341 stores image data of the reference block of class 3 supplied from the mean-value hierarchizing circuit 310, or activity data of the reference block of class 3 supplied from the activity hierarchizing circuit 307. The candidate block memory 342 stores image data of the candidate blocks of class 3 supplied from the search block circuit 317, or activity data of the candidate blocks of class 3 supplied from the search block circuit 318.

The contents of the reference block memory 341 and the candidate block memory 342 are read out in the order as addressed by memory controller 343, and fed to subtraction circuit (subtracter) 346 where the subtraction is performed thereon, via registers 344 and 345. The difference data thus obtained is converted to absolute values in absolute value circuit 347, and accumulated and added in addition circuit 348 and register 349. The resultant cumulative sum is taken as the assessment value of the candidate block. The assessment values of the respective candidate blocks are computed sequentially in assessment value calculation circuit 340 and entered into assessment value memory 350 in the order as addressed by assessment value memory controller 351.

In actuality, on the processing in the hierarchical classes 2 and 3, the weighted sum of the assessment values of the mean-value hierarchized image data and the assessment values of the activity-hierarchized activity data are calculated before it is stored in assessment value memory 350.

Figure 40:
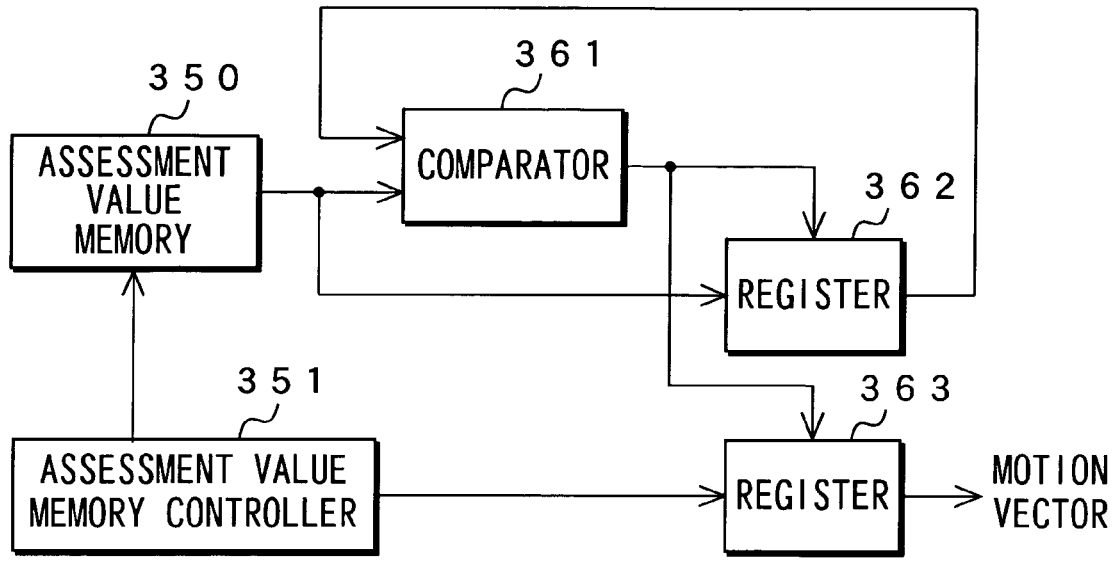
FIG. 40 is a block diagram showing a configuration of further motion vector detection unit.

In the embodiment shown herein, motion vector detection unit 360 (and 322) is configured as shown in FIG. 40. As seen in FIG. 40, the motion vector detection unit 360 sequentially reads the assessment values of the respective candidate blocks out of the assessment value memory 350 in the order as addressed by the address specified by the assessment value memory controller 351, and enter the values into comparator 361 and register 362. The comparator 361 compares another input value with the assessment value read out of the assessment value memory 350, and, if the assessment value read out of the assessment value memory 350 is smaller, it issues a signal instructing the registers 362 and 363 to update the contents thereof.

The register 363 set sequential order of addresses for reading the assessment value memory 350. Thus, assessment values stored in the assessment value memory 350 are assessed in sequence. The address that gives the minimum assessment value is issued from the register 363, which value is outputted from the vector detection unit 360 as the motion vector MV.

Referring back to FIG. 38, detection of a motion vector in hierarchical class 2 is performed next. In this case, a motion vector of class 3 obtained in the motion vector detection unit 322 for class 3 as described above is supplied to frame memories 309 and 312 of class 2 to perform motion compensation of a relevant search domain using the motion vector.

Search block circuit 324 sequentially reads the image data of class 2 associated with each of the candidate blocks in the search domain (search area) from the image data of class 2 in the immediately preceding (search) frame stored in the frame memory 309, and supplies the image data to assessment value calculation circuit 326. The search domain in this class 2 is narrower than the search domain in class 3 described above.

The assessment value calculation circuit 326 obtains the assessment values of the respective candidate blocks based on evaluation function $E(Y)_2$ defined by Formula (12), using the image data of a reference block of class 2 supplied from the mean-value hierarchizing circuit 305 and the image data of the respective candidate blocks of class 2 from the search block circuit 324.

Search block circuit 325 sequentially reads the activity data of class 2 associated with each of the candidate blocks in the search domain (search area) from the activity data of class 2 in the immediately preceding (search) frame stored in the frame memory 312, and supplies the data to assessment value calculation circuit 327.

The assessment value calculation circuit 327 obtains assessment value of each of the candidate blocks based on evaluation function $E(D)_2$ defined by Formula (14) using the activity data of the reference block of class 2 supplied from the activity hierarchizing circuit 306 and the activity data of each of the candidate blocks of class 2 supplied from the search block circuit 325.

The assessment values obtained in the assessment value calculation circuits 326 and 327 are weighted based on Formula (15) and summed in addition circuit (adder) 328. The assessment values of the respective candidate blocks based on the new assessment function $E(G)_2$ thus obtained are entered into motion vector detection unit 329. In the motion vector detection unit 329, the assessment values of the respective candidate blocks are assessed in turn to obtain motion vector.

The motion vector obtained in the motion vector detection unit 329 is added to the motion vector of class 3 in addition circuit 323, as shown in Formula (13), resulting in a motion vector of class 2. It is noted that the assessment value calculation circuits 326 and 327 and the motion vector detection unit 329 are constructed in the same configuration as the assessment value calculation circuit 340 (see FIG. 39) and the motion vector detection unit 360 (see FIG. 40), respectively.

Next, detection of the motion vector of class 1 is performed. In this case, the motion vector of class 2 obtained in the addition circuit 323 as described above is supplied to the frame memory 303 of class 1. The search domain is compensated by the motion vector.

Search block circuit 331 sequentially reads out the image data of class 1 associated with the respective candidate blocks in the search domain (search area) from the image data of class 1 in the immediately preceding (search) frame stored in the frame memory 303, and supplied the data to the assessment value calculation circuit 304. The search domain in class 1 is further narrowed than the search domain in class 2 described above.

The assessment value calculation circuit 304 obtains the values of the respective candidate blocks based on evaluation function $E(Y)_1$ defined by Formula (12) using the image data of reference block of class 1 supplied from the block circuit 302 and the image data of the respective candidate blocks of class 1 supplied from the search block circuit 331.

The assessment values of the respective candidate blocks obtained in the assessment value calculation circuit 304 are supplied to motion vector detection unit 332. The motion vector detection unit 332 assesses the assessment values of the respective candidate blocks in sequence to obtain a motion vector. This motion vector is added to the motion vector of class 2 in addition circuit 330 as taught in Formula (13), the sum of which is outputted as the motion vector of class 1, i.e. the motion vector MV of the reference block of interest. It is noted that assessment value calculation circuit 304 and motion vector detection unit 332 are constructed in the same configuration as the assessment value calculation circuit 340 (see FIG. 39) and motion vector detection unit 360 (see FIG. 40), respectively.

Thus, in detecting a motion vector based on the block-matching method, by hierarchizing a given image with different resolutions and using the hierarchized image, assessment values of activity-hierarchized activity data are subject to the assessment for each hierarchical class, thereby to minimize the amount of calculations to detect the motion vector while maximizing the accuracy of the calculations.

In the embodiment shown herein, the frame memories 303, 309, and 314 for storing image data of hierarchical classes 1, 2, and 3, respectively, are constituted of the same memory blocks 450.

Figure 41:
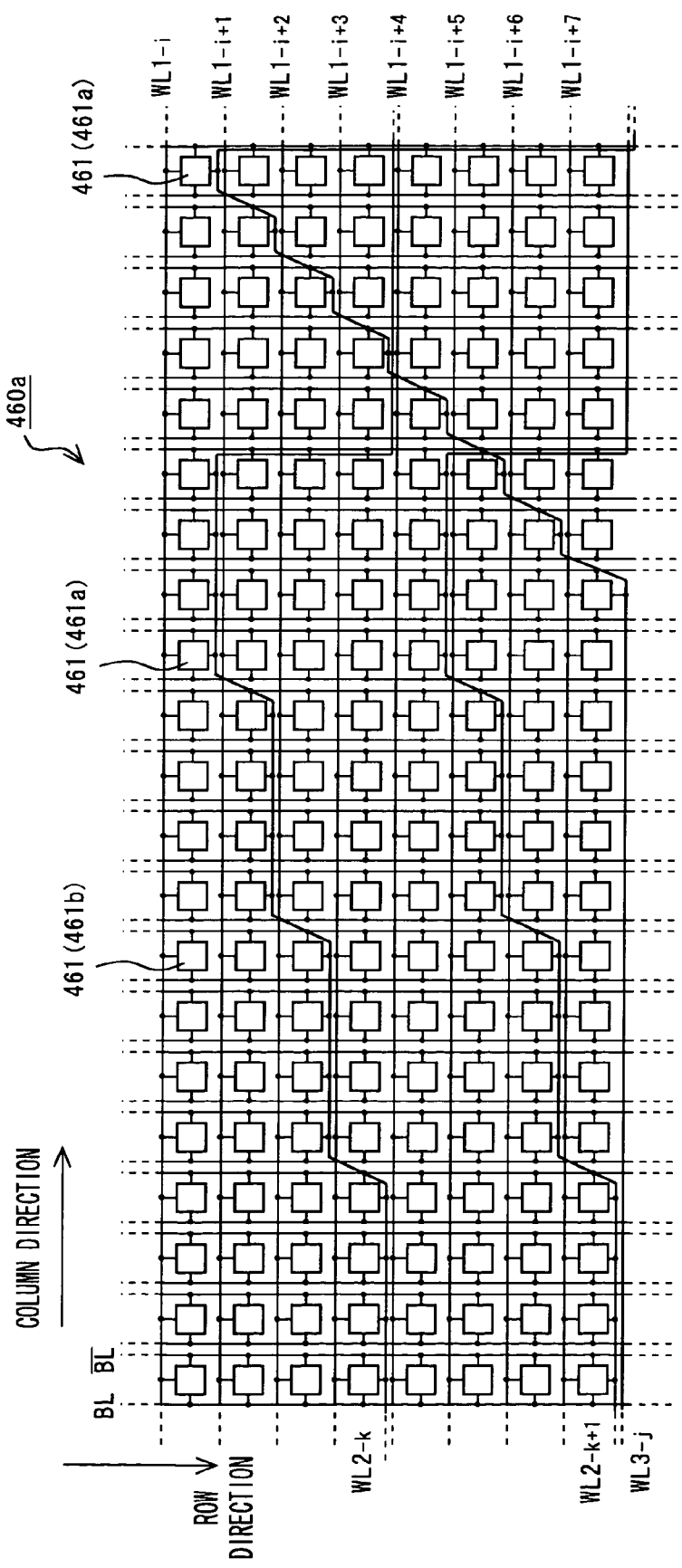
FIG. 41 is a diagram showing a portion of the memory cell array in a memory block.

FIG. 41 shows a configuration of a portion 460a of memory cell array 460 included in memory block 450. This portion 460a is adapted to store 16-pixel image data of class 1 (which corresponds to pixels x1-x16 of FIG. 36A), 4-pixel image data of class 2 (which corresponds to pixels y1-y4 of FIG. 36A) obtained from the pixel data of class 1, and 1-pixel image data of class 3 (which corresponds to pixel z1 of FIG. 36A) obtained from the pixel data of class 2. The image data per each pixel is 8-bit data.

The portion 460a has memory cells 461 of 21 columns thereof by 8 rows thereof, which are arranged in a matrix form. The 21 memory cells 461 in each row include 5 first memory cells 461a and 16 second memory cells 461b. The 16 second memory cells 461b store image data of 2 pixels of class 1 (16 bits). The 5 first memory cells 461a store 4-bit image data of class 2 and 1-bit image data of class 3.

The first memory cells 461a and the second memory cells 461b are connected to word line WL1 as a first word line. The first memory cells 461a are also connected with word lines WL2 and WL3 as second word line. Each of the word lines WL1_i-WL 1_i+7 extends in the column direction and is connected with 21 memory cells 461 (461a, 461b) distributed in the column direction.

Each of the word lines $WL2_{13}$ k and $WL2_{13}$ k+1 is configured to extend in an echelon form of 4 rows connecting 4 first memory cells 461a of each row. Similarly, the word line $WL3_{13}$ J is configured to extend in an echelon form of 8 rows connecting one first memory cell 461a of each row. In this way, the first memory cells 461a that are connected to the word line $WL2_{13}$ k and $WL2_{13}$ k+1 are different from the first memory cells 461a that are connected to the word line $WL3_{13}$ j.

The above description concerns the portion 460a of the memory cell array 460 for storing 16-pixel, 4-pixel, and 1-pixel image data of classes 1, 2, and 3, respectively. However, it would be apparent that other portions of memory cell array 460 may be configured similarly. Thus, the echelon forms of the word lines WL2 and WL3 are periodically repeated in the column direction with a unit of 21 memory cells.

In the portion 460a of the memory cell array 460 shown in FIG. 41, 21 memory cells 461 (461a, 461b) extending in the column direction can be simultaneously activated by the word line WL1, enabling write and read of image data to these memory cells 461.

Further, 16 first memory cells 461a of the portion 460a arranged in the echelon form over 4 rows can be simultaneously activated by the word line WL2, thereby enabling read and write of image data to these first memory cells 461a.

Still further, 8 first memory cells 461a of the portion 460a arranged in the echelon form over 8 rows can be simultaneously activated by the word line WL3, thereby enabling read and write of image data to these first memory cells 461a.

In accordance with the embodiment shown herein, therefore, image data of class 1 can be read out and written to the second memory cells 461b by activating these memory cells by the word line WL1. Similarly, image data of class 2 can be read out of and written to the first memory cells 461a by activating the first memory cells 461a by word line WL2. Image data of hierarchical class 3 can be also read out of and written to the first memory cells 461a by activating the first memory cells 461a by word line WL3.

In this way, image data of classes 1-3 can be stored efficiently in the same memory block 450, and moreover image data of classes 2 and 3 can be read out of and written to it independently of the image data of class 1, which facilitates efficient detection of motion vectors.

Figure 42:
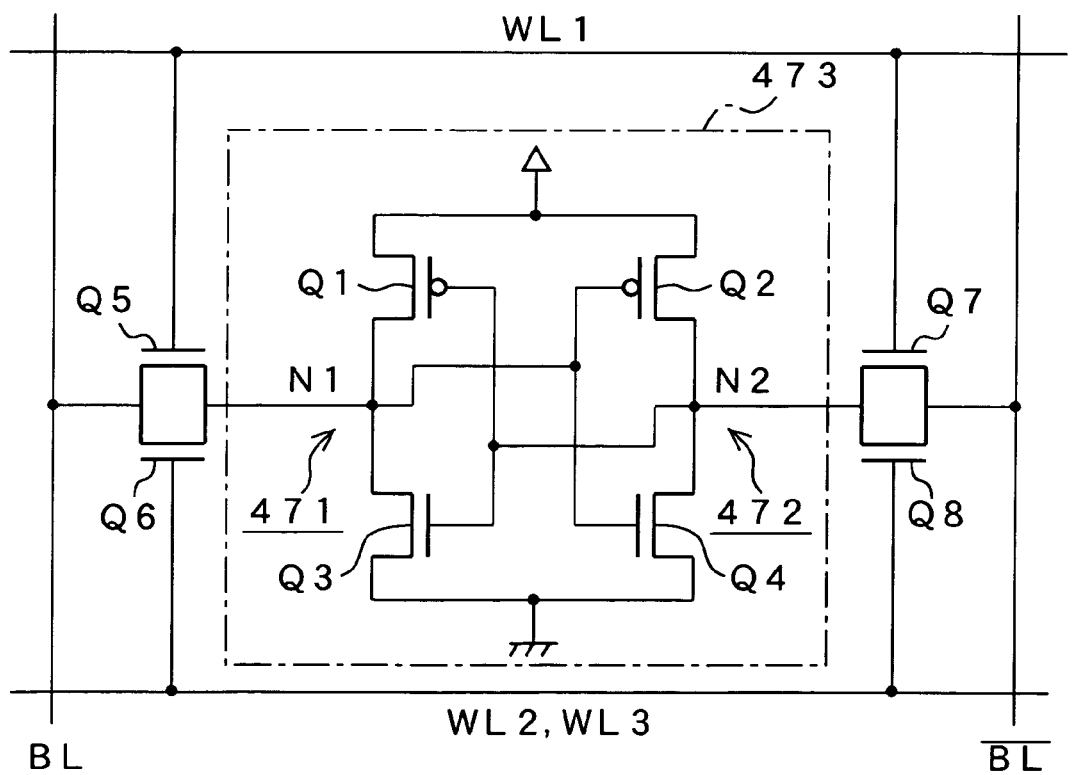
FIG. 42 is a diagram showing a configuration of a first memory cell.

Next, first memory cell 461a will be further described. FIG. 42 shows an arrangement of the first memory cell 461a. In this case, p-type MOS transistor Q1 and n-type MOS transistor Q3 representing load elements are connected in series between the power supply and the ground to form CMOS inverter 471, and p-type MOS transistor Q2 and n-type MOS transistor Q4 representing load elements are connected between the power supply and the ground to form CMOS inverter 472. The outputs of the respective CMOS inverters 471 and 472, i.e. potentials of the respective memory nodes N1 and N2, are coupled to the inputs of the respective CMOS inverters 472 and 471, i.e. the gates of the respective n-type MOS transistors Q4 and Q3.

The memory node N1 of CMOS inverter 471 is connected to bit line BL via both of access transistor Q6 having its gate connected to word line WL1 and access transistor Q5 having its gate connected to word line WL2 or the word line WL3. It is noted that the access transistors Q5 and Q6 are connected in parallel to each other.

On the other hand, the memory node N2 of CMOS inverter 472 is connected to bit line /BL (/BL representing BL overscored) via both of access transistor Q7 having its gate connected to the word line WL1 and access transistor Q8 having its gate connected to the word line WL2 or the word line WL3. The access transistors Q7 and Q8 are also connected in parallel to each other.

In the first memory cell 461a having such the configuration, data of "1" or "0" is stored in memory cell unit 473 composed of a pair of CMOS inverters 471 and 472. Data is transferred for read and write between memory cell unit 473 and the bit line BL or /BL via the access transistors Q5 and Q7 or the access transistors Q6 and Q8. That is, selection of memory cell unit 473 can be made by either the word line WL1 or the word lines WL2 and WL3.

Incidentally, first memory cell 461a shown in FIG. 42 is based on a usual SRAM (Static Random Access Memory) cell. However, it can be based on another type of SRAM cell such as a high-resistance load type memory cell, a TFT-load type memory cell, or a DRAM (Dynamic Random Access Memory) cell.

Figure 43:
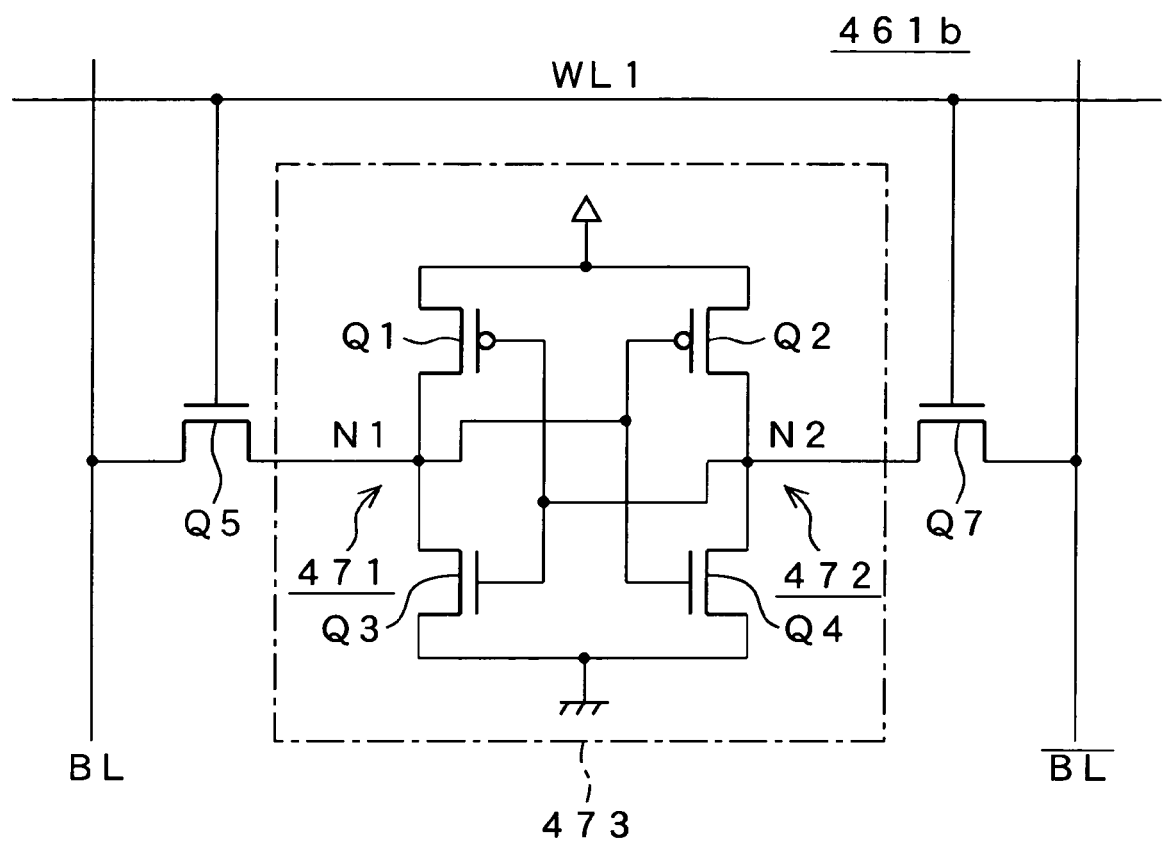
FIG. 43 is a diagram showing a configuration of a second memory cell.

Next, the second memory cell 461b will be described. FIG. 43 shows an arrangement of the second memory cell 461b. In FIG. 43, those elements that correspond to like elements of FIG. 42 are denoted by the same reference numerals as in FIG. 42.

As shown in the figure, p-type MOS transistor Q1 and n-type MOS transistor Q3 representing load elements are connected in series between the power supply and the ground to form CMOS inverter 471, and p-type MOS transistor Q2 and n-type MOS transistor Q4 representing load elements are connected between the power supply and the ground to form CMOS inverter 472. The outputs of the respective CMOS inverters 471 and 472, i.e. potentials of the respective memory nodes N1 and N2, are coupled to the inputs of the respective CMOS inverters 472 and 471, i.e. the gates of the respective n-type MOS transistors Q4 and Q3.

The memory node N1 of CMOS inverter 471 is connected to bit line BL via transistor Q5 having its gate connected to word line WL1. On the other hand, the memory node N2 of CMOS inverter 472 is connected to bit line /BL via access transistor Q7 having its gate connected to the word line WL1.

In the second memory cell 461b having such the configuration, data of "1" or "0" is stored in memory cell unit 473 composed of a pair of CMOS inverters 471 and 472. Data is transferred for read and write between the memory cell unit 473 and the bit line BL or /BL via the access transistors Q5 and Q7. That is, selection of memory cell unit 473 can be made by the word line WL1.

It will be understood that the second memory cell 461b shown in FIG. 43 is a usual SRAM (Static Random Access Memory) cell. However, it can be another type of SRAM cell such as a high-resistance load type memory cell, a TFT-load type memory cell, or a DRAM cell.

Figure 44:
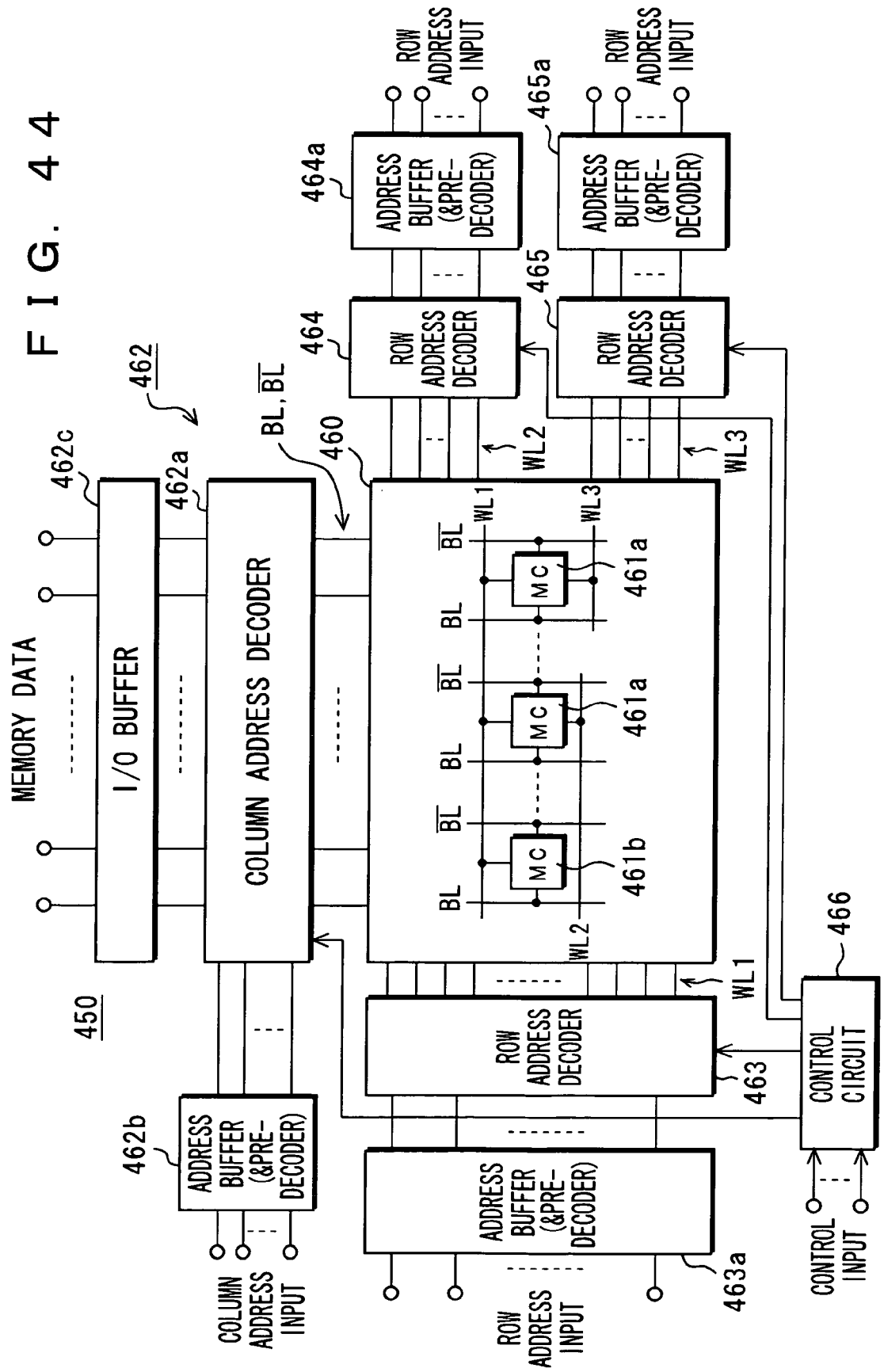
FIG. 44 is a block diagram showing a configuration of a memory block.

Next, a memory block 450 that constitutes frame memories 303, 309, and 314 will be described. FIG. 44 shows a configuration of the memory block 450.

The memory cell block 450 has a memory cell array 460 that contains multiple memory cells arranged in a matrix form, input/output port 462 for memory data, first through third row-address decoders 463-465 for memory data, and control circuit 466.

The input/output port 462 for memory data comprises column address decoder 462a for memory data, address buffer 462b, and I/O buffer 462c. The column address decoder 462a includes an I/O gate (column switch) and a sense amplifier. A column address is inputted to the column address decoder 462a via the address buffer 462b.

The column address decoder 462a keeps the multiple bit lines BL and /BL connected with a predetermined number of multiple memory cells 461 located in the column direction of memory cell array 460 in response to each of the column addresses supplied via the address buffer 462b to enable memory data to be read out of and written to the predetermined memory cells in the column direction via the I/O buffer 462c and the column address decoder 462a.

The first row address decoder 463 for memory data is supplied with row addresses via the address buffer 463a. The row address decoder 463 activates the word lines WL1 connected with predetermined memory cells 461 located in the row direction of the memory cell array 460 in response to each of the row addresses supplied via the address buffer 463a to enable memory data to be read out of and written to the predetermined memory cells 461 (461a, 461b) in the row direction via the I/O buffer 462c and the column address decoder 462a.

The second row address decoder 464 for memory data is supplied with row addresses via the address buffer 464a. The row address decoder 464 activates the word lines WL2 connected to predetermined memory cells 461 located in the row direction of the memory cell array 460 in response to the row addresses supplied via the address buffer 464a, to enable memory data to be read out of and written to the predetermined memory cells 461 (461a) in the row direction via the I/O buffer 462c and the column address decoder 462a.

The third row address decoder 465 for memory data is supplied with row addresses via the address buffer 465a. The row address decoder 465 activates the word lines WL3 connected to predetermined memory cells 461 located in the row direction of the memory cell array 460 in response to the row addresses supplied via the address buffer 465a to enable memory data to be read out of and written to the predetermined memory cells 461 (461a) in the row direction via the I/O buffer 462c and the column address decoder 462a.

The control circuit 466 controls operations of the respective circuits of memory block 450 described above based on control input.

As described above, in this embodiment, the frame memories 303, 309, and 314 of the motion vector detection circuit 300 (see FIG. 38) are composed of the same memory block 450 (see FIG. 44). The image data of the hierarchical classes 1-3 is stored in the same memory block 450 and the image data of the hierarchical class 2 and a class 3 can be respectively read and written independently of the image data of class 1. Therefore, processing of data for a motion vector can be efficiently performed.

In the example shown and described above, image data is hierarchized into three classes to detect a moving vector MV. However, the invention is not limited to this example. For example, a scheme of more than three or less than three hierarchical classes may be used in the motion vector detection. In this case, image data of the respective classes will be stored in the same memory block.

Namely, the first memory cell 461a and the second memory cell 461b of the memory cell array are arranged in a matrix form and admixed in the memory cell array, as in the above described embodiment. The first memory cells 461a are connected to a first word line extending in the column direction of the matrix and to second word lines arranged to extend in an echelon form over multiple rows. The second memory cells 461b are connected only to the first word line.

The first memory cell 461a connected to the second word line store image data of hierarchical classes other than the lowest class (class 1). When input image data is hierarchized into more than three heirachical classes, the multiple second word lines are configured to have different echelon forms such that first memory cells 461a connected with each of the multiple second word lines is different from each other and they store image data of different hierarchical classes.

In the embodiment described above, it has been shown that image data belonging to hierarchical classes 1-3 is stored in the portion 460a of the memory cell array 460 that includes 21 columns and 8 rows of memory cells 461 in a matrix form. However, the image data corresponding to the respective classes may be stored in a portion 460a of separate memory array 460 in which the memory cells are arranged in a matrix.

In the foregoing examples, the first memory cell 461a is formed of a pair of access transistors connected in parallel to each other, as shown in FIG. 42. Alternatively, it can be formed of more than two parallel access transistors. In that case, a memory cell unit can be selected using any one of the word lines connected to the respective access transistors of three or more.

In the above described embodiment, image data of the lowest class (class 1) is stored in the second memory cell 461b of the memory cell array 460, and image data of mean-value hierarchized classes other than the lowest class, obtained by sequential mean-value hierachizing is stored in the first memory cell 461a. In general, the first memory cell 461a may store the image data or the like obtained by processing the image data stored in the second memory cell 461b. It will be apparent that this memory device can be used to store data other than the image data.

The inventive memory cell circuit includes multiple access transistors connected in parallel for connecting the memory cell unit storing "1" or "0" to the bit lines. It is noted that selection of the memory cell unit can be established using any one of the multiple word lines.

The memory device of the invention includes first memory cells connected with first word line and second word line, respectively, and a second memory cell connected with only the first word line, the first and second memory cells being arranged in a matrix form, wherein each of the first word lines extends in the column direction of the matrix and the second word line extends in an echelon form over multiple rows of the matrix. It should be appreciated that only the first memory cells distributed over multiple rows of the matrix can be simultaneously activated by the second word line to enable read and write of memory data.

The motion vector detector of the invention constructs the multiple hierarchical classes of image data having different resolutions from input image data and detects a motion vector associated with a particular position in the input image data, using the multiple hierarchical classes of image data, wherein the motion vector detector uses the above described memory device as the memory unit for storing the multiple hierarchical classes of image data, wherein the lowest class of the image data among the multiple hierarchical classes of image data is stored in the second memory cells, and wherein the multiple hierarchical classes of image data other than the lowest class are stored in the first memory cells. This allows the image data of the respective hierarchical classes to be independently read out of and written to the memory device and thus improving an efficient detection processing of the motion vector.

Industrial Utility of the Invention

As described above, the inventive memory cell circuit, memory device, motion vector detector, and motion compensation predictive encoder are suitable for a motion vector detector based on, for example, the block-matching method, and for encoders that utilize the motion vector detected by the motion vector detector.

The invention claimed is:

1. A memory device comprising one or more memory blocks,
   wherein each memory block includes multiple memory cells arranged in a matrix form,
   and multiple selection lines for selecting memory cell column extending in one direction of said matrix, each line corresponding to the memory cell column;
   wherein a domain of said multiple memory cells arranged in a matrix form has multiple divisional domains divided in said one direction of said matrix;
   wherein each of said multiple selection lines has multiple divisional selection lines divided corresponding to said multiple divisional domains; and
   wherein said memory block further includes switching mechanism for switching the divisional selection lines that are simultaneously activated in the associated divisional domains, further including:
   multiple bit lines;
   multiple word lines perpendicularly crossing said multiple bit lines;
   a reference data input line for receiving reference data, said reference data input line perpendicularly crossing said multiple bit lines or extending parallel along said multiple bit lines;

an operation data output line for outputting operation data, said operation data output line perpendicularly crossing said multiple bit lines or extending parallel along said multiple bit lines;

a cell selection line for receiving a cell selection signal, said cell selection line perpendicularly crossing said multiple word lines or extending parallel along said multiple bit lines; and multiple memory cells in said matrix array being connected with said bit lines, said word lines, said reference data input line, said operation data output line, and said cell selection line, wherein each said memory cell includes:

a memory cell unit for storing data "1" or "0";

a reference data input unit for receiving reference data, said reference data input unit being connected with said reference data input line;

an operation function unit for performing a logical operation using the data stored in said memory cell unit and reference data received from said reference data input unit; an operation data output unit for outputting operation data obtained in said operation function unit to said operation data output line, said operation data output unit being connected with said operation data output line;

a cell selection signal input unit for receiving a cell selection signal and being connected with said cell selection line; and an output control unit for outputting to said operation data output unit said operation data based on said cell selection signal received by said cell selection signal input unit, wherein said multiple selection lines are said multiple cell selection lines; and wherein said one direction of said matrix is a direction along said cell selection line.

2. The memory device according to claim 1, wherein said operation function unit of said memory cell performs multiple logical operations in parallel; and wherein said memory cell is connected with said operation data output lines to output multiple items of the operation data obtained by said multiple logical operations.

3. The memory device according to claim 1, wherein said memory block further comprises an ancillary operational cell for performing a numerical calculation using at least a part of said operation data outputted from said multiple operation data output lines.

4. The memory device according to claim 3, wherein said ancillary operational cell has:

first multiple ancillary operational cells each for performing a first numerical calculation using the operation data outputted from the multiple memory cells associated with an activated divisional cell selection line in each divisional domain; and second multiple ancillary operational cells each for performing, every predetermined number of said first multiple ancillary operational cells, a second numerical calculation using the operation data obtained by the operation in said predetermined number of said first ancillary operational cells.

5. The memory device according to claim 4, wherein said first numerical calculation is subtraction and said second numerical calculation is calculation of the absolute value.

6. The memory device according to claim 1, further comprising a circuit block for executing data processing based on said operation data outputted from said one or more memory blocks.

* * * * *